US010845480B1

(12) United States Patent
Shah et al.

(10) Patent No.: US 10,845,480 B1
(45) Date of Patent: Nov. 24, 2020

(54) LIDAR SYSTEM WITH SEMICONDUCTOR OPTICAL AMPLIFIER

(71) Applicant: Luminar Technologies, Inc., Orlando, FL (US)

(72) Inventors: Lawrence Shah, Winter Park, FL (US); Jason M. Eichenholz, Orlando, FL (US); Joseph G. LaChapelle, Philomath, OR (US); Alex Michael Sincore, Orlando, FL (US); Cheng Zhu, Orlando, FL (US)

(73) Assignee: Luminar Technologies, Inc., Orlando, FL (US)

( * ) Notice: Subject to any disclaimer, the term of this patent is extended or adjusted under 35 U.S.C. 154(b) by 0 days.

(21) Appl. No.: 16/784,745

(22) Filed: Feb. 7, 2020

Related U.S. Application Data

(60) Provisional application No. 62/802,877, filed on Feb. 8, 2019.

(51) Int. Cl.
*G01C 3/08* (2006.01)
*G01S 17/00* (2020.01)
(52) U.S. Cl.
CPC .................... *G01S 17/00* (2013.01)
(58) Field of Classification Search
CPC ........ G01S 7/4802; G01S 17/88; G01S 17/08; G08B 13/181
See application file for complete search history.

(56) References Cited

U.S. PATENT DOCUMENTS 5,651,018 A 7/1997 Mehuys et al.
6,014,396 A 1/2000 Osinski et al.
10,032,950 B2 7/2018 Campbell et al.
2005/0123232 A1 6/2005 Piede et al.
2011/0013270 A1* 1/2011 Tanaka ................... H01S 5/5018
359/344
2011/0122895 A1 5/2011 Savage-Leuchs et al.
2016/0079735 A1* 3/2016 Shahine ................ H01S 5/4012
359/345

(Continued)

FOREIGN PATENT DOCUMENTS

KR 10-2018-0011510 2/2018
KR 10-2018-0080014 7/2018
WO 2018/107237 6/2018

OTHER PUBLICATIONS

International Search Report and Written Opinion for PCT/US2020/017188 dated Jun. 5, 2020.

(Continued)

*Primary Examiner* — Samantha K Abraham

(57) ABSTRACT

In one embodiment, a lidar system includes a light source configured to emit an optical signal. The light source includes a seed laser diode configured to produce a seed optical signal and a semiconductor optical amplifier (SOA) configured to amplify the seed optical signal to produce an amplified seed optical signal, where the emitted optical signal includes the amplified seed optical signal. The lidar system also includes a scanner configured to direct the emitted optical signal into a field of regard of the lidar system and a receiver configured to detect a portion of the emitted optical signal scattered by a target located a distance from the lidar system. The lidar system further includes a processor configured to determine the distance from the lidar system to the target.

31 Claims, 15 Drawing Sheets

(56) References Cited

U.S. PATENT DOCUMENTS

2017/0153319 A1    6/2017  Villeneuve et al.
2019/0141525 A1    2/2019  Liu et al.
2020/0251610 A1*   8/2020  Dulk ................. H01L 33/10

OTHER PUBLICATIONS

Juodawlkis et al., "Continuous-Wave Two-Photon Absorption in a Watt-Class Semiconductor Optical Amplifier," Optical Express, vol. 16, No. 16, Aug. 4, 2008.

Juodawlkis et al., "High-Power, Low-Noise 1.5 μm Slab-Coupled Optical Waveguide (SCOW) Emitters: Physics, Devices and Applications," IEEE Journal of Selected Topics in Quantum Electronics, vol. 17, No. 6, Nov. / Dec. 2011.

Muthalib et al., "CWDM Network Design 8 Channel Using Hybrid Amplifier SOA-EDFA," Scientific Journal of PPI-UKM, vol. 3, No. 1, ISSN No. 2356-2536, Aug. 10, 2015.

Slipchenko et al., "Generation of Nanosecond and Subnanosecond Laser Pulses by AlGaAs/GaAs Laser-Thyristor with Narrow Mesa Stripe Contact," Optics Express, vol. 24, No. 15, Jul. 25, 2016.

VanGasse et al., "27 dB Gain III-V-On-Silicon Semiconductor Optical Amplifier with > 17 dBm Output Power," Optics Express, vol. 27, No. 1, Jan. 17, 2019.

Agrawal et al., "Effect of injection-current fluctuations on the spectral linewidth of semiconductor lasers," Phys. Rev. A 37, 2495-2501 (1988).

Champagne et al., "Linewidth broadening in a distributed feedback laser integrated with a semiconductor optical amplifier," IEEE J. Quantum Electron. 38, 1493-1502 (2002).

Faugeron et al., "Monolithic master oscillator power amplifier at 1.58 μm for LIDAR measurements," Proceedings vol. 10563, International Conference on Space Optics—ICSO 2014; 105630U (2017), https://doi.org/10.1117/12.2304239.

Fu et al., "Efficient adiabatic silicon-on-insulator waveguide taper," Photonics Research, vol. 2, No. 3, Jun. 2014.

Giuliani et al., "Laser diode self-mixing technique for sensing applications," Journal of Optics A: Pure and Applied Optics 4 (2002) S283-S294.

Ghosh et al., "Ce:YIG/Silicon-on-Insulator waveguide optical isolator realized by adhesive bonding," Optics Express, vol. 20, No. 2, 1839-1848, Jan. 12, 2012.

Henry, "Theory of the linewidth of semiconductor lasers," IEEE J. Quantum Electron. 18, 259-264 (1982).

Jedrzejczyk et al., "High-power distributed-feedback tapered master-oscillator power amplifiers emitting at 1064 nm," Proc. SPIE 7583, 758317 (2010).

Kim et al., "Photonic waveguide to free-space Gaussian beam extreme mode converter," Light: Science & Applications (2018) 7:72.

Lang et al., "Numerical analysis of flared semiconductor laser amplifiers," IEEE J. Quantum Electron. 29, 2044-2051 (1993).

Lang et al., "Spontaneous filamentation in broad-area diode laser amplifiers," IEEE J. Quantum Electron. 30, 685-694 (1994).

Petermann, "External optical feedback phenomena in semiconductor lasers," IEEE J. Sel. Top. Quant. Electron. 1, 480-489 (1995).

Spießberger et al., "Macro-integrated 1Watt semiconductor laser system with a linewidth of 3.6 kHz," Opt. Express 19, 7077-7083 (2011).

Takaki et al., "Reduced linewidth rebroadening by suppressing longitudinal spatial hole burning in high-power 1.55-μm continuous-wave distributed feedback (CW-DFB) laser diodes," IEEE J. Quantum Electronics, vol. 39, No. 9, Sep. 2003.

Wilson et al., "Narrow-linewidth master-oscillator power amplifier based on a semiconductor tapered amplifier," Appl. Opt. 37, 4871-4875 (1998).

* cited by examiner

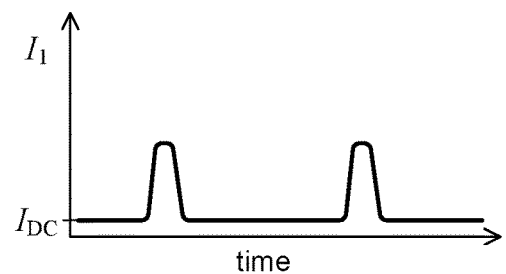
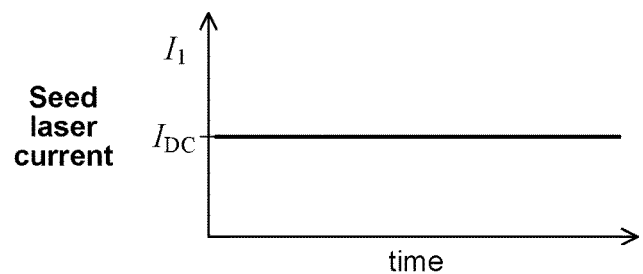
Seed laser current
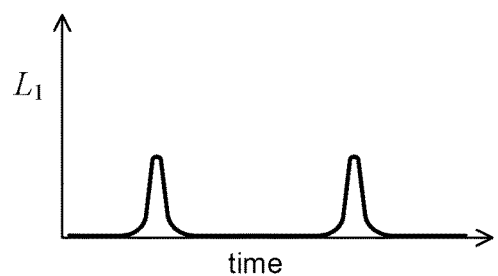
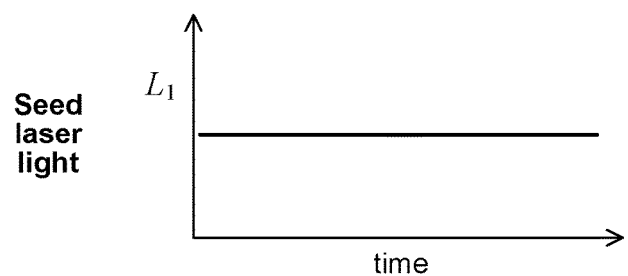
Seed laser light
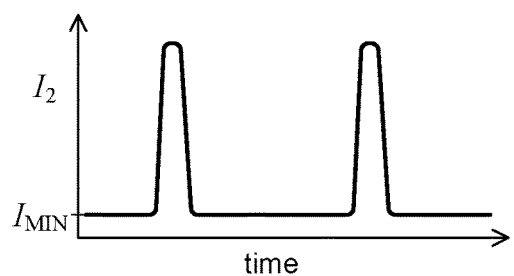
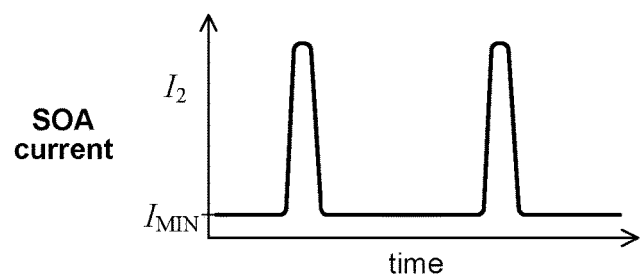
SOA current
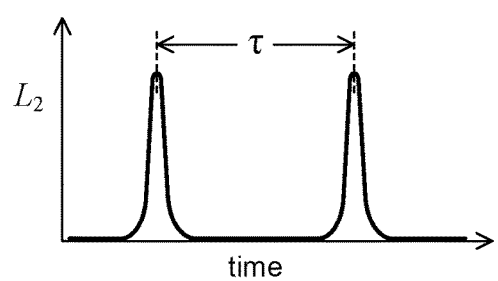
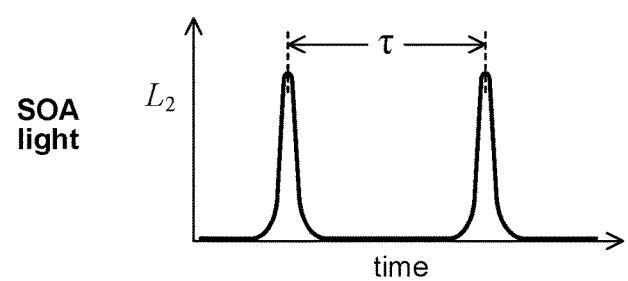
SOA light
Figure 16
Figure 17

US 10,845,480 B1

LIDAR SYSTEM WITH SEMICONDUCTOR OPTICAL AMPLIFIER

PRIORITY

This application claims the benefit, under 35 U.S.C. § 119(e), of U.S. Provisional Patent Application No. 62/802,877, filed 8 Feb. 2019, which is incorporated herein by reference.

TECHNICAL FIELD

This disclosure generally relates to lidar systems.

BACKGROUND

Light detection and ranging (lidar) is a technology that can be used to measure distances to remote targets. Typically, a lidar system includes a light source and an optical receiver. The light source can include, for example, a laser which emits light having a particular operating wavelength. The operating wavelength of a lidar system may lie, for example, in the infrared, visible, or ultraviolet portions of the electromagnetic spectrum. The light source emits light toward a target which scatters the light, and some of the scattered light is received back at the receiver. The system determines the distance to the target based on one or more characteristics associated with the received light. For example, the lidar system may determine the distance to the target based on the time of flight for a pulse of light emitted by the light source to travel to the target and back to the lidar system.

BRIEF DESCRIPTION OF THE DRAWINGS

FIGS. 16 and 17 each illustrate example electrical currents supplied to a seed laser diode and a SOA and the corresponding light produced by the seed laser diode and the SOA.

DESCRIPTION OF EXAMPLE EMBODIMENTS

Figure 1:
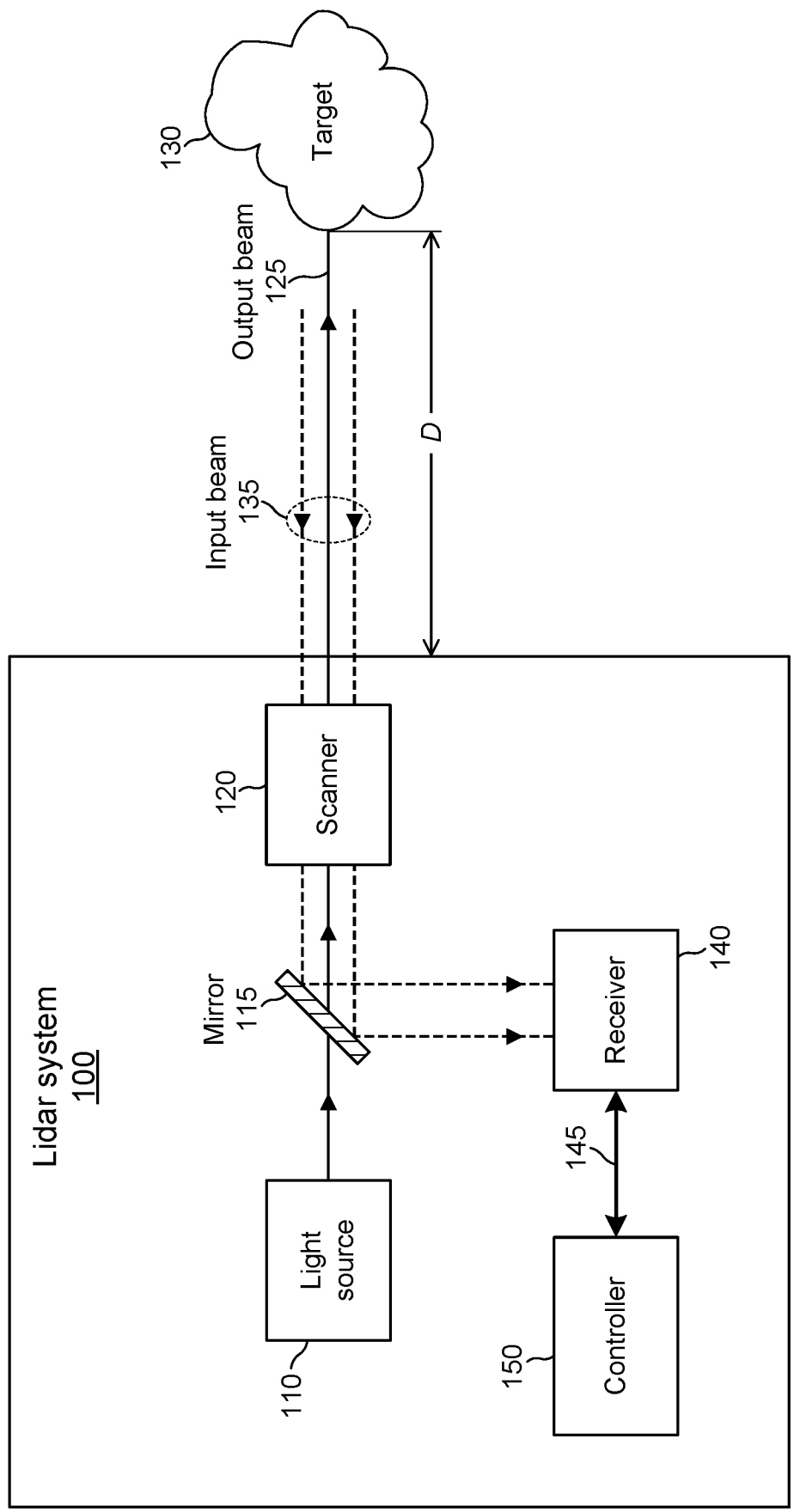
FIG. 1 illustrates an example light detection and ranging (lidar) system.

FIG. 1 illustrates an example light detection and ranging (lidar) system 100. In particular embodiments, a lidar system 100 may be referred to as a laser ranging system, a laser radar system, a LIDAR system, a lidar sensor, or a laser detection and ranging (LADAR or ladar) system. In particular embodiments, a lidar system 100 may include a light source 110, mirror 115, scanner 120, receiver 140, or controller 150. The light source 110 may include, for example, a laser which emits light having a particular operating wavelength in the infrared, visible, or ultraviolet portions of the electromagnetic spectrum. As an example, light source 110 may include a laser with one or more operating wavelengths between approximately 900 nanometers (nm) and 2000 nm. The light source 110 emits an output beam of light 125 which may be continuous wave (CW), pulsed, or modulated in any suitable manner for a given application. The output beam of light 125 is directed downrange toward a remote target 130. As an example, the remote target 130 may be located a distance D of approximately 1 m to 1 km from the lidar system 100.

Once the output beam 125 reaches the downrange target 130, the target may scatter or reflect at least a portion of light from the output beam 125, and some of the scattered or reflected light may return toward the lidar system 100. In the example of FIG. 1, the scattered or reflected light is represented by input beam 135, which passes through scanner 120 and is reflected by mirror 115 and directed to receiver 140. In particular embodiments, a relatively small fraction of the light from output beam 125 may return to the lidar system 100 as input beam 135. As an example, the ratio of input beam 135 average power, peak power, or pulse energy to output beam 125 average power, peak power, or pulse energy may be approximately $10^{-1}$, $10^{-2}$, $10^{-3}$, $10^{-4}$, $10^{-5}$, $10^{-6}$, $10^{-7}$, $10^{-8}$, $10^{-9}$, $10^{-10}$, $10^{-11}$, or $10^{-12}$. As another example, if a pulse of output beam 125 has a pulse energy of 1 microjoule (µJ), then the pulse energy of a corresponding pulse of input beam 135 may have a pulse energy of approximately 10 nanojoules (nJ), 1 nJ, 100 picojoules (pJ), 10 pJ, 1 pJ, 100 femtojoules (f), 10 fJ, 1 fJ, 100 attojoules (aJ), 10 aJ, 1 aJ, or 0.1 aJ.

In particular embodiments, output beam 125 may include or may be referred to as an optical signal, output optical signal, emitted optical signal, laser beam, light beam, optical beam, emitted beam, emitted light, or beam. In particular embodiments, input beam 135 may include or may be referred to as a received optical signal, input optical signal, return beam, received beam, return light, received light, input light, scattered light, or reflected light. As used herein, scattered light may refer to light that is scattered or reflected by a target 130. As an example, an input beam 135 may include: light from the output beam 125 that is scattered by target 130; light from the output beam 125 that is reflected by target 130; or a combination of scattered and reflected light from target 130.

In particular embodiments, receiver 140 may receive or detect photons from input beam 135 and produce one or more representative signals. For example, the receiver 140 may produce an output electrical signal 145 that is representative of the input beam 135, and the electrical signal 145 may be sent to controller 150. In particular embodiments, receiver 140 or controller 150 may include a processor, computing system (e.g., an ASIC or FPGA), or other suitable circuitry. A controller 150 may be configured to analyze one or more characteristics of the electrical signal 145 from the receiver 140 to determine one or more characteristics of the target 130, such as its distance downrange from the lidar system 100. This may be done, for example, by analyzing a time of flight or a frequency or phase of a transmitted beam of light 125 or a received beam of light 135. If lidar system 100 measures a time of flight of T (e.g., T represents a round-trip time of flight for an emitted pulse of light to travel from the lidar system 100 to the target 130 and back to the lidar system 100), then the distance D from the target 130 to the lidar system 100 may be expressed as D=c·T/2, where c is the speed of light (approximately $3.0 \times 10^8$ m/s). As an example, if a time of flight is measured to be T=300 ns, then the distance from the target 130 to the lidar system 100 may be determined to be approximately D=45.0 m. As another example, if a time of flight is measured to be T=1.33 μs, then the distance from the target 130 to the lidar system 100 may be determined to be approximately D=199.5 m. In particular embodiments, a distance D from lidar system 100 to a target 130 may be referred to as a distance, depth, or range of target 130. As used herein, the speed of light c refers to the speed of light in any suitable medium, such as for example in air, water, or vacuum. As an example, the speed of light in vacuum is approximately $2.9979 \times 10^8$ m/s, and the speed of light in air (which has a refractive index of approximately 1.0003) is approximately $2.9970 \times 10^8$ m/s.

In particular embodiments, light source 110 may include a pulsed or CW laser. As an example, light source 110 may be a pulsed laser configured to produce or emit pulses of light with a pulse duration or pulse width of approximately 10 picoseconds (ps) to 100 nanoseconds (ns). The pulses may have a pulse duration of approximately 100 ps, 200 ps, 400 ps, 1 ns, 2 ns, 5 ns, 10 ns, 20 ns, 50 ns, 100 ns, or any other suitable pulse duration. As another example, light source 110 may be a pulsed laser that produces pulses with a pulse duration of approximately 1-5 ns. As another example, light source 110 may be a pulsed laser that produces pulses at a pulse repetition frequency of approximately 100 kHz to 10 MHz or a pulse period (e.g., a time between consecutive pulses) of approximately 100 ns to 10 μs. In particular embodiments, light source 110 may have a substantially constant pulse repetition frequency, or light source 110 may have a variable or adjustable pulse repetition frequency. As an example, light source 110 may be a pulsed laser that produces pulses at a substantially constant pulse repetition frequency of approximately 640 kHz (e.g., 640,000 pulses per second), corresponding to a pulse period of approximately 1.56 μs. As another example, light source 110 may have a pulse repetition frequency (which may be referred to as a repetition rate) that can be varied from approximately 200 kHz to 3 MHz. As used herein, a pulse of light may be referred to as an optical pulse, a light pulse, or a pulse.

In particular embodiments, light source 110 may include a pulsed or CW laser that produces a free-space output beam 125 having any suitable average optical power. As an example, output beam 125 may have an average power of approximately 1 milliwatt (mW), 10 mW, 100 mW, 1 watt (W), 10 W, or any other suitable average power. In particular embodiments, output beam 125 may include optical pulses with any suitable pulse energy or peak optical power. As an example, output beam 125 may include pulses with a pulse energy of approximately 0.01 μJ, 0.1 μJ, 0.5 μJ, 10 μJ, 2 μJ, 10 ρJ, 100 μJ, 1 mJ, or any other suitable pulse energy. As another example, output beam 125 may include pulses with a peak power of approximately 10 W, 100 W, 1 kW, 5 kW, 10 kW, or any other suitable peak power. The peak power ($P_{peak}$) of a pulse of light can be related to the pulse energy (E) by the expression $E = P_{peak} \cdot \Delta T$, where $\Delta T$ is the duration of the pulse, and the duration of a pulse may be defined as the full width at half maximum duration of the pulse. For example, an optical pulse with a duration of 1 ns and a pulse energy of 1 μJ has a peak power of approximately 1 kW. The average power ($P_{av}$) of an output beam 125 can be related to the pulse repetition frequency (PRF) and pulse energy by the expression $P_{av} = PRF \cdot E$. For example, if the pulse repetition frequency is 500 kHz, then the average power of an output beam 125 with 1 μJ pulses is approximately 0.5 W.

In particular embodiments, light source 110 may include a laser diode, such as for example, a Fabry-Perot laser diode, a quantum well laser, a distributed Bragg reflector (DBR) laser, a distributed feedback (DFB) laser, a vertical-cavity surface-emitting laser (VCSEL), a quantum dot laser diode, a grating-coupled surface-emitting laser (GCSEL), a slab-coupled optical waveguide laser (SCOWL), a single-transverse-mode laser diode, a multi-mode broad area laser diode, a laser-diode bar, a laser-diode stack, or a tapered-stripe laser diode. As an example, light source 110 may include an aluminum-gallium-arsenide (AlGaAs) laser diode, an indium-gallium-arsenide (InGaAs) laser diode, an indium-gallium-arsenide-phosphide (InGaAsP) laser diode, or a laser diode that includes any suitable combination of aluminum (Al), indium (In), gallium (Ga), arsenic (As), phosphorous (P), or any other suitable material. In particular embodiments, light source 110 may include a pulsed or CW laser diode with a peak emission wavelength between 1200 nm and 1600 nm. As an example, light source 110 may include a current-modulated InGaAsP DFB laser diode that produces optical pulses at a wavelength of approximately 1550 nm.

In particular embodiments, light source 110 may include a pulsed or CW laser diode followed by one or more optical-amplification stages. For example, a seed laser diode may produce a seed optical signal, and an optical amplifier may amplify the seed optical signal to produce an amplified optical signal that is emitted by the light source 110. In particular embodiments, an optical amplifier may include a fiber-optic amplifier or a semiconductor optical amplifier (SOA). For example, a pulsed laser diode may produce relatively low-power optical seed pulses which are amplified by a fiber-optic amplifier. As another example, a light source 110 may include a fiber-laser module that includes a current-modulated laser diode with an operating wavelength of approximately 1550 nm followed by a single-stage or a multi-stage erbium-doped fiber amplifier (EDFA) or erbium-ytterbium-doped fiber amplifier (EYDFA) that amplifies the seed pulses from the laser diode. As another example, light source 110 may include a continuous-wave (CW) or quasi-CW laser diode followed by an external optical modulator (e.g., an electro-optic amplitude modulator). The optical modulator may modulate the CW light from the laser diode to produce optical pulses which are sent to a fiber-optic amplifier or SOA. As another example, light source 110 may include a pulsed or CW seed laser diode followed by a semiconductor optical amplifier (SOA). The SOA may include an active optical waveguide configured to receive light from the seed laser diode and amplify the light as it propagates through the waveguide. The optical gain of the SOA may be provided by pulsed or direct-current (DC) electrical current supplied to the SOA. The SOA may be integrated on the same chip as the seed laser diode, or the SOA may be a separate device with an anti-reflection coating on its input end or output end. As another example, light source 110 may include a seed laser diode followed by a SOA, which in turn is followed by a fiber-optic amplifier. For example, the seed laser diode may produce relatively low-power seed pulses which are amplified by the SOA, and the fiber-optic amplifier may further amplify the optical pulses.

In particular embodiments, light source 110 may include a direct-emitter laser diode. A direct-emitter laser diode (which may be referred to as a direct emitter) may include a laser diode which produces light that is not subsequently amplified by an optical amplifier. A light source 110 that includes a direct-emitter laser diode may not include an optical amplifier, and the output light produced by a direct emitter may not be amplified after it is emitted by the laser diode. The light produced by a direct-emitter laser diode (e.g., optical pulses, CW light, or frequency-modulated light) may be emitted directly as a free-space output beam 125 without being amplified. A direct-emitter laser diode may be driven by an electrical power source that supplies current pulses to the laser diode, and each current pulse may result in the emission of an output optical pulse.

In particular embodiments, light source 110 may include a diode-pumped solid-state (DPSS) laser. A DPSS laser (which may be referred to as a solid-state laser) may refer to a laser that includes a solid-state, glass, ceramic, or crystal-based gain medium that is pumped by one or more pump laser diodes. The gain medium may include a host material that is doped with rare-earth ions (e.g., neodymium, erbium, ytterbium, or praseodymium). For example, a gain medium may include a yttrium aluminum garnet (YAG) crystal that is doped with neodymium (Nd) ions, and the gain medium may be referred to as a Nd:YAG crystal. A DPSS laser with a Nd:YAG gain medium may produce light at a wavelength between approximately 1300 nm and approximately 1400 nm, and the Nd:YAG gain medium may be pumped by one or more pump laser diodes with an operating wavelength between approximately 730 nm and approximately 900 nm. A DPSS laser may be a passively Q-switched laser that includes a saturable absorber (e.g., a vanadium-doped crystal that acts as a saturable absorber). Alternatively, a DPSS laser may be an actively Q-switched laser that includes an active Q-switch (e.g., an acousto-optic modulator or an electro-optic modulator). A passively or actively Q-switched DPSS laser may produce output optical pulses that form an output beam 125 of a lidar system 100.

In particular embodiments, an output beam of light 125 emitted by light source 110 may be a collimated optical beam having any suitable beam divergence, such as for example, a full-angle beam divergence of approximately 0.5 to 10 milliradians (mrad). A divergence of output beam 125 may refer to an angular measure of an increase in beam size (e.g., a beam radius or beam diameter) as output beam 125 travels away from light source 110 or lidar system 100. In particular embodiments, output beam 125 may have a substantially circular cross section with a beam divergence characterized by a single divergence value. As an example, an output beam 125 with a circular cross section and a full-angle beam divergence of 2 mrad may have a beam diameter or spot size of approximately 20 cm at a distance of 100 m from lidar system 100. In particular embodiments, output beam 125 may have a substantially elliptical cross section characterized by two divergence values. As an example, output beam 125 may have a fast axis and a slow axis, where the fast-axis divergence is greater than the slow-axis divergence. As another example, output beam 125 may be an elliptical beam with a fast-axis divergence of 4 mrad and a slow-axis divergence of 2 mrad.

In particular embodiments, an output beam of light 125 emitted by light source 110 may be unpolarized or randomly polarized, may have no specific or fixed polarization (e.g., the polarization may vary with time), or may have a particular polarization (e.g., output beam 125 may be linearly polarized, elliptically polarized, or circularly polarized). As an example, light source 110 may produce light with no specific polarization or may produce light that is linearly polarized.

In particular embodiments, lidar system 100 may include one or more optical components configured to reflect, focus, filter, shape, modify, steer, or direct light within the lidar system 100 or light produced or received by the lidar system 100 (e.g., output beam 125 or input beam 135). As an example, lidar system 100 may include one or more lenses, mirrors, filters (e.g., bandpass or interference filters), beam splitters, polarizers, polarizing beam splitters, wave plates (e.g., half-wave or quarter-wave plates), diffractive elements, holographic elements, isolators, couplers, detectors, beam combiners, or collimators. The optical components in a lidar system 100 may be free-space optical components, fiber-coupled optical components, or a combination of free-space and fiber-coupled optical components.

In particular embodiments, lidar system 100 may include a telescope, one or more lenses, or one or more mirrors configured to expand, focus, or collimate the output beam 125 or the input beam 135 to a desired beam diameter or divergence. As an example, the lidar system 100 may include one or more lenses to focus the input beam 135 onto a photodetector of receiver 140. As another example, the lidar system 100 may include one or more flat mirrors or curved mirrors (e.g., concave, convex, or parabolic mirrors) to steer or focus the output beam 125 or the input beam 135. For example, the lidar system 100 may include an off-axis parabolic mirror to focus the input beam 135 onto a photodetector of receiver 140. As illustrated in FIG. 1, the lidar system 100 may include mirror 115 (which may be a metallic or dielectric mirror), and mirror 115 may be configured so that light beam 125 passes through the mirror 115 or passes along an edge or side of the mirror 115 and input beam 135 is reflected toward the receiver 140. As an example, mirror 115 (which may be referred to as an overlap mirror, superposition mirror, or beam-combiner mirror) may include a hole, slot, or aperture which output light beam 125 passes through. As another example, rather than passing through the mirror 115, the output beam 125 may be directed to pass alongside the mirror 115 with a gap (e.g., a gap of width approximately 0.1 mm, 0.5 mm, 1 mm, 2 mm, 5 mm, or 10 mm) between the output beam 125 and an edge of the mirror 115.

In particular embodiments, mirror 115 may provide for output beam 125 and input beam 135 to be substantially coaxial so that the two beams travel along approximately the same optical path (albeit in opposite directions). The input and output beams being substantially coaxial may refer to the beams being at least partially overlapped or sharing a common propagation axis so that input beam 135 and output beam 125 travel along substantially the same optical path (albeit in opposite directions). As an example, output beam 125 and input beam 135 may be parallel to each other to within less than 10 mrad, 5 mrad, 2 mrad, 1 mrad, 0.5 mrad, or 0.1 mrad. As output beam 125 is scanned across a field of regard, the input beam 135 may follow along with the output beam 125 so that the coaxial relationship between the two beams is maintained.

In particular embodiments, lidar system 100 may include a scanner 120 configured to scan an output beam 125 across a field of regard of the lidar system 100. As an example, scanner 120 may include one or more scanning mirrors configured to pivot, rotate, oscillate, or move in an angular manner about one or more rotation axes. The output beam 125 may be reflected by a scanning mirror, and as the scanning mirror pivots or rotates, the reflected output beam 125 may be scanned in a corresponding angular manner. As an example, a scanning mirror may be configured to periodically pivot back and forth over a 30-degree range, which results in the output beam 125 scanning back and forth across a 60-degree range (e.g., a Θ-degree rotation by a scanning mirror results in a 2Θ-degree angular scan of output beam 125).

In particular embodiments, a scanning mirror (which may be referred to as a scan mirror) may be attached to or mechanically driven by a scanner actuator or mechanism which pivots or rotates the mirror over a particular angular range (e.g., over a 5° angular range, 30° angular range, 60° angular range, 120° angular range, 360° angular range, or any other suitable angular range). A scanner actuator or mechanism configured to pivot or rotate a mirror may include a galvanometer scanner, a resonant scanner, a piezoelectric actuator, a voice coil motor, an electric motor (e.g., a DC motor, a brushless DC motor, a synchronous electric motor, or a stepper motor), a microelectromechanical systems (MEMS) device, or any other suitable actuator or mechanism. As an example, a scanner 120 may include a scanning mirror attached to a galvanometer scanner configured to pivot back and forth over a 1° to 30° angular range. As another example, a scanner 120 may include a scanning mirror that is attached to or is part of a MEMS device configured to scan over a 1° to 30° angular range. As another example, a scanner 120 may include a polygon mirror configured to rotate continuously in the same direction (e.g., rather than pivoting back and forth, the polygon mirror continuously rotates 360 degrees in a clockwise or counter-clockwise direction). The polygon mirror may be coupled or attached to a synchronous motor configured to rotate the polygon mirror at a substantially fixed rotational frequency (e.g., a rotational frequency of approximately 1 Hz, 10 Hz, 50 Hz, 100 Hz, 500 Hz, or 1,000 Hz).

In particular embodiments, scanner 120 may be configured to scan the output beam 125 (which may include at least a portion of the light emitted by light source 110) across a field of regard of the lidar system 100. A field of regard (FOR) of a lidar system 100 may refer to an area, region, or angular range over which the lidar system 100 may be configured to scan or capture distance information. As an example, a lidar system 100 with an output beam 125 with a 30-degree scanning range may be referred to as having a 30-degree angular field of regard. As another example, a lidar system 100 with a scanning mirror that rotates over a 30-degree range may produce an output beam 125 that scans across a 60-degree range (e.g., a 60-degree FOR). In particular embodiments, lidar system 100 may have a FOR of approximately 10°, 20°, 40°, 60°, 120°, 360°, or any other suitable FOR.

In particular embodiments, scanner 120 may be configured to scan the output beam 125 horizontally and vertically, and lidar system 100 may have a particular FOR along the horizontal direction and another particular FOR along the vertical direction. As an example, lidar system 100 may have a horizontal FOR of 10° to 120° and a vertical FOR of 2° to 45°. In particular embodiments, scanner 120 may include a first scan mirror and a second scan mirror, where the first scan mirror directs the output beam 125 toward the second scan mirror, and the second scan mirror directs the output beam 125 downrange from the lidar system 100. As an example, the first scan mirror may scan the output beam 125 along a first direction, and the second scan mirror may scan the output beam 125 along a second direction that is substantially orthogonal to the first direction. As another example, the first scan mirror may scan the output beam 125 along a substantially horizontal direction, and the second scan mirror may scan the output beam 125 along a substantially vertical direction (or vice versa). As another example, the first and second scan mirrors may each be driven by galvanometer scanners. As another example, the first or second scan mirror may include a polygon mirror driven by an electric motor. In particular embodiments, scanner 120 may be referred to as a beam scanner, optical scanner, or laser scanner.

In particular embodiments, one or more scanning mirrors may be communicatively coupled to controller 150 which may control the scanning mirror(s) so as to guide the output beam 125 in a desired direction downrange or along a desired scan pattern. In particular embodiments, a scan pattern may refer to a pattern or path along which the output beam 125 is directed. As an example, scanner 120 may include two scanning mirrors configured to scan the output beam 125 across a 60° horizontal FOR and a 20° vertical FOR. The two scanner mirrors may be controlled to follow a scan path that substantially covers the 60°×20° FOR. As an example, the scan path may result in a point cloud with pixels that substantially cover the 60°×20° FOR. The pixels may be approximately evenly distributed across the 60°×20° FOR. Alternatively, the pixels may have a particular non-uniform distribution (e.g., the pixels may be distributed across all or a portion of the 60°×20° FOR, and the pixels may have a higher density in one or more particular regions of the 60°×20° FOR).

In particular embodiments, a lidar system 100 may include a scanner 120 with a solid-state scanning device. A solid-state scanning device may refer to a scanner 120 that scans an output beam 125 without the use of moving parts (e.g., without the use of a mechanical scanner, such as a mirror that rotates or pivots). For example, a solid-state scanner 120 may include one or more of the following: an optical phased array scanning device; a liquid-crystal scanning device; or a liquid lens scanning device. A solid-state scanner 120 may be an electrically addressable device that scans an output beam 125 along one axis (e.g., horizontally) or along two axes (e.g., horizontally and vertically). In particular embodiments, a scanner 120 may include a solid-state scanner and a mechanical scanner. For example, a scanner 120 may include an optical phased array scanner configured to scan an output beam 125 in one direction and a galvanometer scanner that scans the output beam 125 in an orthogonal direction. The optical phased array scanner may scan the output beam relatively rapidly in a horizontal direction across the field of regard (e.g., at a scan rate of 50 to 1,000 scan lines per second), and the galvanometer may pivot a mirror at a rate of 1-30 Hz to scan the output beam 125 vertically.

In particular embodiments, a lidar system 100 may include a light source 110 configured to emit pulses of light and a scanner 120 configured to scan at least a portion of the emitted pulses of light across a field of regard of the lidar system 100. One or more of the emitted pulses of light may be scattered by a target 130 located downrange from the lidar system 100, and a receiver 140 may detect at least a portion of the pulses of light scattered by the target 130. A receiver 140 may be referred to as a photoreceiver, optical receiver, optical sensor, detector, photodetector, or optical detector. In particular embodiments, lidar system 100 may include a receiver 140 that receives or detects at least a portion of input beam 135 and produces an electrical signal that corresponds to input beam 135. As an example, if input beam 135 includes an optical pulse, then receiver 140 may produce an electrical current or voltage pulse that corresponds to the optical pulse detected by receiver 140. As another example, receiver 140 may include one or more avalanche photodiodes (APDs) or one or more single-photon avalanche diodes (SPADs). As another example, receiver 140 may include one or more PN photodiodes (e.g., a photodiode structure formed by a p-type semiconductor and a n-type semiconductor, where the PN acronym refers to the structure having p-doped and n-doped regions) or one or more PIN photodiodes (e.g., a photodiode structure formed by an undoped intrinsic semiconductor region located between p-type and n-type regions, where the PIN acronym refers to the structure having p-doped, intrinsic, and n-doped regions). An APD, SPAD, PN photodiode, or PIN photodiode may each be referred to as a detector, photodetector, or photodiode. A detector may have an active region or an avalanche-multiplication region that includes silicon, germanium, InGaAs, or AlInAsSb (aluminum indium arsenide antimonide). The active region may refer to an area over which a detector may receive or detect input light. An active region may have any suitable size or diameter, such as for example, a diameter of approximately 10 µm, 25 µm, 50 µm, 80 µm, 100 µm, 200 µm, 500 µm, 1 mm, 2 mm, or 5 mm.

In particular embodiments, receiver 140 may include electronic circuitry that performs signal amplification, sampling, filtering, signal conditioning, analog-to-digital conversion, time-to-digital conversion, pulse detection, threshold detection, rising-edge detection, or falling-edge detection. As an example, receiver 140 may include a transimpedance amplifier that converts a received photocurrent (e.g., a current produced by an APD in response to a received optical signal) into a voltage signal. The voltage signal may be sent to pulse-detection circuitry that produces an analog or digital output signal 145 that corresponds to one or more optical characteristics (e.g., rising edge, falling edge, amplitude, duration, or energy) of a received optical pulse. As an example, the pulse-detection circuitry may perform a time-to-digital conversion to produce a digital output signal 145. The electrical output signal 145 may be sent to controller 150 for processing or analysis (e.g., to determine a time-of-flight value corresponding to a received optical pulse).

In particular embodiments, a controller 150 (which may include or may be referred to as a processor, an FPGA, an ASIC, a computer, or a computing system) may be located within a lidar system 100 or outside of a lidar system 100. Alternatively, one or more parts of a controller 150 may be located within a lidar system 100, and one or more other parts of a controller 150 may be located outside a lidar system 100. In particular embodiments, one or more parts of a controller 150 may be located within a receiver 140 of a lidar system 100, and one or more other parts of a controller 150 may be located in other parts of the lidar system 100. For example, a receiver 140 may include an FPGA or ASIC configured to process an output electrical signal from the receiver 140, and the processed signal may be sent to a computing system located elsewhere within the lidar system 100 or outside the lidar system 100. In particular embodiments, a controller 150 may include any suitable arrangement or combination of logic circuitry, analog circuitry, or digital circuitry.

In particular embodiments, controller 150 may be electrically coupled or communicatively coupled to light source 110, scanner 120, or receiver 140. As an example, controller 150 may receive electrical trigger pulses or edges from light source 110, where each pulse or edge corresponds to the emission of an optical pulse by light source 110. As another example, controller 150 may provide instructions, a control signal, or a trigger signal to light source 110 indicating when light source 110 should produce optical pulses. Controller 150 may send an electrical trigger signal that includes electrical pulses, where each electrical pulse results in the emission of an optical pulse by light source 110. In particular embodiments, the frequency, period, duration, pulse energy, peak power, average power, or wavelength of the optical pulses produced by light source 110 may be adjusted based on instructions, a control signal, or trigger pulses provided by controller 150. In particular embodiments, controller 150 may be coupled to light source 110 and receiver 140, and the controller 150 may determine a time-of-flight value for an optical pulse based on timing information associated with (i) a time when the pulse was emitted by light source 110 and (ii) a time when a portion of the pulse (e.g., input beam 135) was detected or received by receiver 140. In particular embodiments, controller 150 may include circuitry that performs signal amplification, sampling, filtering, signal conditioning, analog-to-digital conversion, time-to-digital conversion, pulse detection, threshold detection, rising-edge detection, or falling-edge detection.

In particular embodiments, lidar system 100 may include one or more processors (e.g., a controller 150) configured to determine a distance D from the lidar system 100 to a target 130 based at least in part on a round-trip time of flight for an emitted pulse of light to travel from the lidar system 100 to the target 130 and back to the lidar system 100. The target 130 may be at least partially contained within a field of regard of the lidar system 100 and located a distance D from the lidar system 100 that is less than or equal to an operating range ($R_{OP}$) of the lidar system 100. In particular embodiments, an operating range (which may be referred to as an operating distance) of a lidar system 100 may refer to a distance over which the lidar system 100 is configured to sense or identify targets 130 located within a field of regard of the lidar system 100. The operating range of lidar system 100 may be any suitable distance, such as for example, 25 m, 50 m, 100 m, 200 m, 250 m, 500 m, or 1 km. As an example, a lidar system 100 with a 200-m operating range may be configured to sense or identify various targets 130 located up to 200 m away from the lidar system 100. The operating range $R_{OP}$ of a lidar system 100 may be related to the time τ between the emission of successive optical signals by the expression $R_{OP}=c·τ/2$. For a lidar system 100 with a 200-m operating range ($R_{OP}$=200 m), the time T between successive pulses (which may be referred to as a pulse period, a pulse repetition interval (PRI), or a time period between pulses) is approximately $2 \cdot R_{OP}/c \cong 1.33$ μs. The pulse period τ may also correspond to the time of flight for a pulse to travel to and from a target 130 located a distance $R_{OP}$ from the lidar system 100. Additionally, the pulse period T may be related to the pulse repetition frequency (PRF) by the expression τ=1/PRF. For example, a pulse period of 1.33 μs corresponds to a PRF of approximately 752 kHz.

In particular embodiments, a lidar system 100 may be used to determine the distance to one or more downrange targets 130. By scanning the lidar system 100 across a field of regard, the system may be used to map the distance to a number of points within the field of regard. Each of these depth-mapped points may be referred to as a pixel or a voxel. A collection of pixels captured in succession (which may be referred to as a depth map, a point cloud, or a frame) may be rendered as an image or may be analyzed to identify or detect objects or to determine a shape or distance of objects within the FOR. As an example, a point cloud may cover a field of regard that extends 600 horizontally and 15° vertically, and the point cloud may include a frame of 100-2000 pixels in the horizontal direction by 4-400 pixels in the vertical direction.

In particular embodiments, lidar system 100 may be configured to repeatedly capture or generate point clouds of a field of regard at any suitable frame rate between approximately 0.1 frames per second (FPS) and approximately 1,000 FPS. As an example, lidar system 100 may generate point clouds at a frame rate of approximately 0.1 FPS, 0.5 FPS, 1 FPS, 2 FPS, 5 FPS, 10 FPS, 20 FPS, 100 FPS, 500 FPS, or 1,000 FPS. As another example, lidar system 100 may be configured to produce optical pulses at a rate of $5 \times 10^5$ pulses/second (e.g., the system may determine 500,000 pixel distances per second) and scan a frame of 1000×50 pixels (e.g., 50,000 pixels/frame), which corresponds to a point-cloud frame rate of 10 frames per second (e.g., 10 point clouds per second). In particular embodiments, a point-cloud frame rate may be substantially fixed, or a point-cloud frame rate may be dynamically adjustable. As an example, a lidar system 100 may capture one or more point clouds at a particular frame rate (e.g., 1 Hz) and then switch to capture one or more point clouds at a different frame rate (e.g., 10 Hz). A slower frame rate (e.g., 1 Hz) may be used to capture one or more high-resolution point clouds, and a faster frame rate (e.g., 10 Hz) may be used to rapidly capture multiple lower-resolution point clouds.

In particular embodiments, a lidar system 100 may be configured to sense, identify, or determine distances to one or more targets 130 within a field of regard. As an example, a lidar system 100 may determine a distance to a target 130, where all or part of the target 130 is contained within afield of regard of the lidar system 100. All or part of a target 130 being contained within a FOR of the lidar system 100 may refer to the FOR overlapping, encompassing, or enclosing at least a portion of the target 130. In particular embodiments, target 130 may include all or part of an object that is moving or stationary relative to lidar system 100. As an example, target 130 may include all or a portion of a person, vehicle, motorcycle, truck, train, bicycle, wheelchair, pedestrian, animal, road sign, traffic light, lane marking, road-surface marking, parking space, pylon, guard rail, traffic barrier, pothole, railroad crossing, obstacle in or near a road, curb, stopped vehicle on or beside a road, utility pole, house, building, trash can, mailbox, tree, any other suitable object, or any suitable combination of all or part of two or more objects. In particular embodiments, a target may be referred to as an object.

In particular embodiments, light source 110, scanner 120, and receiver 140 may be packaged together within a single housing, where a housing may refer to a box, case, or enclosure that holds or contains all or part of a lidar system 100. As an example, a lidar-system enclosure may contain a light source 110, mirror 115, scanner 120, and receiver 140 of a lidar system 100. Additionally, the lidar-system enclosure may include a controller 150. The lidar-system enclosure may also include one or more electrical connections for conveying electrical power or electrical signals to or from the enclosure. In particular embodiments, one or more components of a lidar system 100 may be located remotely from a lidar-system enclosure. As an example, all or part of light source 110 may be located remotely from a lidar-system enclosure, and pulses of light produced by the light source 110 may be conveyed to the enclosure via optical fiber. As another example, all or part of a controller 150 may be located remotely from a lidar-system enclosure.

In particular embodiments, light source 110 may include an eye-safe laser, or lidar system 100 may be classified as an eye-safe laser system or laser product. An eye-safe laser, laser system, or laser product may refer to a system that includes a laser with an emission wavelength, average power, peak power, peak intensity, pulse energy, beam size, beam divergence, exposure time, or scanned output beam such that emitted light from the system presents little or no possibility of causing damage to a person's eyes. As an example, light source 110 or lidar system 100 may be classified as a Class 1 laser product (as specified by the 60825-1:2014 standard of the International Electrotechnical Commission (IEC)) or a Class I laser product (as specified by Title 21, Section 1040.10 of the United States Code of Federal Regulations (CFR)) that is safe under all conditions of normal use. In particular embodiments, lidar system 100 may be an eye-safe laser product (e.g., with a Class 1 or Class I classification) configured to operate at any suitable wavelength between approximately 900 nm and approximately 2100 nm. As an example, lidar system 100 may include a laser with an operating wavelength between approximately 1200 nm and approximately 1400 nm or between approximately 1400 nm and approximately 1600 nm, and the laser or the lidar system 100 may be operated in an eye-safe manner. As another example, lidar system 100 may be an eye-safe laser product that includes a scanned laser with an operating wavelength between approximately 900 nm and approximately 1700 nm. As another example, lidar system 100 may be a Class 1 or Class I laser product that includes a laser diode, fiber laser, or solid-state laser with an operating wavelength between approximately 1200 nm and approximately 1600 nm. As another example, lidar system 100 may have an operating wavelength between approximately 1500 nm and approximately 1510 nm.

In particular embodiments, one or more lidar systems 100 may be integrated into a vehicle. As an example, multiple lidar systems 100 may be integrated into a car to provide a complete 360-degree horizontal FOR around the car. As another example, 2-10 lidar systems 100, each system having a 45-degree to 180-degree horizontal FOR, may be combined together to form a sensing system that provides a point cloud covering a 360-degree horizontal FOR. The lidar systems 100 may be oriented so that adjacent FORs have an amount of spatial or angular overlap to allow data from the multiple lidar systems 100 to be combined or stitched together to form a single or continuous 360-degree point cloud. As an example, the FOR of each lidar system 100 may have approximately 1-30 degrees of overlap with an adjacent FOR. In particular embodiments, a vehicle may refer to a mobile machine configured to transport people or cargo. For example, a vehicle may include, may take the form of, or may be referred to as a car, automobile, motor vehicle, truck, bus, van, trailer, off-road vehicle, farm vehicle, lawn mower, construction equipment, forklift, robot, golf cart, motorhome, taxi, motorcycle, scooter, bicycle, skateboard, train, snowmobile, watercraft (e.g., a ship or boat), aircraft (e.g., a fixed-wing aircraft, helicopter, or dirigible), unmanned aerial vehicle (e.g., drone), or spacecraft. In particular embodiments, a vehicle may include an internal combustion engine or an electric motor that provides propulsion for the vehicle.

In particular embodiments, one or more lidar systems 100 may be included in a vehicle as part of an advanced driver assistance system (ADAS) to assist a driver of the vehicle in operating the vehicle. For example, a lidar system 100 may be part of an ADAS that provides information (e.g., about the surrounding environment) or feedback to a driver (e.g., to alert the driver to potential problems or hazards) or that automatically takes control of part of a vehicle (e.g., a braking system or a steering system) to avoid collisions or accidents. A lidar system 100 may be part of a vehicle ADAS that provides adaptive cruise control, automated braking, automated parking, collision avoidance, alerts the driver to hazards or other vehicles, maintains the vehicle in the correct lane, or provides a warning if an object or another vehicle is in a blind spot.

In particular embodiments, one or more lidar systems 100 may be integrated into a vehicle as part of an autonomous-vehicle driving system. As an example, a lidar system 100 may provide information about the surrounding environment to a driving system of an autonomous vehicle. An autonomous-vehicle driving system may be configured to guide the autonomous vehicle through an environment surrounding the vehicle and toward a destination. An autonomous-vehicle driving system may include one or more computing systems that receive information from a lidar system 100 about the surrounding environment, analyze the received information, and provide control signals to the vehicle's driving systems (e.g., steering wheel, accelerator, brake, or turn signal). As an example, a lidar system 100 integrated into an autonomous vehicle may provide an autonomous-vehicle driving system with a point cloud every 0.1 seconds (e.g., the point cloud has a 10 Hz update rate, representing 10 frames per second). The autonomous-vehicle driving system may analyze the received point clouds to sense or identify targets 130 and their respective locations, distances, or speeds, and the autonomous-vehicle driving system may update control signals based on this information. As an example, if lidar system 100 detects a vehicle ahead that is slowing down or stopping, the autonomous-vehicle driving system may send instructions to release the accelerator and apply the brakes.

In particular embodiments, an autonomous vehicle may be referred to as an autonomous car, driverless car, self-driving car, robotic car, or unmanned vehicle. In particular embodiments, an autonomous vehicle may refer to a vehicle configured to sense its environment and navigate or drive with little or no human input. As an example, an autonomous vehicle may be configured to drive to any suitable location and control or perform all safety-critical functions (e.g., driving, steering, braking, parking) for the entire trip, with the driver not expected to control the vehicle at any time. As another example, an autonomous vehicle may allow a driver to safely turn their attention away from driving tasks in particular environments (e.g., on freeways), or an autonomous vehicle may provide control of a vehicle in all but a few environments, requiring little or no input or attention from the driver.

In particular embodiments, an autonomous vehicle may be configured to drive with a driver present in the vehicle, or an autonomous vehicle may be configured to operate the vehicle with no driver present. As an example, an autonomous vehicle may include a driver's seat with associated controls (e.g., steering wheel, accelerator pedal, and brake pedal), and the vehicle may be configured to drive with no one seated in the driver's seat or with little or no input from a person seated in the driver's seat. As another example, an autonomous vehicle may not include any driver's seat or associated driver's controls, and the vehicle may perform substantially all driving functions (e.g., driving, steering, braking, parking, and navigating) without human input. As another example, an autonomous vehicle may be configured to operate without a driver (e.g., the vehicle may be configured to transport human passengers or cargo without a driver present in the vehicle). As another example, an autonomous vehicle may be configured to operate without any human passengers (e.g., the vehicle may be configured for transportation of cargo without having any human passengers onboard the vehicle).

In particular embodiments, an optical signal (which may be referred to as a light signal, a light waveform, an optical waveform, an output beam, or emitted light) may include pulses of light, CW light, amplitude-modulated light, frequency-modulated light, or any suitable combination thereof. Although this disclosure describes or illustrates example embodiments of lidar systems 100 or light sources 110 that produce optical signals that include pulses of light, the embodiments described or illustrated herein may also be applied, where appropriate, to other types of optical signals, including continuous-wave (CW) light, amplitude-modulated optical signals, or frequency-modulated optical signals. For example, a lidar system 100 as described or illustrated herein may be a pulsed lidar system and may include a light source 110 configured to produce pulses of light. Alternatively, a lidar system 100 may be configured to operate as a frequency-modulated continuous-wave (FMCW) lidar system and may include a light source 110 configured to produce CW light or a frequency-modulated optical signal.

In particular embodiments, a lidar system 100 may be a FMCW lidar system where the emitted light from the light source 110 (e.g., output beam 125 in FIG. 1 or FIG. 3) includes frequency-modulated light. A pulsed lidar system is a type of lidar system 100 in which the light source 110 emits pulses of light, and the distance to a remote target 130 is determined from the time-of-flight for a pulse of light to travel to the target 130 and back. Another type of lidar system 100 is a frequency-modulated lidar system, which may be referred to as a frequency-modulated continuous-wave (FMCW) lidar system. A FMCW lidar system uses frequency-modulated light to determine the distance to a remote target 130 based on a modulation frequency of the received light (which is scattered by the remote target) relative to the modulation frequency of the emitted light. A round-trip time for the emitted light to travel to a target 130 and back to the lidar system may correspond to a frequency difference between the received scattered light and a portion of the emitted light.

For example, for a linearly chirped light source (e.g., a frequency modulation that produces a linear change in frequency with time), the larger the frequency difference between the emitted light and the received light, the farther away the target 130 is located. The frequency difference may be determined by mixing the received light with a portion of the emitted light (e.g., by coupling the two beams onto a detector, or by mixing analog electric signals corresponding to the received light and the emitted light) and determining the resulting beat frequency. For example, an electrical signal from an APD may be analyzed using a fast Fourier transform (FFT) technique to determine the frequency difference between the emitted light and the received light. If a linear frequency modulation m (e.g., in units of Hz/s) is applied to a CW laser, then the round-trip time T may be related to the frequency difference between the received scattered light and the emitted light $\Delta f$ by the expression $T=\Delta f/m$. Additionally, the distance D from the target 130 to the lidar system 100 may be expressed as $D=c\cdot\Delta f/(2m)$, where c is the speed of light. For example, for a light source 110 with a linear frequency modulation of $10^{12}$ Hz/s (or, 1 MHz/µs), if a frequency difference (between the received scattered light and the emitted light) of 330 kHz is measured, then the distance to the target is approximately 50 meters (which corresponds to a round-trip time of approximately 330 ns). As another example, a frequency difference of 1.33 MHz corresponds to a target located approximately 200 meters away.

The light source 110 for a FMCW lidar system may include a direct-emitter laser diode or a seed laser diode followed by a SOA. The seed laser diode or the direct-emitter laser diode may be operated in a CW manner (e.g., by driving the laser diode with a substantially constant DC current), and the frequency modulation may be provided by an external modulator (e.g., an electro-optic phase modulator). Alternatively, the frequency modulation may be produced by applying a DC bias current along with a current modulation to the seed laser diode or the direct-emitter laser diode. The current modulation produces a corresponding refractive-index modulation in the laser diode, which results in a frequency modulation of the light emitted by the laser diode. The current-modulation component (and corresponding frequency modulation) may have any suitable frequency or shape (e.g., piecewise linear, sinusoidal, triangle-wave, or sawtooth).

Figure 2:
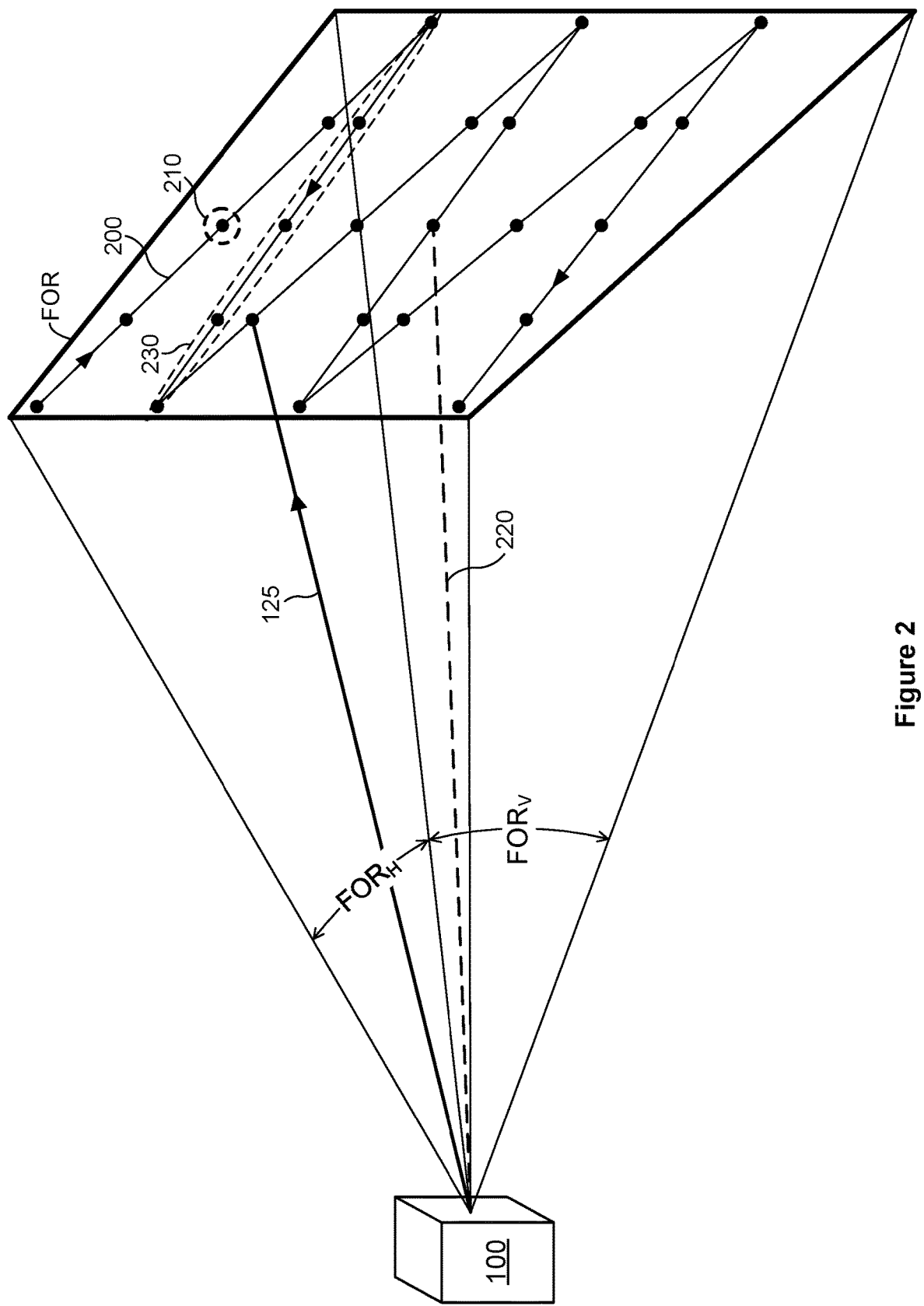
FIG. 2 illustrates an example scan pattern produced by a lidar system.

FIG. 2 illustrates an example scan pattern 200 produced by a lidar system 100. A scanner 120 of the lidar system 100 may scan the output beam 125 (which may include multiple emitted optical signals) along a scan pattern 200 that is contained within a FOR of the lidar system 100. A scan pattern 200 (which may be referred to as an optical scan pattern, optical scan path, scan path, or scan) may represent a path or course followed by output beam 125 as it is scanned across all or part of a FOR. Each traversal of a scan pattern 200 may correspond to the capture of a single frame or a single point cloud. In particular embodiments, a lidar system 100 may be configured to scan output optical beam 125 along one or more particular scan patterns 200. In particular embodiments, a scan pattern 200 may scan across any suitable field of regard (FOR) having any suitable horizontal FOR ($FOR_H$) and any suitable vertical FOR ($FOR_V$). For example, a scan pattern 200 may have a field of regard represented by angular dimensions (e.g., $FOR_H \times FOR_V$) 40°×30°, 90°×40°, or 60°×15°. As another example, a scan pattern 200 may have a $FOR_H$ greater than or equal to 10°, 25°, 30°, 40°, 60°, 90°, or 120°. As another example, a scan pattern 200 may have a $FOR_V$ greater than or equal to 2°, 5°, 10°, 15°, 20°, 30°, or 45°.

In the example of FIG. 2, reference line 220 represents a center of the field of regard of scan pattern 200. In particular embodiments, reference line 220 may have any suitable orientation, such as for example, a horizontal angle of 0° (e.g., reference line 220 may be oriented straight ahead) and a vertical angle of 0° (e.g., reference line 220 may have an inclination of 0°), or reference line 220 may have a nonzero horizontal angle or a nonzero inclination (e.g., a vertical angle of +10° or −10°). In FIG. 2, if the scan pattern 200 has a 60°×15° field of regard, then scan pattern 200 covers a ±30° horizontal range with respect to reference line 220 and a 7.5° vertical range with respect to reference line 220. Additionally, optical beam 125 in FIG. 2 has an orientation of approximately −15° horizontal and +3° vertical with respect to reference line 220. Optical beam 125 may be referred to as having an azimuth of −15° and an altitude of +3° relative to reference line 220. In particular embodiments, an azimuth (which may be referred to as an azimuth angle) may represent a horizontal angle with respect to reference line 220, and an altitude (which may be referred to as an altitude angle, elevation, or elevation angle) may represent a vertical angle with respect to reference line 220.

In particular embodiments, a scan pattern 200 may include multiple pixels 210, and each pixel 210 may be associated with one or more laser pulses or one or more distance measurements. Additionally, a scan pattern 200 may include multiple scan lines 230, where each scan line represents one scan across at least part of a field of regard, and each scan line 230 may include multiple pixels 210. In FIG. 2, scan line 230 includes five pixels 210 and corresponds to an approximately horizontal scan across the FOR from right to left, as viewed from the lidar system 100. In particular embodiments, a cycle of scan pattern 200 may include a total of $P_x \times P_y$ pixels 210 (e.g., a two-dimensional distribution of $P_x$ by $P_y$ pixels). As an example, scan pattern 200 may include a distribution with dimensions of approximately 100-2,000 pixels 210 along a horizontal direction and approximately 4-400 pixels 210 along a vertical direction. As another example, scan pattern 200 may include a distribution of 1,000 pixels 210 along the horizontal direction by 64 pixels 210 along the vertical direction (e.g., the frame size is 1000×64 pixels) for a total of 64,000 pixels per cycle of scan pattern 200. In particular embodiments, the number of pixels 210 along a horizontal direction may be referred to as a horizontal resolution of scan pattern 200, and the number of pixels 210 along a vertical direction may be referred to as a vertical resolution. As an example, scan pattern 200 may have a horizontal resolution of greater than or equal to 100 pixels 210 and a vertical resolution of greater than or equal to 4 pixels 210. As another example, scan pattern 200 may have a horizontal resolution of 100-2,000 pixels 210 and a vertical resolution of 4-400 pixels 210.

In particular embodiments, each pixel 210 may be associated with a distance (e.g., a distance to a portion of a target 130 from which an associated laser pulse was scattered) or one or more angular values. As an example, a pixel 210 may be associated with a distance value and two angular values (e.g., an azimuth and altitude) that represent the angular location of the pixel 210 with respect to the lidar system 100. A distance to a portion of target 130 may be determined based at least in part on a time-of-flight measurement for a corresponding pulse. An angular value (e.g., an azimuth or altitude) may correspond to an angle (e.g., relative to reference line 220) of output beam 125 (e.g., when a corresponding pulse is emitted from lidar system 100) or an angle of input beam 135 (e.g., when an input signal is received by lidar system 100). In particular embodiments, an angular value may be determined based at least in part on a position of a component of scanner 120. As an example, an azimuth or altitude value associated with a pixel 210 may be determined from an angular position of one or more corresponding scanning mirrors of scanner 120.

Figure 3:
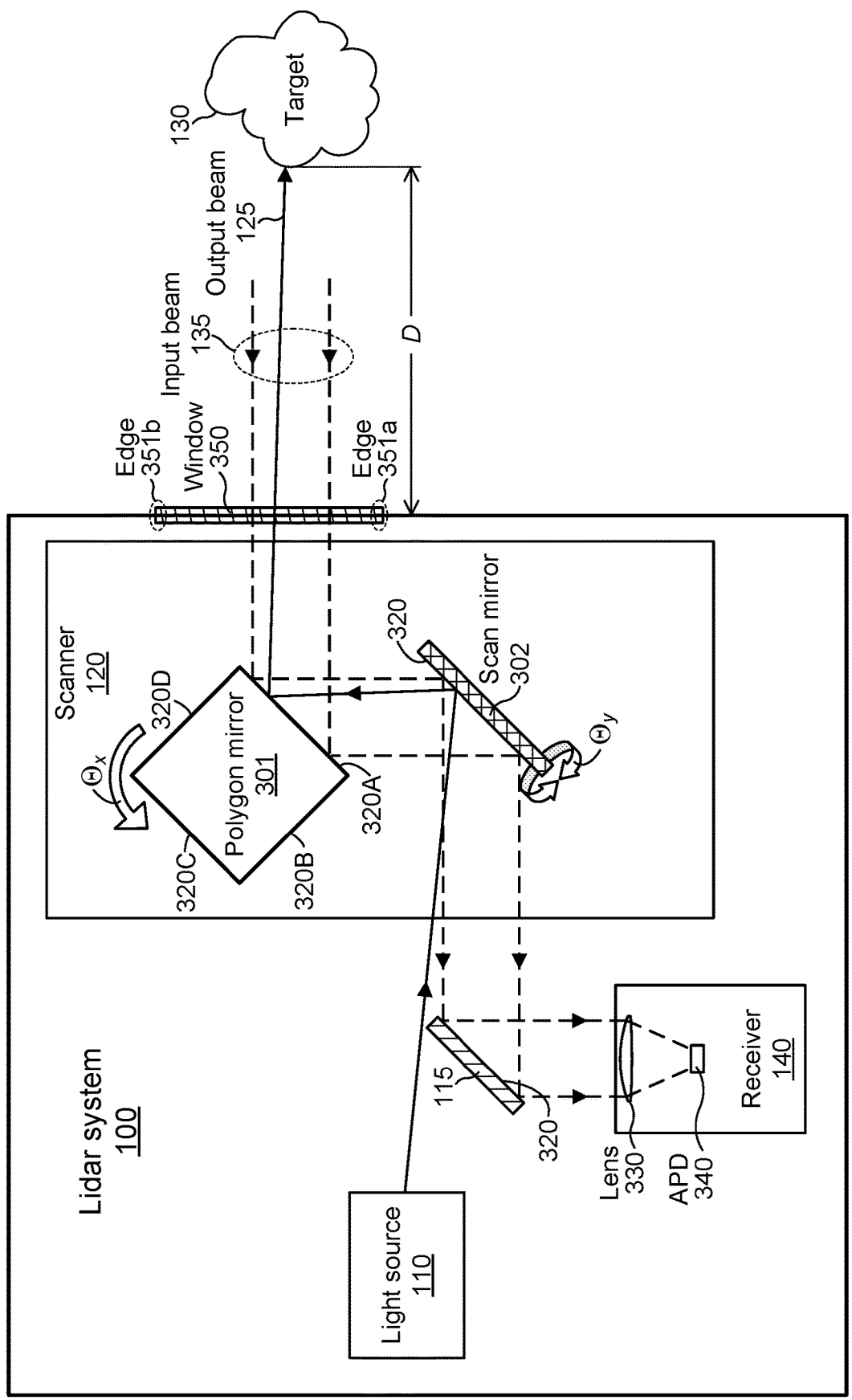
FIG. 3 illustrates an example lidar system with an example rotating polygon mirror.

FIG. 3 illustrates an example lidar system 100 with an example rotating polygon mirror 301. In particular embodiments, a scanner 120 may include a polygon mirror 301 configured to scan output beam 125 along a particular direction. In the example of FIG. 3, scanner 120 includes two scanning mirrors: (1) a polygon mirror 301 that rotates along the $\Theta_x$ direction and (2) a scanning mirror 302 that oscillates back and forth along the $\Theta_y$ direction. The output beam 125 from light source 110, which passes alongside mirror 115, is reflected by reflecting surface 320 of scan mirror 302 and is then reflected by a reflecting surface (e.g., surface 320A, 320B, 320C, or 320D) of polygon mirror 301. Scattered light from a target 130 returns to the lidar system 100 as input beam 135. The input beam 135 reflects from polygon mirror 301, scan mirror 302, and mirror 115, which directs input beam 135 through focusing lens 330 and to the detector 340 of receiver 140. The detector 340 may be a PN photodiode, a PIN photodiode, an APD, a SPAD, or any other suitable detector. A reflecting surface 320 (which may be referred to as a reflective surface) may include a reflective metallic coating (e.g., gold, silver, or aluminum) or a reflective dielectric coating, and the reflecting surface 320 may have any suitable reflectivity R at an operating wavelength of the light source 110 (e.g., R greater than or equal to 70%, 80%, 90%, 95%, 98%, or 99%).

In particular embodiments, a polygon mirror 301 may be configured to rotate along a $\Theta_x$ or $\Theta_y$ direction and scan output beam 125 along a substantially horizontal or vertical direction, respectively. A rotation along a Ox direction may refer to a rotational motion of mirror 301 that results in output beam 125 scanning along a substantially horizontal direction. Similarly, a rotation along a $\Theta_y$ direction may refer to a rotational motion that results in output beam 125 scanning along a substantially vertical direction. In FIG. 3, mirror 301 is a polygon mirror that rotates along the $\Theta_x$ direction and scans output beam 125 along a substantially horizontal direction, and mirror 302 pivots along the $\Theta_y$ direction and scans output beam 125 along a substantially vertical direction. In particular embodiments, a polygon mirror 301 may be configured to scan output beam 125 along any suitable direction. As an example, a polygon mirror 301 may scan output beam 125 at any suitable angle with respect to a horizontal or vertical direction, such as for example, at an angle of approximately 0°, 10°, 20°, 30°, 45°, 60°, 70°, 80°, or 90° with respect to a horizontal or vertical direction.

In particular embodiments, a polygon mirror 301 may refer to a multi-sided object having reflective surfaces 320 on two or more of its sides or faces. As an example, a polygon mirror may include any suitable number of reflective faces (e.g., 2, 3, 4, 5, 6, 7, 8, or 10 faces), where each face includes a reflective surface 320. A polygon mirror 301 may have a cross-sectional shape of any suitable polygon, such as for example, a triangle (with three reflecting surfaces 320), square (with four reflecting surfaces 320), pentagon (with five reflecting surfaces 320), hexagon (with six reflecting surfaces 320), heptagon (with seven reflecting surfaces 320), or octagon (with eight reflecting surfaces 320). In FIG. 3, the polygon mirror 301 has a substantially square cross-sectional shape and four reflecting surfaces (320A, 320B, 320C, and 320D). The polygon mirror 301 in FIG. 3 may be referred to as a square mirror, a cube mirror, or a four-sided polygon mirror. In FIG. 3, the polygon mirror 301 may have a shape similar to a cube, cuboid, or rectangular prism. Additionally, the polygon mirror 301 may have a total of six sides, where four of the sides include faces with reflective surfaces (320A, 320B, 320C, and 320D).

In particular embodiments, a polygon mirror 301 may be continuously rotated in a clockwise or counter-clockwise rotation direction about a rotation axis of the polygon mirror 301. The rotation axis may correspond to a line that is perpendicular to the plane of rotation of the polygon mirror 301 and that passes through the center of mass of the polygon mirror 301. In FIG. 3, the polygon mirror 301 rotates in the plane of the drawing, and the rotation axis of the polygon mirror 301 is perpendicular to the plane of the drawing. An electric motor may be configured to rotate a polygon mirror 301 at a substantially fixed frequency (e.g., a rotational frequency of approximately 1 Hz (or 1 revolution per second), 10 Hz, 50 Hz, 100 Hz, 500 Hz, or 1,000 Hz). As an example, a polygon mirror 301 may be mechanically coupled to an electric motor (e.g., a synchronous electric motor) which is configured to spin the polygon mirror 301 at a rotational speed of approximately 160 Hz (or, 9600 revolutions per minute (RPM)).

In particular embodiments, output beam 125 may be reflected sequentially from the reflective surfaces 320A, 320B, 320C, and 320D as the polygon mirror 301 is rotated. This results in the output beam 125 being scanned along a particular scan axis (e.g., a horizontal or vertical scan axis) to produce a sequence of scan lines, where each scan line corresponds to a reflection of the output beam 125 from one of the reflective surfaces of the polygon mirror 301. In FIG. 3, the output beam 125 reflects off of reflective surface 320A to produce one scan line. Then, as the polygon mirror 301 rotates, the output beam 125 reflects off of reflective surfaces 320B, 320C, and 320D to produce a second, third, and fourth respective scan line. In particular embodiments, a lidar system 100 may be configured so that the output beam 125 is first reflected from polygon mirror 301 and then from scan mirror 302 (or vice versa). As an example, an output beam 125 from light source 110 may first be directed to polygon mirror 301, where it is reflected by a reflective surface of the polygon mirror 301, and then the output beam 125 may be directed to scan mirror 302, where it is reflected by reflective surface 320 of the scan mirror 302. In the example of FIG. 3, the output beam 125 is reflected from the polygon mirror 301 and the scan mirror 302 in the reverse order. In FIG. 3, the output beam 125 from light source 110 is first directed to the scan mirror 302, where it is reflected by reflective surface 320, and then the output beam 125 is directed to the polygon mirror 301, where it is reflected by reflective surface 320A.

In particular embodiments, a lidar system 100 may include a window 350 configured to transmit the output beam 125 and the input beam 135. The window 350 in FIG. 3 may be made from any suitable substrate material, such as for example, glass or plastic (e.g., polycarbonate, acrylic, cyclic-olefin polymer, or cyclic-olefin copolymer), and the window 350 may have an optical transmission of greater than or equal to 70%, 80%, 90%, 95%, or 99% at an operating wavelength of light source 110. The window 350 may include a dielectric coating configured to be substantially transmitting to light at the wavelength of the light source 110. For example, the window 350 may have an anti-reflection (AR) dielectric coating on its interior or exterior surface, and the AR coating may have a reflectivity of less than 1% at an operating wavelength of the light source 110. Additionally, the dielectric coating may have an increased reflectivity at wavelengths away from the light-source operating wavelength, which may help prevent unwanted stray light (e.g., sunlight or light from other lidar systems) from entering the lidar system 100. For example, if the light source 110 operates at 1550 nm, the window 350 may have a dielectric coating with a reflectivity of less than 0.5% from approximately 1545 nm to approximately 1555 nm. Additionally, the dielectric coating may have a reflectivity of greater than approximately 90% at one or more wavelengths from approximately 900 nm to approximately 1500 nm.

Figure 4:
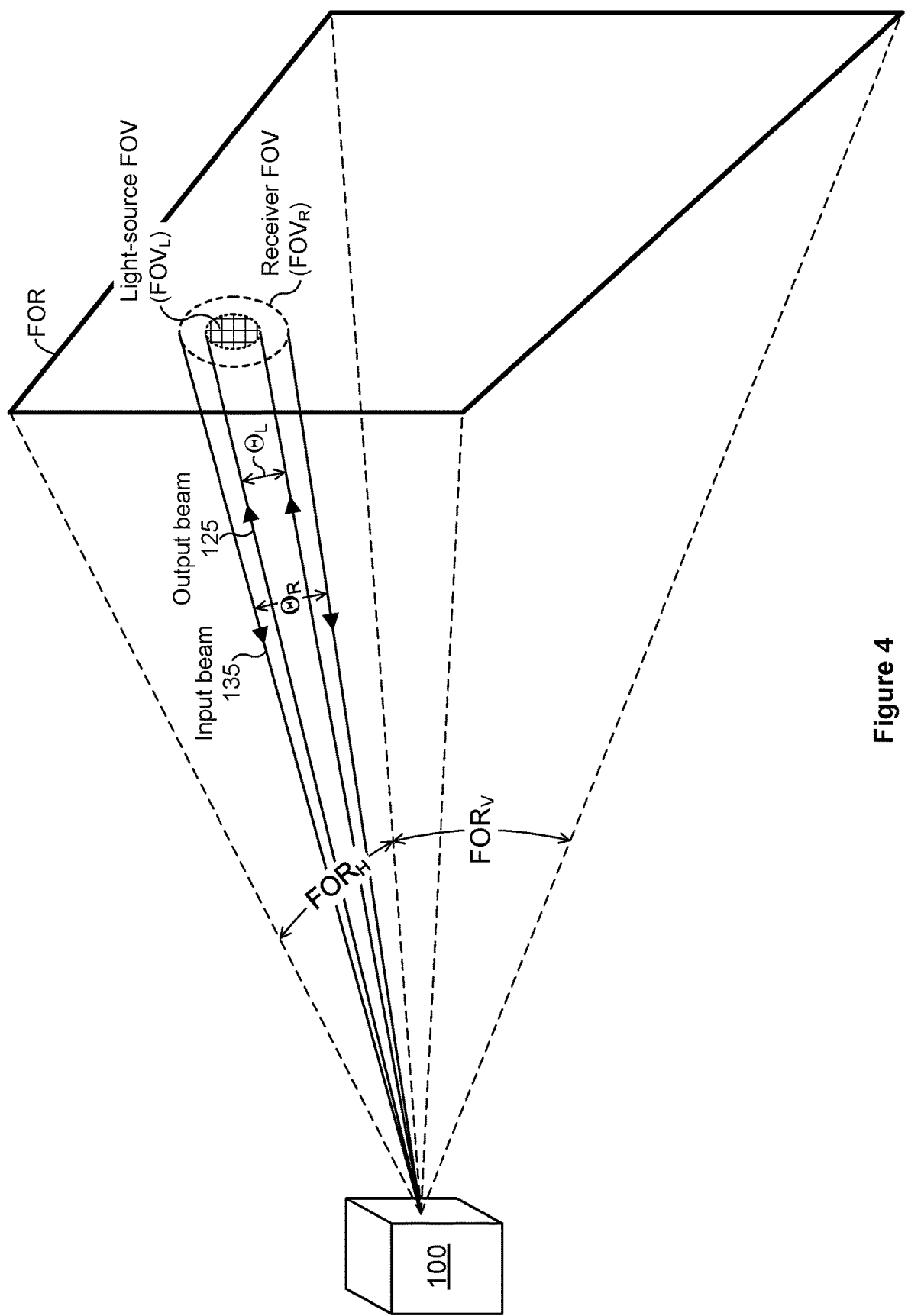
FIG. 4 illustrates an example light-source field of view ($FOV_L$) and receiver field of view ($FOV_R$) for a lidar system.

FIG. 4 illustrates an example light-source field of view ($FOV_L$) and receiver field of view ($FOV_R$) for a lidar system 100. A light source 110 of lidar system 100 may emit pulses of light as the $FOV_L$ and $FOV_R$ are scanned by scanner 120 across a field of regard (FOR). In particular embodiments, a light-source field of view may refer to an angular cone illuminated by the light source 110 at a particular instant of time. Similarly, a receiver field of view may refer to an angular cone over which the receiver 140 may receive or detect light at a particular instant of time, and any light outside the receiver field of view may not be received or detected. As an example, as the light-source field of view is scanned across a field of regard, a portion of a pulse of light emitted by the light source 110 may be sent downrange from lidar system 100, and the pulse of light may be sent in the direction that the $FOV_L$ is pointing at the time the pulse is emitted. The pulse of light may scatter off a target 130, and the receiver 140 may receive and detect a portion of the scattered light that is directed along or contained within the $FOV_R$.

In particular embodiments, scanner 120 may be configured to scan both a light-source field of view and a receiver field of view across a field of regard of the lidar system 100. Multiple pulses of light may be emitted and detected as the scanner 120 scans the $FOV_L$ and $FOV_R$ across the field of regard of the lidar system 100 while tracing out a scan pattern 200. In particular embodiments, the light-source field of view and the receiver field of view may be scanned synchronously with respect to one another, so that as the $FOV_L$ is scanned across a scan pattern 200, the $FOV_R$ follows substantially the same path at the same scanning speed. Additionally, the $FOV_L$ and $FOV_R$ may maintain the same relative position to one another as they are scanned across the field of regard. As an example, the $FOV_L$ may be substantially overlapped with or centered inside the $FOV_R$ (as illustrated in FIG. 4), and this relative positioning between $FOV_L$ and $FOV_R$ may be maintained throughout a scan. As another example, the $FOV_R$ may lag behind the $FOV_L$ by a particular, fixed amount throughout a scan (e.g., the $FOV_R$ may be offset from the $FOV_L$ in a direction opposite the scan direction).

In particular embodiments, the $FOV_L$ may have an angular size or extent $\Theta_L$ that is substantially the same as or that corresponds to the divergence of the output beam 125, and the $FOV_R$ may have an angular size or extent $\Theta_R$ that corresponds to an angle over which the receiver 140 may receive and detect light. In particular embodiments, the receiver field of view may be any suitable size relative to the light-source field of view. As an example, the receiver field of view may be smaller than, substantially the same size as, or larger than the angular extent of the light-source field of view. In particular embodiments, the light-source field of view may have an angular extent of less than or equal to 50 milliradians, and the receiver field of view may have an angular extent of less than or equal to 50 milliradians. The $FOV_L$ may have any suitable angular extent $\Theta_L$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. Similarly, the $FOV_R$ may have any suitable angular extent OR, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. In particular embodiments, the light-source field of view and the receiver field of view may have approximately equal angular extents. As an example, $\Theta_L$ and $\Theta_R$ may both be approximately equal to 1 mrad, 2 mrad, or 4 mrad. In particular embodiments, the receiver field of view may be larger than the light-source field of view, or the light-source field of view may be larger than the receiver field of view. As an example, $\Theta_L$ may be approximately equal to 3 mrad, and $\Theta_R$ may be approximately equal to 4 mrad. As another example, OR may be approximately L times larger than $\Theta_L$, where L is any suitable factor, such as for example, 1.1, 1.2, 1.5, 2, 3, 5, or 10.

In particular embodiments, a pixel 210 may represent or may correspond to a light-source field of view or a receiver field of view. As the output beam 125 propagates from the light source 110, the diameter of the output beam 125 (as well as the size of the corresponding pixel 210) may increase according to the beam divergence $\Theta_L$. As an example, if the output beam 125 has a $\Theta_L$ of 2 mrad, then at a distance of 100 m from the lidar system 100, the output beam 125 may have a size or diameter of approximately 20 cm, and a corresponding pixel 210 may also have a corresponding size or diameter of approximately 20 cm. At a distance of 200 m from the lidar system 100, the output beam 125 and the corresponding pixel 210 may each have a diameter of approximately 40 cm.

Figure 5:
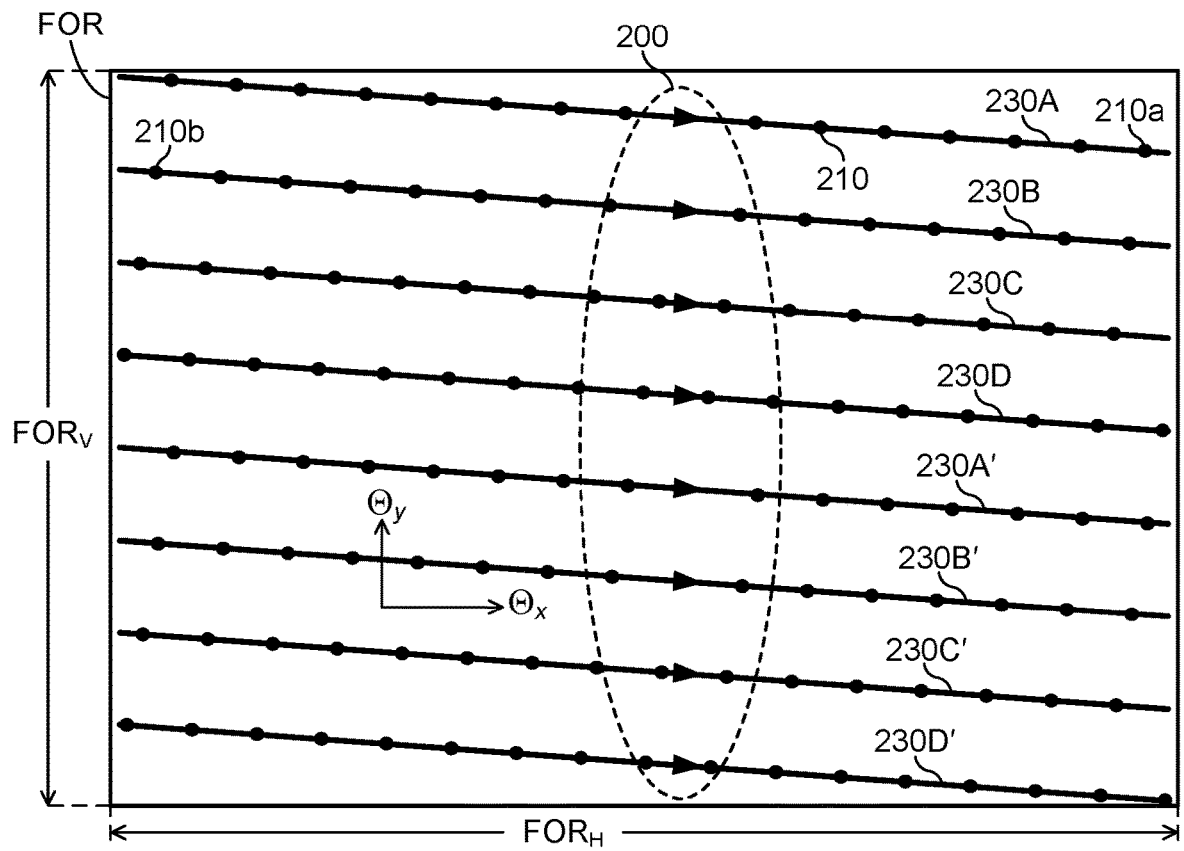
FIG. 5 illustrates an example unidirectional scan pattern that includes multiple pixels and multiple scan lines.

FIG. 5 illustrates an example unidirectional scan pattern 200 that includes multiple pixels 210 and multiple scan lines 230. In particular embodiments, scan pattern 200 may include any suitable number of scan lines 230 (e.g., approximately 1, 2, 5, 10, 20, 50, 100, 500, or 1,000 scan lines), and each scan line 230 of a scan pattern 200 may include any suitable number of pixels 210 (e.g., 1, 2, 5, 10, 20, 50, 100, 200, 500, 1,000, 2,000, or 5,000 pixels). The scan pattern 200 illustrated in FIG. 5 includes eight scan lines 230, and each scan line 230 includes approximately 16 pixels 210. In particular embodiments, a scan pattern 200 where the scan lines 230 are scanned in two directions (e.g., alternately scanning from right to left and then from left to right) may be referred to as a bidirectional scan pattern 200, and a scan pattern 200 where the scan lines 230 are scanned in the same direction may be referred to as a unidirectional scan pattern 200. The scan pattern 200 in FIG. 5 may be referred to as a unidirectional scan pattern 200 where each scan line 230 travels across the FOR in substantially the same direction (e.g., approximately from left to right as viewed from the lidar system 100). In particular embodiments, scan lines 230 of a unidirectional scan pattern 200 may be directed across a FOR in any suitable direction, such as for example, from left to right, from right to left, from top to bottom, from bottom to top, or at any suitable angle (e.g., at a 0°, 5°, 10°, 30°, or 45° angle) with respect to a horizontal or vertical axis. In particular embodiments, each scan line 230 in a unidirectional scan pattern 200 may be a separate line that is not directly connected to a previous or subsequent scan line 230.

In particular embodiments, a unidirectional scan pattern 200 may be produced by a scanner 120 that includes a polygon mirror (e.g., polygon mirror 301 of FIG. 3), where each scan line 230 is associated with a particular reflective surface 320 of the polygon mirror. A polygon mirror 301 may be configured to scan an output beam 125 across a field of regard as a series of scan lines 230. As an example, reflective surface 320A of polygon mirror 301 in FIG. 3 may produce scan line 230A in FIG. 5. Similarly, as the polygon mirror 301 rotates, reflective surfaces 320B, 320C, and 320D may successively produce scan lines 230B, 230C, and 230D, respectively. Additionally, for a subsequent revolution of the polygon mirror 301, the scan lines 230A', 230B', 230C', and 230D' may be successively produced by reflections of the output beam 125 from reflective surfaces 320A, 320B, 320C, and 320D, respectively. In particular embodiments, N successive scan lines 230 of a unidirectional scan pattern 200 may correspond to one full revolution of a N-sided polygon mirror. As an example, the four scan lines 230A, 230B, 230C, and 230D in FIG. 5 may correspond to one full revolution of the four-sided polygon mirror 301 in FIG. 3. Additionally, a subsequent revolution of the polygon mirror 301 may produce the next four scan lines 230A', 230B', 230C', and 230D' in FIG. 5.

Figure 6:
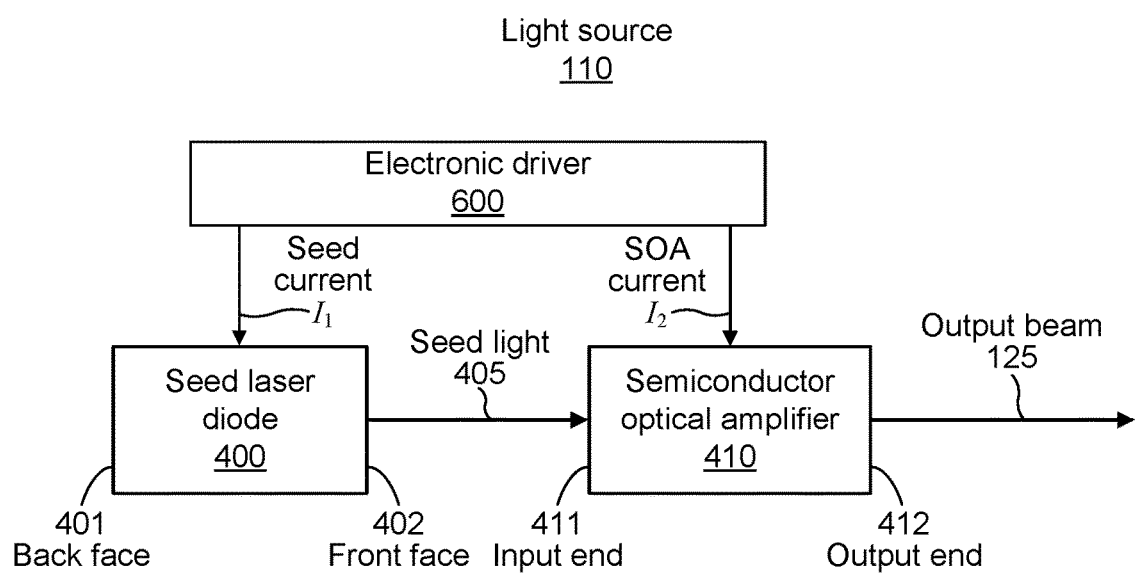
FIG. 6 illustrates an example light source that includes a seed laser diode and a semiconductor optical amplifier (SOA).

FIG. 6 illustrates an example light source 110 that includes a seed laser diode 400 and a semiconductor optical amplifier (SOA) 410. In particular embodiments, a seed laser diode 400 may produce seed light 405, and the seed light 405 may be amplified by a SOA 410. The seed light 405 (which may be referred to as a seed optical signal, an optical seed, or oscillator light) may include relatively low power CW light or relatively low-energy pulses of light. A seed laser diode 400 (which may be referred to as a seed laser, a seed diode, a seed, a laser diode, or a master oscillator) may include any suitable type of laser diode, such as for example, a Fabry-Perot laser diode, a quantum well laser, a DBR laser, a DFB laser, a VCSEL, or a quantum dot laser diode. For example, a light source 110 may include a DFB seed laser diode 400 that produces seed light 405 with a single-mode transverse beam profile and a quasi-single longitudinal mode. A SOA 410 may be referred to as a semiconductor amplifier, a semiconductor waveguide amplifier, a waveguide amplifier, an active optical waveguide, a tapered amplifier, a tapered semiconductor amplifier, a tapered SOA, a tapered-waveguide amplifier, or a power amplifier. A combination of a seed laser diode 400 and a SOA 410 may be referred to as a master-oscillator power-amplifier (MOPA) or as a semiconductor MOPA. In a MOPA, the seed laser 400 may act as a master oscillator that produces oscillator light (e.g., seed optical signal 405), and the SOA 410 may act as a power amplifier that amplifies the seed optical signal 405.

In particular embodiments, a lidar system 100 may include a light source 110, a scanner 120, a receiver 140, or a processor (e.g., controller 150). The light source 110 (which may include a seed laser diode 400 and a SOA 410) may emit an optical signal, and the scanner 120 may direct the emitted optical signal into a field of regard of the lidar system 100. For example, the optical signal may be part of an output beam 125 emitted by the light source 110, and the scanner 120 may scan the output beam 125 along a scan pattern 200 located within the field of regard of the lidar system 100. The receiver 140 may detect a portion of the emitted optical signal scattered by a target 130 located a distance D from the lidar system 100, and the controller 150 may determine the distance from the lidar system 100 to the target 130. For example, the emitted optical signal may include an optical pulse, and a portion of the scattered optical pulse may be detected by the receiver 140. The controller 150 may determine the distance D based at least in part on the round-trip time for the emitted optical pulse to travel from the lidar system 100 to the target 130 and back to the lidar system 100. For example, the distance D may be determined from the expression D=c·T/2, where c is the speed of light and T is the round-trip time.

Figure 7:
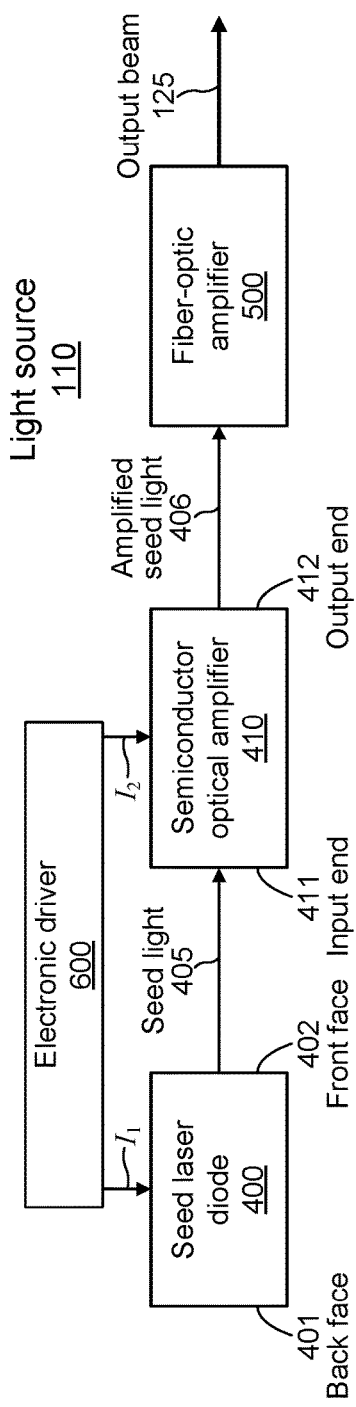
FIG. 7 illustrates an example light source that includes a seed laser diode, a semiconductor optical amplifier (SOA), and a fiber-optic amplifier.

In particular embodiments, a light source 110 of a lidar system 100 may include a seed laser diode 400 and a semiconductor optical amplifier (SOA) 410. The seed laser diode 400 may produce seed light 405, and the SOA 410 may amplify the seed light 405 to produce an amplified seed optical signal (which may be referred to as amplified seed light). The SOA 410 may include a semiconductor optical waveguide that receives the seed light 405 from the seed laser diode 400 and amplifies the seed light 405 as it propagates through the optical waveguide. The optical signal emitted by the light source 110 (e.g., output beam 125) may include the amplified seed light. For example, the amplified seed light may be emitted directly by the SOA 410 as an output beam 125. In the example of FIG. 6, the seed light 405 is amplified by the SOA 410, and the amplified seed light is emitted by the SOA 410 as an output beam 125 (e.g., the output beam 125 may be emitted as a free-space optical beam that is directed to a scanner 120). Alternatively, as illustrated in FIG. 7, prior to being emitted as an output beam 125, the amplified seed light 406 from a SOA 410 may be further amplified by a second amplifier stage (e.g., fiber-optic amplifier 500). The amplified seed light 406 is amplified by the fiber-optic amplifier 500 and then emitted as an output beam 125.

In particular embodiments, a light source 110 may include an electronic driver 600 that (i) supplies electrical current to a seed laser 400 and (ii) supplies electrical current to a SOA 410. In FIG. 6, the electronic driver 600 supplies seed current J to the seed laser diode 400 to produce the seed light 405. The seed current J supplied to the seed laser diode 400 may be a substantially constant DC electrical current so that the seed light 405 includes continuous-wave (CW) light or light having a substantially constant optical power. Additionally or alternatively, the seed current $I_1$ supplied to the seed laser diode 400 may include pulses of electrical current, and the seed light 405 may include corresponding pulses of light that are amplified by the SOA 410. For example, the seed current $I_1$ may include a DC current of approximately 1 mA, 10 mA, 100 mA, 200 mA, 500 mA, or any other suitable DC electrical current. As another example, the seed current $I_1$ may include pulses of electrical current, where each pulse of current causes the seed laser diode 400 to emit a corresponding pulse of light. The pulses of electrical current supplied to the seed laser diode 400 may have an amplitude of approximately 10 mA, 100 mA, 200 mA, 500 mA, 1 A, 2 A, or any other amplitude. As another example, the seed current $I_1$ may include pulses of electrical current along with a DC current, and the seed light 405 may include corresponding pulses of light that are amplified by the SOA 410. In this case, the DC current may be a sub-threshold amount of electrical current that, on its own, does not result in the seed laser diode 400 producing a significant amount of output light. For example, the seed current $I_1$ may include 300-mA pulses of electric current with a 5-ns duration along with a 10-mA DC current.

In FIG. 6, the electronic driver 600 supplies SOA current $I_2$ to the SOA 410, and the SOA current $I_2$ provides optical gain to the seed light 405 that propagates through the waveguide of the SOA 410. The SOA current $I_2$ may include pulses of electrical current, where each pulse of current causes the SOA 410 to amplify a portion of the seed light 405 to produce an emitted pulse of light. The SOA current $I_2$ may have a duration of approximately 0.5 ns, 1 ns, 2 ns, 5 ns, 10 ns, 20 ns, 50 ns, 100 ns, or any other suitable duration. The SOA current $I_2$ may have a peak amplitude of approximately 1 A, 2 A, 5 A, 10 A, 20 A, 50 A, 100 A, 200 A, 500 A, 1,000 A, or any other suitable peak current. For example, the SOA current $I_2$ supplied to the SOA 410 may include a series of current pulses, each current pulse having a duration of approximately 5-10 ns and a peak current of approximately 25 A. The series of current pulses may result in an output beam 125 that includes a corresponding series of pulses of light. Each emitted pulse of light may have a duration that is less than or equal to the duration of the corresponding electrical current pulse. For example, an electronic driver 600 may supply 5-ns duration current pulses to the SOA 410 at a repetition frequency of 700 kHz. This may result in an output beam 125 that includes emitted pulses of light with a duration of approximately 4 ns and a pulse repetition frequency of 700 kHz.

The seed laser diode 400 illustrated in FIG. 6 includes a front face 402 and a back face 401. The seed light 405 is emitted from the front face 402 and directed to the input end 411 of the SOA 410. The front face 402 or back face 401 may include a discrete facet formed by a semiconductor-air interface (e.g., a surface formed by cleaving or polishing a semiconductor structure to form the seed laser diode 400). Additionally, the front face 402 or the back face 401 may include a dielectric coating with a reflectivity (at the seed-laser operating wavelength) of between approximately 50% and approximately 99.9%. For example, a high-reflectivity dielectric coating may be deposited onto the back face 401 to provide the back face 401 with a reflectivity of 90% to 99.9% at a wavelength of the seed light 405.

The SOA 410 illustrated in FIG. 6 includes an input end 411 and an output end 412. The input end 411 or output end 412 may include a discrete facet formed by a semiconductor-air interface. Additionally, the input end 411 or the output end 412 may include a dielectric coating (e.g., an anti-reflection coating to reduce the reflectivity of the input end 411 or the output end 412). An anti-reflection (AR) coating may have a reflectivity at the seed-laser operating wavelength of less than 5%, 2%, 0.5%, 0.1%, or any other suitable reflectivity value. For example, the input end 411 may have an AR coating with a reflectivity of less than 1% that reduces the amount of seed light 405 reflected by the input end 411. Similarly, the output end 412 may have an AR coating that reduces the amount of amplified seed light reflected by the output end 412. An AR coating applied to the input end 411 or the output end 412 may reduce the amount of unwanted back-reflected seed light that propagates back to the seed laser diode 400. Additionally or alternatively, an AR coating applied to the input end 411 or output end 412 may prevent the SOA 410 from acting as a laser and emitting coherent light when no seed light 405 is present.

FIG. 7 illustrates an example light source 110 that includes a seed laser diode 400, a semiconductor optical amplifier (SOA) 410, and a fiber-optic amplifier 500. In particular embodiments, a light source 110 of a lidar system 100 may include: (i) a seed laser diode 400 that produces seed light 405, (ii) a SOA 410 that amplifies the seed light 405 to produce amplified seed light 406, and (iii) a fiber-optic amplifier 500 that further amplifies the amplified seed light 406 to produce an output beam 125 that includes the further-amplified seed optical signal. In FIG. 7, the seed light 405 is amplified by the SOA 410 to produce amplified seed light 406. The amplified seed light 406 is then further amplified by the fiber-optic amplifier 500, and the fiber-optic amplifier 500 emits the further-amplified seed optical signal as output beam 125. The output beam 125 may be emitted as a free-space optical beam that is directed to a scanner 120 which scans the output beam 125 across a field of regard. In FIG. 7, the output beam 125 includes the amplified seed light 406, which has been further-amplified by the fiber-optic amplifier 500. For example, the SOA 410 may provide 30 dB of optical gain to the seed light 405, and the fiber-optic amplifier 500 may provide 20 dB of optical gain to the amplified seed light 406, which results in an overall gain of 50 dB for the seed light 405.

A SOA 410 may provide any suitable amount of optical gain to seed light 405, such as for example, greater than or equal to approximately 20 dB, 25 dB, 30 dB, 35 dB, 40 dB, or 45 dB of optical gain. Similarly, a fiber-optic amplifier 500 may provide any suitable amount of optical gain to amplified seed light 406, such as for example, greater than or equal to approximately 10 dB, 15 dB, 20 dB, 25 dB, 30 dB, 35 dB, or 40 dB of optical gain. The optical gain (G) in decibels (dB) of an optical amplifier may be determined from the expression G=10 log($X_{out}/X_{in}$), where $X_{out}$ represents an output optical power or energy and $X_{in}$ represents an input optical power or energy. For example, a SOA 410 may receive seed light 405 having an average power ($P_{avg1}$) of approximately 0.1 mW and produce amplified seed light 406 having an average power ($P_{avg2}$) of approximately 50 mW. The optical gain of the SOA 410 in decibels, which may be determined from the expression G=10 log($P_{avg2}/P_{avg1}$), is approximately 27 dB. As another example, a SOA 410 may receive seed light 405 with optical pulses having a pulse energy ($E_{in}$) of approximately 20 pJ and produce amplified seed light 406 with amplified pulses having a pulse energy ($E_{out}$) of approximately 100 nJ. The optical gain of the SOA 410, which may be determined from the expression G=10 log($E_{out}/E_{in}$), is approximately 37 dB. As another example, a fiber-optic amplifier 500 may receive amplified seed light 406 with optical pulses having a peak power ($P_{in}$) of approximately 0.5 W and produce amplified output pulses having a peak power ($P_{out}$) of approximately 50 W. The optical gain of the fiber-optic amplifier 500, which may be determined from the expression G=10 log($P_{out}/P_{in}$), is approximately 20 dB. As another example, a 5-pJ pulse of seed light 405 may be amplified by a SOA 410 to produce a 5-nJ pulse of amplified seed light 406, corresponding to a gain of 30 dB. A fiber-optic amplifier 500 may further amplify the 5-nJ pulse of light by 20 dB to produce an output pulse of light (which is part of the output beam 125) with an energy of approximately 0.5 µJ.

Figure 8:
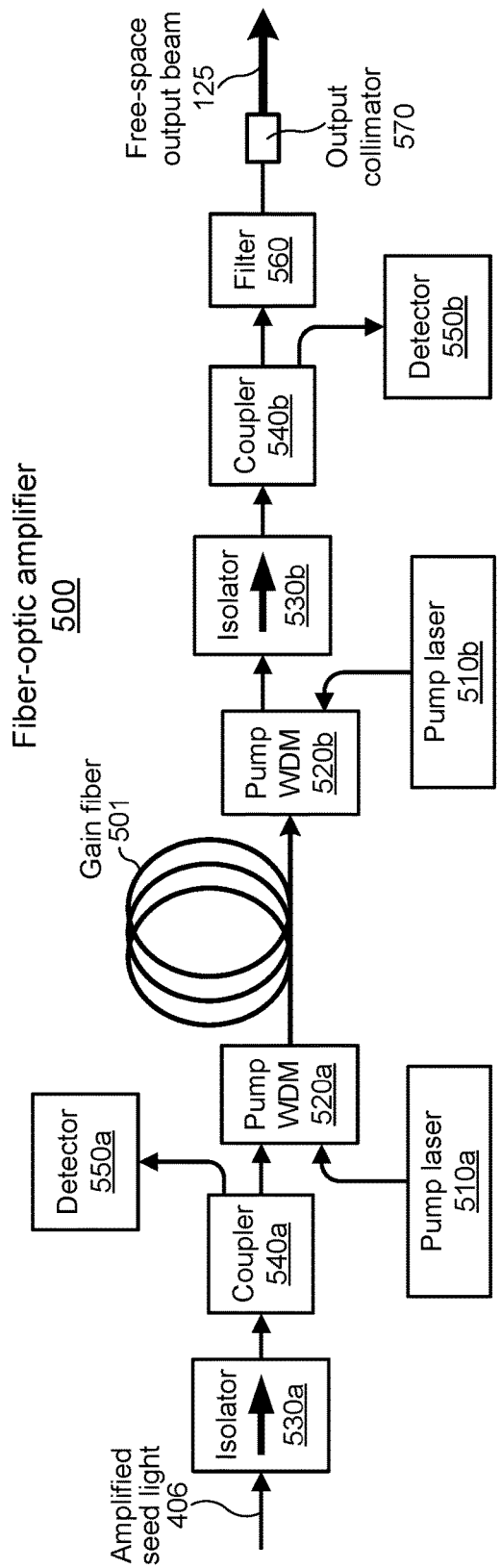
FIG. 8 illustrates an example fiber-optic amplifier.

FIG. 8 illustrates an example fiber-optic amplifier 500. In particular embodiments, a light source 110 of a lidar system 100 may include a fiber-optic amplifier 500 that receives an amplified seed optical signal 406 produced by a SOA 410 and further amplifies the amplified seed optical signal 406 to produce an emitted optical signal (e.g., output beam 125). The fiber-optic amplifier 500 may be terminated by a lens (e.g., output collimator 570) that produces a collimated free-space output beam 125 which may be directed to a scanner 120. In particular embodiments, a fiber-optic amplifier 500 may include one or more pump lasers (510a, 510b), one or more pump WDMs (520a, 520b), one or more optical gain fibers 501, one or more optical isolators (530a, 530b), one or more couplers (540a, 540b), one or more detectors (550a, 550b), one or more optical filters 560, or one or more output collimators 570. Additionally, a fiber-optic amplifier 500 may include one or more cladding power strippers (not illustrated in FIG. 8).

A fiber-optic amplifier 500 may include an optical gain fiber 501 that is optically pumped (e.g., provided with energy) by one or more pump laser diodes (e.g., pump laser 510a or pump laser 510b in FIG. 8). The optically pumped gain fiber 501 provides optical gain to the amplified seed light 406 while the amplified seed light 406 propagates through the gain fiber 501. The pump-laser light may travel through the gain fiber 501 in the same direction (co-propagating) as the amplified seed light or in the opposite direction (counter-propagating). Pump laser diode 510a, which provides co-propagating pump-laser light to the gain fiber 501, may be referred to as an input pump laser or a co-propagating pump laser. Pump laser diode 510b, which provides counter-propagating pump-laser light to the gain fiber 501, may be referred to as an output pump laser or a counter-propagating pump laser. A pump laser 510 may include a laser diode that produces light at any suitable wavelength to provide optical excitation to the gain material of gain fiber 501. For example, pump laser 510a or 510b may have an operating wavelength of approximately 808 nm, 810 nm, 915 nm, 940 nm, 960 nm, 976 nm, or 980 nm. As another example, the pump-laser light may have a wavelength between approximately 900 nm and approximately 1000 nm, and the seed light 405 and the amplified seed light 406 may have a wavelength between approximately 1400 nm and approximately 1600 nm. As another example, the pump-laser light may have a wavelength between approximately 900 nm and approximately 1000 nm, and the seed light 405 and the amplified seed light 406 may have a wavelength between approximately 1000 nm and approximately 1100 nm. A pump laser diode 510 may be supplied with a substantially constant electrical current so that the pump laser produces pump light having a substantially constant optical power. For example, a pump laser 510 may produce pump light having a substantially constant optical power of approximately 1 W, 2 W, 5 W, 10 W, 20 W, or any other suitable amount of optical power.

The fiber-optic core of a gain fiber 501 may be doped with a gain material that absorbs the pump-laser light and provides optical gain to the amplified seed light 406 as it propagates along the gain fiber 501. The gain material may include rare-earth ions, such as for example, erbium ($Er^{3+}$), ytterbium ($Yb^{3+}$), neodymium ($Nd^{3+}$), praseodymium ($Pr^{3+}$), holmium ($Ho^{3+}$), thulium ($Tm^{3+}$), dysprosium ($Dy^{3+}$), or any other suitable rare-earth element, or any suitable combination thereof. For example, a gain fiber 501 may include a core doped with erbium or with a combination of erbium and ytterbium. The rare-earth dopants absorb light from a pump laser and are "pumped" or promoted into excited states that provide optical amplification to the amplified seed light 406 through stimulated emission of photons. The rare-earth ions in excited states may also emit photons through spontaneous emission, resulting in the production of amplified spontaneous emission (ASE) light by the gain fiber 501.

A gain fiber 501 may be a single-clad or multi-clad optical fiber and may have a core diameter of approximately 6 μm, 7 μm, 8 μm, 9 μm, 10 μm, 12 μm, 20 μm, 25 μm, or any other suitable core diameter. A single-clad gain fiber 501 may include a core surrounded by a cladding material, and the pump light and the amplified seed light 406 may both propagate substantially within the core of the gain fiber 501. A multi-clad gain fiber 501 may include a core, an inner cladding surrounding the core, and one or more additional cladding layers surrounding the inner cladding. The amplified seed light 406 may propagate substantially within the core, while the pump light may propagate substantially within the inner cladding and the core. The length of gain fiber 501 in an amplifier 500 may be approximately 0.5 m, 1 m, 2 m, 4 m, 6 m, 10 m, 20 m, or any other suitable gain-fiber length.

The pump-laser light from a pump laser 510 may be coupled into gain fiber 501 via a pump wavelength-division multiplexer (WDM) 520. A pump WDM 520 (which may be referred to as a pump-signal combiner, a pump combiner, a wavelength combiner, a combiner, a multiplexer, a demultiplexer, or a WDM) may be used to combine or separate pump light and light that is amplified by the gain fiber 501. In FIG. 8, pump WDM 520a combines the amplified seed light 406 with light from pump laser 510a, and the combined pump-seed light is coupled into the input end of the optical gain fiber 501. Pump WDM 520b receives the further-amplified seed light from the output end of the optical gain fiber 501 and sends it to the isolator 530b. Additionally, pump WDM 520b couples counter-propagating light from pump laser 510b into the output end of the optical gain fiber 501.

A fiber-optic amplifier 500 may include one or more optical filters 560 located at the input or output side of the amplifier 500. An optical filter 560 (which may include an absorptive filter, dichroic filter, long-pass filter, short-pass filter, bandpass filter, notch filter, or fiber Bragg grating) may transmit light over a particular pass-band and substantially block light outside of the pass-band. An optical filter 560 located at the input side of a fiber-optic amplifier 500 may reduce the amount of optical noise (e.g., ASE from a SOA 410) that propagates into the gain fiber 501. In FIG. 8, optical filter 560 is located at the output side of the amplifier 500 and may reduce the amount of ASE that accompanies the further-amplified seed light produced by the amplifier 500. For example, the filter 560 in FIG. 8 may remove greater than 80% of the ASE light produced by the gain fiber 501. As another example, the filter 560 in FIG. 8 may transmit light at the operating wavelength of the seed laser diode 400 (e.g., 1530 nm) and may have a 5-nm pass-band centered at the operating wavelength. The filter 560 may substantially attenuate light at wavelengths outside of the pass-band (e.g., ASE light with wavelengths of approximately 1450-1525 nm and 1535-1650 nm may be blocked from reaching the output collimator 570).

A fiber-optic amplifier 500 may include one or more optical isolators 530. An isolator 530 may reduce or attenuate backward-propagating light, which may destabilize or cause damage to seed laser diode 400, SOA 410, pump laser 510a or 510b, or gain fiber 501. Isolators 530a and 530b in FIG. 8 may allow light to pass in the direction of the arrow drawn in the isolator and block light propagating in the reverse direction. Backward-propagating light may arise from ASE light from gain fiber 501, counter-propagating pump light from pump laser 510b, or optical reflections from one or more optical interfaces of a fiber-optic amplifier 500. An optical isolator 530 may prevent the destabilization or damage associated with backward-propagating light by blocking most of the backward-propagating light (e.g., by attenuating backward-propagating light by greater than or equal to 5 dB, 10 dB, 20 dB, 30 dB, 40 dB, 50 dB, or any other suitable attenuation value). Isolator 530a in FIG. 8 may prevent ASE produced by gain fiber 501 from reaching a SOA 410 or a seed laser diode 400 located before the fiber-optic amplifier 500. Isolator 530b may prevent back reflections (e.g., from coupler 540b, detector 550b, filter 560, or output collimator 570) from propagating to the gain fiber 501 or to other components of the fiber-optic amplifier 500.

A fiber-optic amplifier 500 may include one or more couplers 540 and one or more detectors 550. A coupler 540 may split off a portion of light (e.g., approximately 0.1%, 0.5%, 1%, 2%, or 5% of light received by the coupler 540)

and direct the split-off portion to a detector 550. In FIG. 8, input coupler 540*a* may split off approximately 1% of the amplified seed light 406 and send it to detector 550*a*, and the remaining approximately 99% of the amplified seed light 406 may continue on to the gain fiber 501. At the output side of the fiber-optic amplifier 500, the output coupler 540*b* splits off a portion of the light after the gain fiber 501 and sends it to detector 550*b*. Detector 550*a* may measure the amplified seed light 406 coming into the amplifier 500, and detector 550*b* may measure the light after amplification. A detector 550*a* or 550*b* may be used to monitor the performance or health of the fiber-optic amplifier 500. For example, if an electrical signal from detector 550*a* or 550*b* drops below a particular threshold level, then a processor or controller 150 may determine that there is a problem with the amplifier 500 (e.g., there may be insufficient optical power in the input amplified seed light 406, a pump laser may be failing, or one of the other components in the amplifier 500 may be failing). In response to determining that there is a problem with the amplifier 500, the processor or controller 150 may shut down or disable the amplifier 500, shut down or disable the light source 110, shut down or disable the lidar system 100, or send a notification that the amplifier 500, light source, 110, or lidar system 100 is in need of service or repair.

A fiber-optic amplifier 500 may include one or more cladding power strippers. A cladding power stripper (which may be referred to as a cladding mode stripper, a cladding light stripper, a pump light stripper, or a pump stripper) may be used to attenuate or remove light from a cladding layer of a multi-clad optical fiber. For example, a cladding power stripper may remove residual pump-laser light that propagates through a cladding layer of a multi-clad gain fiber 501. Residual pump light may refer to leftover pump light that reaches an end of an optical gain fiber 501 without being absorbed while propagating through the gain fiber 501. In FIG. 8, the gain fiber 501 may be a multi-clad gain fiber, and the fiber-optic amplifier 500 may include one or more cladding power strippers (not illustrated in FIG. 8). For example, a cladding power stripper may be located between the pump WDM 520*b* and the isolator 530*b*, and the power stripper may remove residual pump light from pump laser 510*a* that is not absorbed by the gain fiber 501. Additionally or alternatively, a cladding power stripper may be located between the coupler 540*a* and the pump WDM 520*a*, and the power stripper may remove residual pump light from pump laser 510*b*. The light propagating in the core of a multi-clad fiber (e.g., amplified seed light 406) may not be significantly attenuated when propagating through a cladding power stripper.

In particular embodiments, a fiber-optic amplifier 500 may include an input optical fiber configured to receive amplified seed light 406 from SOA 410. The input optical fiber may be part of or may be coupled or spliced to one of the components of the fiber-optic amplifier. For example, the amplified seed light 406 from a SOA 410 may be coupled into an optical fiber which is spliced to an input optical fiber of isolator 530*a*. As another example, the amplified seed light 406 from SOA 410 may be a free-space beam that is coupled into an input optical fiber of fiber-optical amplifier 500 using one or more lenses. As another example, an input optical fiber of fiber-optic amplifier 500 may be positioned at or near an output end 412 of a SOA 410 so that the amplified seed light 406 is directly coupled from the SOA 410 into the input optical fiber.

In particular embodiments, the optical components of a fiber-optic amplifier 500 may be free-space components, fiber-coupled components, or a combination of free-space and fiber-coupled components. As an example, each optical component in FIG. 8 may be a free-space optical component or a fiber-coupled optical component. As another example, the amplified seed light 406 may be a free-space optical beam, and isolator 530*a*, coupler 540*a*, and pump WDM 520*a* may each be free-space optical components. Additionally, the pump light from pump-laser 510*a* may be a free-space beam that is combined with the amplified seed light 406 by pump WDM 520*a*, and the combined pump-seed light may form a free-space beam that is coupled into the gain fiber 501 via one or more lenses.

In particular embodiments, a light source 110 of a lidar system 100 may be disabled during particular intervals of time while the lidar system 100 is operating. For example, a scanner 120 may scan an output beam 125 across the field of regard of a lidar system 100 as a series of scan lines 230, and the light source 110 may be disabled during a portion of time between the end of one scan line and the beginning of a subsequent scan line. Referring to FIG. 5, a light source 110 may be disabled during a portion of time between the end of scan line 230A and the beginning of scan line 230B. Pixel 210*a* in FIG. 5 may represent the last pixel of scan line 230A, and pixel 210*b* may represent the first pixel of scan line 230B. After the lidar system 100 has emitted or received light corresponding to pixel 210*a*, the light source 110 may be disabled, and prior to emitting light corresponding to pixel 210*b*, the light source 110 may be enabled. The light source 110 may be disabled for any suitable interval of time, such as for example, approximately 0.1 ms, 0.2 ms, 0.5 ms, 1 ms, 2 ms, or 10 ms. For example, a scanner 120 may scan the output beam 125 along each scan line 230 in a time interval of approximately 1 ms, and there may be a time interval of approximately 0.6 ms between successive scan lines. The light source 110 may be enabled for the 1-ms time interval during which a scan line is scanned, and the light 110 source may be disabled during at least a portion of the 0.6-ms time interval between successive scan lines.

In particular embodiments, disabling a light source 110 may include the electronic driver 600 reducing an amount of electrical current supplied to one or more components of the light source 110. The components of a light source 110 may include a seed laser diode 400, a SOA 410, a fiber-optic amplifier 500, or a pump laser diode 510. Reducing the amount of electrical current supplied to a component may include reducing the supplied current below a normal operating current, setting the supplied current to approximately zero amperes, or powering off the component. For example, during normal operation, a seed laser diode 400 may be supplied with 100-mA pulses of electrical seed current $I_1$, and disabling the light source 110 may include disabling the seed laser diode 400 by not sending any current pulses to the seed laser diode 400 (e.g., the seed laser diode 400 is powered off or the supplied seed current $I_1$ is set to zero amperes). As another example, during normal operation, the SOA current $I_2$ supplied to a SOA 410 may include 20-A pulses of electrical current, and disabling the light source 110 may include disabling the SOA 410 by not sending any current pulses to the SOA 410. Additionally, during normal operation, the SOA current $I_2$ may also include a relatively low DC bias current (e.g., 50 mA of DC current), and when the light source 110 is disabled, the DC bias current may continue to be supplied to the SOA or may be reduced to approximately zero amperes. As another example, for a light source 110 that includes a fiber-optic amplifier 500, disabling the light source 110 may include disabling the fiber-optic amplifier 500. Disabling the fiber-optic amplifier 500 may include reducing the electrical current supplied to one or more pump lasers 510 of the amplifier 500. A typical DC electrical current supplied to a pump laser diode 510 may be between 2 A and 20 A, and the amplifier 500 may be temporarily disabled by reducing the pump-laser current to zero amperes, 0.1 A, 0.2 A, 0.5 A, or any other suitable amount of reduced electrical current.

As illustrated in FIG. 3, a scanner 120 may include a polygon mirror 301, and each scan line 230 may correspond to a reflection of the output beam 125 from one of the reflective surfaces 320 of the polygon mirror 301. In FIG. 3, each scan line may begin at or near edge 351*a* of the window 350 and may end at or near edge 351*b* of the window 350. Periodically disabling the light source 110 between successive scan lines may reduce the power consumption of the light source 110, which in turn may improve the thermal performance of the lidar system 100, since less power being consumed may mean that less waste heat is produced. Additionally, disabling the light source 110 may reduce the amount of internally scattered light produced within the lidar system 100. If the light source 110 is not disabled periodically, then before the output beam 125 reaches edge 351*a* of the window 350, most of the light from the output beam 125 may be scattered within the lidar system 100. Additionally, most of the output beam 125 may be scattered internally after the output beam 125 scans past edge 351*b* of the window 350. The internally scattered light may result in excessive optical signals received by the APD 340 which may damage or saturate the APD 340 or the receiver 140. Periodically disabling the light source 110 may substantially reduce or prevent the occurrence of excessive optical signals being received by the APD 340.

In particular embodiments, a lidar system 100 may be a pulsed lidar system where the light source 110 emits an output beam 125 with optical pulses having one or more of the following optical characteristics: a wavelength between 900 nm and 1700 nm; a pulse energy between 0.01 J and 100 µJ; a pulse repetition frequency between 80 kHz and 10 MHz; and a pulse duration between 1 ns and 100 ns. For example, light source 110 in FIG. 6 or FIG. 7 may emit an output beam 125 with optical pulses having a wavelength of approximately 1550 nm, a pulse energy of approximately 0.5 pJ, a pulse repetition frequency of approximately 600 kHz, and a pulse duration of approximately 5 ns. As another example, the light source 110 may emit pulses of light having a wavelength from approximately 1500 nm to approximately 1510 nm. As another example, the light source 110 may emit pulses of light having a wavelength of approximately 905 nm, 1400 nm, 1480 nm, 1505 nm, 1530 nm, 1550 nm, 1555 nm, 1600 nm, or any other suitable wavelength. As another example, the seed light 405, the amplified seed light 406, and the output beam 125 may each have approximately the same wavelength (e.g., a wavelength between 1400 nm and 1600 nm). As another example, the light source 110 may emit an output beam 125 having a wavelength between approximately 1000 nm and approximately 1100 nm. In the example of FIG. 6, seed laser diode 400 may produce seed light 405 with optical pulses having a pulse energy of approximately 100 pJ, and the SOA 410 may amplify the pulses to produce an output beam 125 with optical pulses having a pulse energy of approximately 250 nJ. In the example of FIG. 7, seed laser diode 400 may produce optical pulses having a pulse energy of approximately 5 pJ, the SOA 410 may amplify the seed-laser pulses to produce optical pulses having a pulse energy of approximately 5 nJ, and the fiber-optic amplifier 500 may further amplify the pulses to produce an output beam 125 with optical pulses having a pulse energy of approximately 0.5 µJ.

In particular embodiments, a lidar system 100 may be a FMCW lidar system where the light source 110 emits an output beam 125 that includes frequency-modulated light. The frequency-modulated light may be produced by applying an amplitude modulation to the electrical current $I_1$ supplied to the seed laser diode 400 or to the electrical current $I_2$ supplied to the SOA 410. For example, the seed current may include a current-modulation component that produces a corresponding frequency modulation of the seed light 405. In FIG. 6, frequency-modulated seed light 405 may be amplified by the SOA 410 to produce a frequency-modulated output beam 125. In FIG. 7, frequency-modulated seed light 405 may be amplified by the SOA 410 and then further amplified by the fiber-optic amplifier 500 to produce a frequency-modulated output beam 125. Alternatively, instead of applying a current-modulation component to the seed current $I_1$, a light source 110 may include a phase modulator located between the seed laser diode 400 and SOA 410, and the phase modulator may apply a phase modulation to the seed light 405 to produce frequency-modulated seed light that is amplified by the SOA 410.

In particular embodiments, the output beam 125 of a lidar system 100 may have a wavelength between approximately 1400 nm and approximately 1510 nm. For example, a light source 110 may include a seed laser diode 400 that produces seed light 405 having a wavelength in the 1400-1510 nm wavelength range, and the SOA 410 may amplify the seed light 405 to produce amplified seed light 406 having approximately the same wavelength within the 1400-1510 nm range. The seed laser diode 400 may include gallium (Ga), indium (In), arsenide (As), and phosphide (P) with a composition $Ga_xIn_{1-x}As_yP_{1-y}$, where x is a value from 0.4 to 0.5 and y is a value from 0.7 to 0.84. For example, the seed laser diode 400 may be attached to or grown on an InP substrate, and the value of x may be approximately 0.47, which may provide an approximate lattice match between the InP substrate and the $Ga_{0.47}In_{0.53}As_yP_{1-y}$ seed laser diode 400. As another example, the value of y may be approximately 0.84, which may correspond to a wavelength of approximately 1500-1510 nm for the seed light 405 produced by the seed laser diode 400. In particular embodiments, a light source 110 may include a seed laser diode 400 that produces seed light 405 having a wavelength in the 1500-1510 nm wavelength range. For example, a seed laser diode 400 may be configured to produce seed light 405 having a wavelength of approximately 1505 nm, and the output beam 125 may have the same wavelength of approximately 1505 nm.

Figure 9:
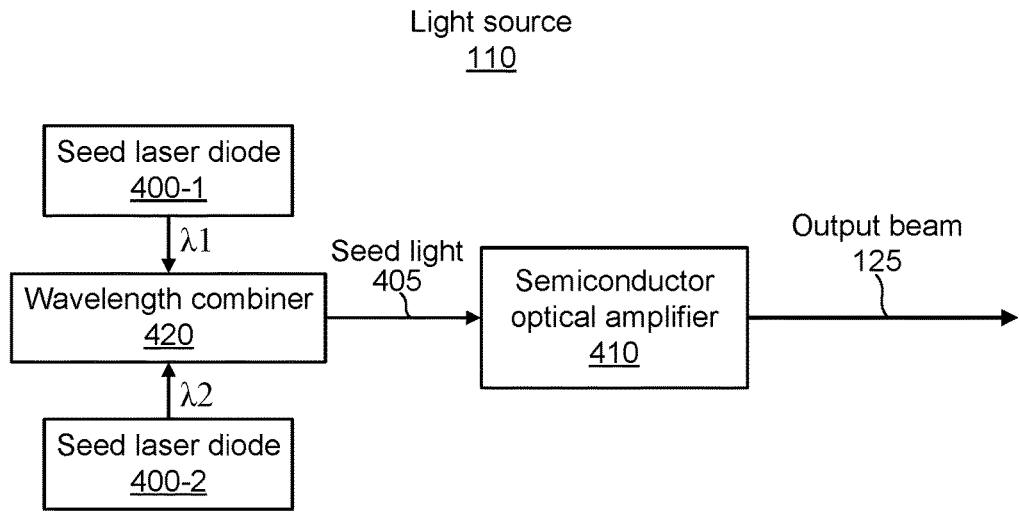
FIG. 9 illustrates an example light source that includes two seed laser diodes operating at two different wavelengths.

FIG. 9 illustrates an example light source 110 that includes two seed laser diodes (400-1 and 400-2) operating at two different wavelengths (λ1 and λ2, respectively). In particular embodiments, a light source 110 may include two or more seed laser diodes, where each seed laser diode produces light at a different wavelength, and the output beam 125 includes optical signals at each of the two or more wavelengths. In FIG. 9, seed laser diode 400-1 produces light at wavelength λ1, and seed laser diode 400-2 produces light at wavelength λ2. The wavelength combiner 420 combines the light at wavelength λ1, from seed laser diode 400-1, with the light at wavelength λ2, from seed laser diode 400-2, to produce seed light 405. The seed light 405, which includes the light from seed laser diode 400-1 and seed laser diode 400-2, is sent to the SOA 410. The seed light 405 is amplified by the SOA 410 to produce the output beam 125, which includes amplified seed light at wavelengths λ1 and λ2. The seed laser diodes 400-1 and 400-2 or the SOA 410 may be operated in a pulsed manner (e.g., supplied with pulsed electrical current) to produce optical pulses, where each optical pulse has a wavelength of λ1 or λ2. For example, the seed laser diodes 400-1 and 400-2 may be pulsed alternately so that the output beam 125 includes time-interleaved optical pulses that alternate between wavelength λ1 and wavelength λ2. The lidar system 100 may include a receiver 140 with two detectors 340 configured so that one detector receives and detects light at wavelength λ1 and the other detector receives and detects light at wavelength λ2. As another example, instead of pulsing the seed laser diodes 400-1 and 400-2 alternately, the two seed laser diodes may be pulsed at approximately the same time. Applying pulses of electrical current to both seed laser diode 400-1 and 400-2 simultaneously may result in an output beam 125 with pulses of light, where each pulse of light includes light at wavelength λ1 and wavelength λ2.

The wavelength combiner 420 may be a free-space combiner, a fiber-optic combiner, or an integrated-optic combiner. For example, the light from the seed laser diodes 400-1 and 400-2 may be emitted as free-space beams, and the wavelength combiner 420 may be a free-space combiner (e.g., an optical element with a dichroic coating that transmits light at wavelength λ1 and reflects light at wavelength λ2). As another example, the seed laser diodes 400-1 and 400-2 may be fiber-coupled devices, and the wavelength combiner 420 may be a fiber-optic combiner that combines light at the wavelengths λ1 and λ2 into a single optical fiber. As another example, the seed laser diodes 400-1 and 400-2 may be part of a photonic integrated circuit (PIC), and the wavelength combiner 420 may be an integrated-optic combiner. A PIC (which may be referred to as a planar lightwave circuit (PLC) or an integrated optoelectronic device) may include two or more optical devices or elements integrated together into a single device. For example, seed laser diodes 400-1 and 400-2, combiner 420, and SOA 410 may be integrated together to form a PIC. Light from each of the seed laser diodes 400-1 and 400-2 may be sent to the combiner 420 via an optical waveguide integrated into the PIC. The wavelength combiner 420 may be configured to combine the light from the two seed laser diodes 400-1 and 400-2 into a single output waveguide that is coupled to the SOA 410.

Figure 10:
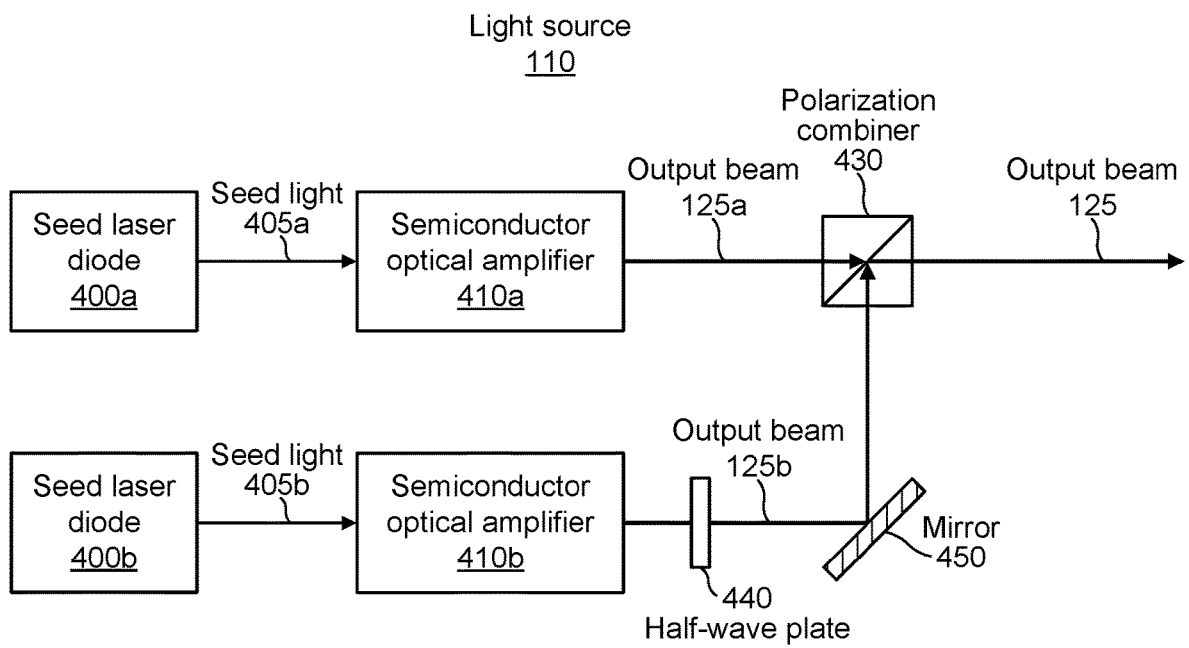
FIG. 10 illustrates an example light source that includes two seed laser diodes, two SOAs, and a polarization combiner.

FIG. 10 illustrates an example light source 110 that includes two seed laser diodes (400a and 400b), two SOAs (410a and 410b), and a polarization combiner 430. In particular embodiments, a light source 110 may include two seed laser diodes and two SOAs, and the output light from the two SOAs may be combined using a polarization combiner 430. In the example of FIG. 10, seed laser diode 400a produces seed light 405a that is amplified by SOA 410a to produce output beam 125a. Similarly, seed laser diode 400b produces seed light 405b that is amplified by SOA 410b to produce output beam 125b. The output beams 125a and 125b may be orthogonally polarized, and the light source 110 includes a polarization combiner 430 that combines the output beams 125a and 125b to produce a combined output beam 125. The polarization combiner 430 may be a free-space polarizing beam-splitter cube, or the polarization combiner 430 may be a fiber-optic component that receives the output beams 125a and 125b via polarization-maintaining optical fiber. In FIG. 10, the polarization combiner 430 may be a polarizing beam-splitter cube that transmits output beam 125a (which may be horizontally polarized) and reflects output beam 125b (which may be vertically polarized), and the output beam 125 includes the combined light from output beam 125a and output beam 125b.

In FIG. 10, the output beam 125b passes through a half-wave plate 440, which rotates the polarization by 90 degrees so that the polarization of output beam 125b is orthogonal to the polarization of output beam 125a. Output beam 125b reflects off mirror 450, and the orthogonally polarized output beams 125a and 125b are combined by the polarization combiner 430. In particular embodiments, instead of using a half-wave plate, the seed lasers 400a and 400b may be mechanically arranged to that they emit orthogonally polarized light. For example, seed laser diode 400a may be mounted at a 90-degree orientation with respect to seed laser diode 400b so that the two seed-laser beams 405a and 405b are orthogonally polarized. Additionally, SOA 410a may be mounted at a 90-degree orientation with respect to SOA 410b. With this mechanical arrangement, the output beams 125a and 125b may be orthogonally polarized, and the light source 110 may not include a half-wave plate to rotate the polarization of one of the beams.

In particular embodiments, SOA 410a and SOA 410b may be pulsed synchronously so that pulses of electrical current are supplied to the two SOAs at the same frequency and with a particular temporal offset between the two sets of current pulses. The temporal offset between the two sets of current pulses may be approximately zero so that the current pulses are supplied at approximately the same time. Alternatively, the two sets of current pulses may have a particular nonzero temporal offset (e.g., a temporal offset of approximately 0.1 ns, 0.5 ns, 1 ns, 2 ns, or 5 ns). The output beams 125a and 125b may each include optical pulses that are combined by a polarization combiner 430 and temporally overlapped to produce an output beam 125 having higher energy optical pulses. For example, if the optical pulses from each of the synchronously pulsed SOAs have a pulse energy of 0.3 µJ, then the optical pulses may be combined spatially and overlapped in time to produce a combined output beam 125 with optical pulses having a pulse energy of approximately 0.6 µJ. The two optical pulses from each of the synchronously pulsed SOAs may have approximately the same pulse energy (e.g., 0.3 µJ for each pulse), or the two optical pulses may have different pulse energies. Optical pulses with different pulse energies may be produced by supplying current pulses with different amplitudes or durations to the two SOAs. The optical pulses in the combined output beam 125 may have any suitable polarization (e.g., linear, circular, or elliptical). The optical pulses in the output beam 125 may be set to a particular polarization state based on (i) the ratio of the energies of the two optical pulses that are combined or (ii) a temporal offset between the two optical pulses. For example, if the two optical pulses have approximately the same energies, then the output beam 125 may be linearly, circularly, or elliptically polarized, depending on the temporal offset between the two pulses. As another example, if the two optical pulses have different pulse energies, then the output beam 125 may be linearly or elliptically polarized, depending on the temporal offset between the two pulses.

Figure 11:
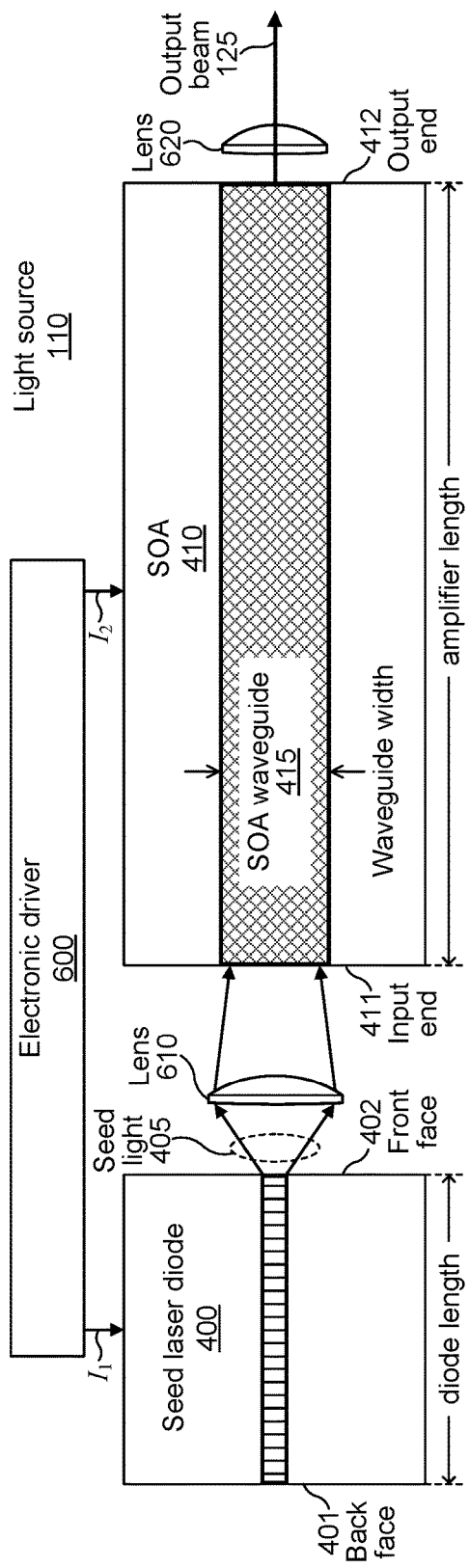
FIG. 11 illustrates an example light source in which the seed laser diode and the semiconductor optical amplifier (SOA) are separate devices.

FIG. 11 illustrates an example light source 110 in which the seed laser diode 400 and the semiconductor optical amplifier (SOA) 410 are separate devices. In particular embodiments, seed light 405 may be emitted by a seed laser diode 400 as a free-space optical beam, and a light source 110 may include one or more coupling lenses 610 that collect the free-space seed light 405 and couple the seed light 405 into a waveguide 415 of a SOA 410. In FIG. 11, the seed laser diode 400 and the SOA 410 are separate, discrete devices in which the seed laser diode and the SOA 410 are separated by a gap (instead of being integrated together with the front face 402 of the seed laser diode 400 joined or attached to the input end 411 of the SOA 410). The seed light 405 is emitted from the front face 402 of the seed laser diode 400 as a free-space optical beam. The coupling lens 610, located in the gap between the seed laser diode 400 and the SOA 410, collects the free-space seed light 405 and couples the seed light 405 into the SOA 410. The seed light 405 is coupled into the SOA 410 by focusing the seed light 405 onto the input end 411 and into the waveguide 415 of the SOA 410. The coupling lens 610 in FIG. 11 is a single lens that collects and focuses the seed light 405. Alternatively, a light source 110 may include two or more coupling lenses. For example, a light source 110 may include a first lens that collects and collimates the seed light 405 from the seed laser diode 400 and a second lens that focuses the collimated seed light 405 into the waveguide 415. In addition to a lens 610 located in the gap between the seed laser diode 400 and SOA 410, the light source 110 may also include a free-space optical isolator (not illustrated in FIG. 11) located in the gap. For example, an optical isolator may be located between two lenses (e.g., a collimating lens and a focusing lens) located in the gap. An optical isolator may block light (e.g., seed light 405 reflected from the input end 411 or ASE light emitted by the SOA 410) from propagating back to the seed laser diode 400.

Figure 12:
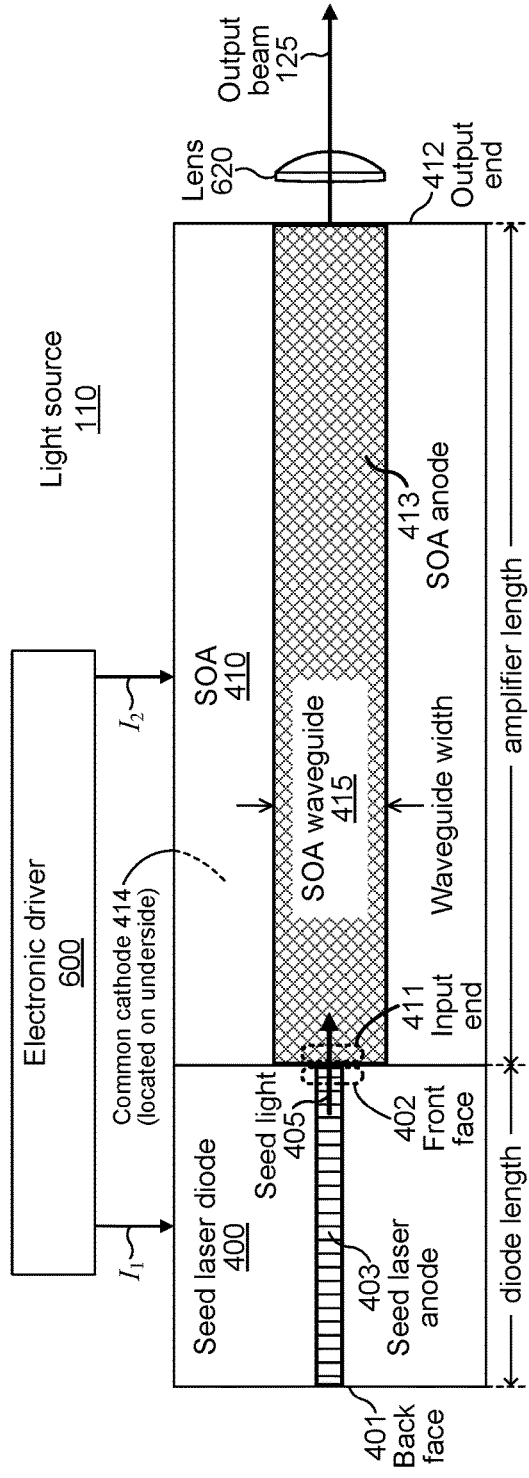
FIG. 12 illustrates an example light source in which the seed laser diode and the semiconductor optical amplifier (SOA) are integrated together.

FIG. 12 illustrates an example light source 110 in which the seed laser diode 400 and the semiconductor optical amplifier (SOA) 410 are integrated together. A seed laser diode 400 and a SOA 410 being integrated together may refer to the seed laser diode 400 and the SOA 410 being coupled together so that there is no air gap between the front face 402 of the seed laser diode 400 and the input end 411 of the SOA 410. An integrated seed laser diode 400 and SOA 410 may be directly coupled together (as illustrated in FIG. 12) or may be coupled together by a connecting waveguide (as described below). In FIG. 12, the front face 402 of the seed laser diode 400 may be directly coupled or attached to the input end 411 of the SOA 410 without a gap between the two devices. Rather than having a discrete facet formed by a semiconductor-air interface, the front face 402 of the seed laser diode 400 and the input end 411 of the SOA 410 may be directly connected together without a semiconductor-air interface. In particular embodiments, a light source 110 may include a seed laser diode 400 and a SOA 410 that are integrated together. The seed laser diode 400 may be directly connected to the SOA 410 so that the seed light 405 is directly coupled from the seed laser diode 400 into the waveguide 415 of the SOA 410 without traversing an air gap. For example, the front face 402 may be butt-coupled or affixed (e.g., using an optically transparent adhesive) to the input end 411. Alternatively, the seed laser diode 400 and the SOA 410 may be fabricated together so that there is no distinct or separate front face 402 and input end 411 (e.g., the front face 402 and the input end 411 may be merged together to form a single interface between the seed laser diode 400 and the SOA 410).

In particular embodiments, a light source 110 may include a connecting waveguide located between a seed laser diode 400 and a SOA 410. The connecting waveguide may be coupled to the front face 402 of the seed laser diode 400 and to the input end 411 of the SOA 410, and the connecting waveguide may convey seed light 405 from the front face 402 to the input end 411. A light source 110 in which the seed laser diode 400 and the SOA 410 are integrated together may include a connecting waveguide coupled to the front face 402 of the seed laser diode 400 and to the input end 411 of the SOA 410. A connecting waveguide may be a passive waveguide (e.g., a waveguide that does not provide optical gain) or a mode-matching waveguide (e.g., a waveguide with lateral dimensions that change so that the optical mode of the seed laser diode 400 is coupled to the optical mode of the SOA 410 with minimal optical loss). A connecting waveguide may be fabricated as a separate component that is attached to the seed laser diode 400 and the SOA 410, or a connecting waveguide may be fabricated together with the seed laser diode 400 and the SOA 410.

In particular embodiments, a light source 110 may include a seed laser diode 400 and a SOA 410 that are disposed on or in a single chip or substrate. A seed laser diode 400 and a SOA 410 being disposed on or in a single chip or substrate may refer to a seed laser diode 400 and a SOA 410 that are each fabricated separately and then attached to the same substrate (e.g., using epoxy or solder). Alternatively, a seed laser diode 400 and a SOA 410 that are disposed on or in a single chip or substrate may be fabricated together on the same substrate. For example, a seed laser diode 400 and SOA 410 may be fabricated on a substrate using semiconductor-fabrication processes, such as for example, lithography, thin-film deposition, or etching. The seed laser diode 400, the SOA 410, and the substrate together may be referred to as a chip in which the seed laser diode 400 and the SOA 410 are disposed. In particular embodiments, a substrate may be electrically or thermally conductive, and a substrate may have a coefficient of thermal expansion (CTE) that is approximately equal to the CTE of the seed laser 400 and the SOA 410. For example, a substrate may include indium phosphide (InP), and the seed laser diode 400 and the SOA 410 may each include InGaAs or InGaAsP semiconductor structures that are grown on the InP substrate. The InP substrate may be n-doped or p-doped so that it is electrically conductive, and a portion of the InP substrate may act as a common anode or a common cathode for the seed laser diode 400 and the SOA 410. In FIG. 12, the seed laser diode 400 includes a seed laser anode 403, and the SOA 410 includes a SOA anode 413. The seed laser anode 403 and the SOA anode 413 are located on the top surface of the seed-laser-SOA chip, and a common cathode 414 is located on the underside of the chip.

Figure 13:
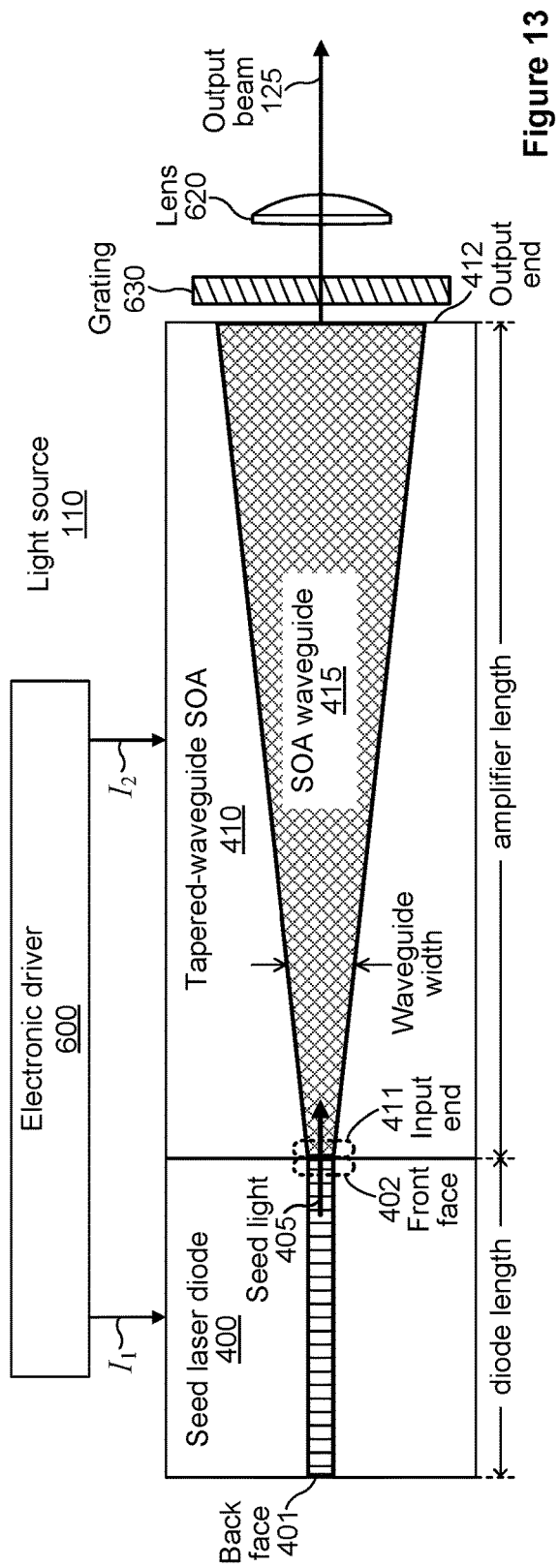
FIG. 13 illustrates an example light source where the semiconductor optical amplifier (SOA) includes a tapered waveguide.

FIG. 13 illustrates an example light source 110 where the semiconductor optical amplifier (SOA) 410 includes a tapered waveguide 415. In particular embodiments, a light source 110 may include a SOA 410 with (i) a waveguide 415 that has a substantially fixed width or (ii) a waveguide 415 with a tapered width. For example, the waveguide 415 in FIG. 11 or 12 may have a substantially fixed waveguide width of approximately 5 µm, 10 µm, 20 µm, 50 µm, 100 µm, 200 µm, 500 µm, or any other suitable width. The light source 110 in FIG. 13 includes a tapered-waveguide SOA 410 with a tapered optical waveguide 415, where the waveguide width increases uniformly from the input end 411 to the output end 412. For example, the width of the tapered waveguide 415 at the input end 411 may be approximately equal to the width of the waveguide of the seed laser diode 400 (e.g., the input end 411 may have a width of approximately 1 µm, 2 µm, 5 µm, 10 µm, or 50 µm). At the output end 412 of the SOA 410, the tapered waveguide 415 may have a width of approximately 50 µm, 100 µm, 200 µm, 500 µm, 1 mm, or any other suitable width. As another example, the width of the tapered waveguide 415 in FIG. 13 may increase in a uniform or linear manner from a width of approximately 20 µm at the input end 411 to a width of approximately 250 µm at the output end 412. For seed light 405 that is amplified while propagating along a tapered SOA waveguide 415, the size of the optical mode of the amplified seed light may increase uniformly as the width of the waveguide 415 increases. The uniform increase in the mode size of the amplified seed light may allow the amplified seed light to maintain a substantially single-mode transverse beam profile and minimize the amount of amplified seed light that propagates in unwanted higher-order transverse modes.

In particular embodiments, a SOA 410 may include an input end 411, an output end 412, and a waveguide 415 that extends from the input end 411 to the output end 412. Seed light 405 may be received at the input end 411 of the SOA 410 and coupled into the SOA waveguide 415. The received seed light 405 may be amplified by the SOA 410 as the seed light 405 propagates along the SOA waveguide 415 from the input end 411 to the output end 412, and the amplified seed light may be emitted from the output end 412. The optical amplification applied to the seed light 405 may be provided by the SOA electrical current $I_2$ supplied to the SOA 410. The SOA current $I_2$ may produce excited carriers (e.g., electrons or holes) in the waveguide 415 that provide optical gain to the seed light 405 through stimulated emission of photons. In particular embodiments, amplified seed light may be emitted from the output end 412 of a SOA 410 as a free-space output beam 125. In FIGS. 11-13, the amplified seed light is emitted from the output end 412 as a free-space beam, and the light source 110 includes an output lens 620 that collects and collimates the emitted light to produce a collimated free-space output beam 125. An output lens 620 may include a single lens, or an output lens 620 may be a lens assembly that includes two or more lenses (e.g., a fast-axis collimating lens and a slow-axis collimating lens). The free-space output beam 125 emitted from the output end 412 may be a multi-mode optical beam or an optical beam having a substantially single-mode transverse beam profile (e.g., a single-mode Gaussian shape along each of its two transverse axes).

In particular embodiments, a SOA waveguide 415 may refer to an optical waveguide formed at least in part by the semiconductor material of a SOA 410. A SOA 410 may include any suitable semiconductor material, such as for example, InP, InAs, InGaAs, InGaAsP, GaAs, AlGaAs, or any suitable combination thereof. The SOA waveguide 415 may include semiconductor material with a higher refractive index than the surrounding semiconductor material of the SOA so that the SOA waveguide confines and guides the seed light 405 that is coupled into the waveguide 415. A waveguide 415 may confine or guide seed light 405 along the two transverse directions while the seed light 405 propagates through the SOA 410. For example, the seed light 405 may be confined or guided based on (i) index guiding provided by a difference in refractive index between the waveguide 415 and surrounding material or (ii) gain guiding provided by optical gain (in the form of excited electrons or holes) located primarily within the waveguide 415.

A SOA waveguide 415 may be oriented substantially orthogonal to the input end 411 or the output end 412 of a SOA 410. In the example of FIG. 12, the input end 411 and output end 412 are parallel, and the longitudinal axis of the SOA waveguide 415 is orthogonal to the input end 411 and the output end 412. Alternatively, a SOA waveguide 415 may be angled with respect to the input end 411 or the output end 412. For example, the longitudinal axis of a SOA waveguide 415 may be angled off of orthogonal by approximately 1°, 2°, 5°, or any other suitable angular amount. As another example, a SOA waveguide 415 may be angled at 2° off of orthogonal with respect to the output end 412, corresponding to a waveguide that is oriented at 88° with respect to the output end 412. A SOA waveguide 415 that is angled with respect to the input end 411 or output end 412 may reduce or prevent destabilization or damage associated with back-reflected light. For example, if a SOA waveguide 415 is angled with respect to the output end 412, then amplified seed light that is reflected from the output end 412 may be directed back at an angle with respect to the waveguide 415. Most of the back-reflected light may be directed out of the SOA waveguide 415 instead of propagating back through the SOA waveguide 415 and possibly to the seed laser diode 400.

In particular embodiments, a light source 110 may include a seed laser diode 400 having any suitable diode length and a SOA 410 having any suitable amplifier length. For example, the seed laser diode 400 in FIG. 11, 12, or 13 may have a diode length of approximately 100 μm, 200 μm, 500 μm, 1 mm, or 2 mm. As another example, the SOA 410 in FIG. 11, 12, or 13 may have an amplifier length of approximately 1 mm, 2 mm, 3 mm, 5 mm, 10 mm, or 20 mm. As another example, in FIG. 13, the seed laser diode 400 may be a DFB laser with a diode length of approximately 300 μm, and the SOA 410 may have an amplifier length of approximately 4 mm.

In particular embodiments, a light source 110 may include an optical filter that transmits amplified seed light and substantially blocks light outside of the pass-band of the optical filter. For example, the light source 110 in FIG. 11, 12, or 13 may include an optical filter located at or after the output end 412 of the SOA 410. The optical filter (not illustrated in FIG. 11, 12, or 13) may be integrated with or attached to the output end 412 of the SOA 410. For example, an optical filter may be part of a dielectric coating deposited onto the output end 412, or an optical filter may be a separate optical element directly attached to the output end 412 with adhesive or epoxy. Alternatively, an optical filter may be a separate optical element positioned some distance from the output end 412 (e.g., the optical filter may be located approximately 0.1 mm, 0.5 mm, 1 mm, 2 mm, 5 mm, or any other suitable distance from the output end 412). An optical filter located at or after the output end 412 of a SOA 410 may transmit the amplified seed light and substantially block ASE light produced by the SOA 410. For example, the seed light 405 that is amplified by the SOA 410 may have a wavelength of approximately 1505 nm, and the SOA 410 may produce ASE light from approximately 1450 nm to approximately 1600 nm. The optical filter may transmit the 1505-nm amplified seed light and block most (e.g., greater than 80%) of the ASE light at wavelengths less than approximately 1500 nm and greater than 1510 nm.

In particular embodiments, a light source 110 may include an end cap directly coupled to the output end 412 of a SOA 410. The end cap may be a passive optical component configured to reduce the intensity of the amplified seed light before the amplified seed light is emitted as an output beam 125. An end cap may include a region of passive material that does not provide optical gain to the amplified seed light. An end cap may include a region of bulk material that does not include a waveguide structure, or an end cap may include a passive waveguide that allows the size of the optical mode of the amplified seed light to increase while propagating through the end cap. An end cap may include a separate optical component that is attached to the output end 412 of a SOA 410. For example, the end cap may include a piece of bulk transparent glass or semiconductor material that is attached (e.g., using adhesive or epoxy) to the output end 412. Alternatively, an end cap may be fabricated together with a SOA 410. For example, an end cap may include a region of semiconductor material similar to the material of the SOA 410, and the end cap and the SOA 410 may be fabricated during the same semiconductor fabrication process. An end cap may have any suitable length, such as for example, a length of approximately 0.2 mm, 0.5 mm, 1 mm, 2 mm, or 5 mm.

In particular embodiments, an end cap may (i) receive amplified seed light from the output end 412 of a SOA 410 and (ii) convey the amplified seed light through the end cap so that amplified seed light is emitted from the end cap with a reduced optical intensity. Due at least in part to the divergence of the optical mode of the amplified seed light, the size of the optical mode of the amplified seed light may increase (e.g., may spread out in a transverse direction) while propagating through the end cap. As a result, the intensity of the amplified seed light emitted from the end cap may be less than the intensity of the amplified seed light received from the SOA 410. Optical damage associated with light having a high optical intensity can occur at a semiconductor-air interface when the light is emitted from a semiconductor device. Coupling the output end 412 to an end cap and reducing the intensity of the amplified seed light before it is emitted may prevent the occurrence of optical damage at the output end 412 of the SOA 410 or at the output face of the end cap.

In particular embodiments, a light source 110 may include a SOA 410 with a grating 630 located at or near an output end 412 of the SOA 410. The grating 630 in FIG. 13 may be a diffraction grating, a Bragg grating, a volume holographic grating, or any other suitable grating. The grating 630 may be integrated with or attached to the output end 412 of the SOA 410. For example, the grating 630 may be part of a dielectric coating deposited onto the output end 412, or the grating 630 may be a separate optical element directly attached to the output end 412 with adhesive or epoxy. Alternatively, the grating 630 may be a separate optical element positioned some distance from the output end 412 (e.g., the grating 630 may be located approximately 0.1 mm, 0.5 mm, 1 mm, 2 mm, 5 mm, or any other suitable distance from the output end 412).

A grating 630 may be configured to transmit a fundamental optical mode emitted from the output end 412 of a SOA 410 and angularly deflect one or more higher-order transverse optical modes emitted from the SOA 410. The fundamental optical mode may have a substantially single-mode Gaussian shape along each of its two transverse axes, and the higher-order transverse optical modes may have a multi-mode shape along one or both of the transverse axes. The amplified light produced at the output end 412 of a SOA 410 may include single-transverse-mode light along with multi-mode light. The grating 630 may transmit the single-mode light with little or no angular deflection so that the single-mode light passes straight through the grating 630. The multi-mode light may be angularly deflected at some angle (e.g., at an angle of approximately 1°, 5°, 10°, or any other suitable angle) with respect to the single-mode light. Deflecting the multi-mode light away from the single-mode light may allow the multi-mode light to be removed or spatially filtered from the output beam 125 produced by the SOA 410 so that the output beam 125 is a free-space optical beam with a substantially single-mode transverse beam profile.

Figure 14:
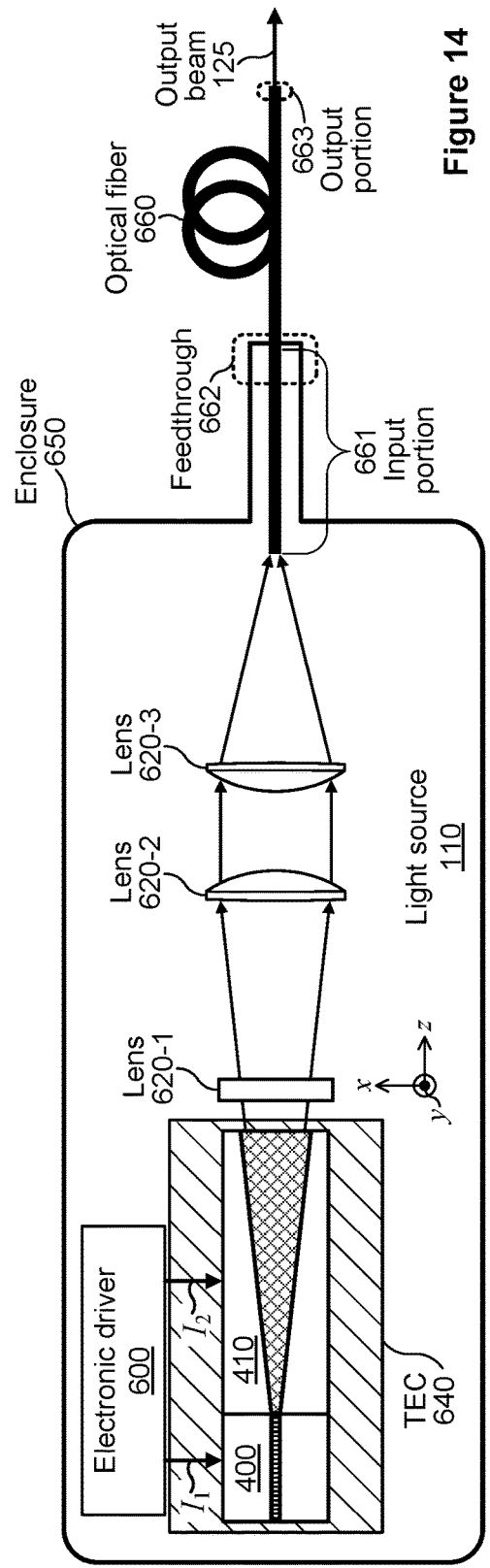
FIG. 14 illustrates an example light source where the seed laser diode and the semiconductor optical amplifier (SOA) are located within an enclosure.

FIG. 14 illustrates an example light source 110 where the seed laser diode 400 and the semiconductor optical amplifier (SOA) 410 are located within an enclosure 650. In particular embodiments, all or part of a light source 110 may be located within an enclosure 650. For example, an enclosure 650 may contain a seed laser diode 400, a SOA 410, and an electronic driver 600. Additionally, an enclosure 650 may contain a thermoelectric cooler 640 (TEC), one or more lenses 620, or an input portion 661 of an optical fiber 660. In FIG. 14, the enclosure 650 contains the following light-source components: seed laser diode 400; SOA 410; electronic driver 600; lenses 620-1, 620-2, and 620-3; and input portion 661 of optical fiber 660. An enclosure 650 may be made from metal, plastic, glass, ceramic, or any other suitable material, or any combination thereof. For example, the enclosure 650 in FIG. 14 may be made from a thermally conductive material (e.g., aluminum or copper) and may be thermally coupled to a heat sink that dissipates heat received from the TEC 640.

In particular embodiments, an enclosure 650 may be a closed, sealed, airtight, or watertight container that prevents water vapor, liquid water, dirt, dust, or other contaminants from getting inside the enclosure 650. For example, an enclosure 650 may be closed to prevent dust from entering the enclosure. A closed enclosure 650 may prevent damage to the output end 412 of a SOA 410 caused by dust landing on the output end 412 and being burned when light is emitted from the output end 412. An enclosure 650 being closed may refer to the enclosure 650 having a maximum opening or gap size below a particular value (e.g., the maximum gap between parts of an enclosure may be less than or equal to approximately 200 µm, 100 µm, 20 µm, 5 µm, or 1 µm). As another example, an enclosure 650 may be sealed to prevent water vapor from entering the enclosure. A sealed enclosure 650 may prevent an optical surface (e.g., output end 412) inside the enclosure 650 from being damaged or degraded by water vapor condensing on the optical surface when the temperature of the enclosure 650 drops. In FIG. 14, the input portion 661 of the optical fiber 660 may be contained within the enclosure 650, and the input portion 661 may enter the enclosure 650 via a feedthrough 662 in the enclosure 650. For example, the feedthrough 662 may be closed or sealed using an O-ring or epoxy that surrounds the input portion 661 or holds the input portion 661 in place. The enclosure 650 may include one or more additional feedthroughs (not illustrated in FIG. 14) that allow electrical wire or cables to enter the enclosure 650 (e.g., cables to provide power or trigger signals for the electronic driver 600 or power for the TEC 640).

In particular embodiments, a light source 110 may include a TEC 640 that is thermally coupled to the seed laser diode 400 and the SOA 410. In FIG. 14, the TEC 640 may be used to stabilize a temperature associated with the seed laser diode 400 or the SOA 410. For example, the TEC 640 may be used to maintain the temperature of the seed laser diode 400 or the SOA 410 at a particular temperature setpoint (e.g., 25° C.) or within a particular temperature range (e.g., between 10° C. and 40° C.). Additionally or alternatively, the TEC 640 in FIG. 14 may be used to remove heat produced by the seed laser diode 400 or the SOA 410. For example, the SOA 410 may generate heat during operation, and the TEC may be used to draw at least some of this excess heat away from the light source 110 to prevent the temperature of the seed laser diode 400 or the SOA 410 from increasing beyond a safe operating range. In FIG. 14, the TEC 640 may be located within the enclosure 650, and the seed laser diode 400 and the SOA 410 may be attached to a thermally conductive substrate (e.g., a connection board 601) that is attached to the TEC 640. Alternatively, a TEC

640 may be located outside an enclosure 650, and heat produced by the SOA 410 may flow through the enclosure 650 and to the TEC 640. In particular embodiments, a light source 110 may include a TEC 640 that is thermally coupled to an electronic driver 600. An electronic driver 600 may generate heat during operation, and the TEC 640 may draw the heat away from the electronic driver 600 to prevent the driver temperature from increasing beyond a safe operating range. For example, a TEC 640 may be thermally coupled to a seed laser diode 400, a SOA 410, and an electronic driver 600, and the TEC 640 may be configured to stabilize a temperature of or remove heat produced by one or more of the seed laser diode 400, the SOA 410, and the electronic driver 600.

In particular embodiments, a light source 110 may include the following components: a seed laser diode 400; a SOA 410; an electronic driver 600 that supplies seed current $I_1$ to the seed laser diode 400 and SOA current $I_2$ to the SOA 410; an input portion 661 of an optical fiber 660; and one or more output lenses 620 that couple amplified seed light from the SOA 410 into the optical fiber 660 via the input portion 661. Additionally, a light source 110 may include a TEC 640 that is thermally coupled to the seed laser diode 400, SOA 410, or electronic driver 600. As illustrated in FIG. 14, the seed laser diode 400, SOA 410, electronic driver 600, input portion 661, and output lenses 620 may be disposed within an enclosure 650. In FIG. 14, the amplified seed light is emitted from the SOA 410 and propagates along the z-axis toward the input portion 661. Lens 620-1 may be a fast-axis collimating lens that collimates the amplified seed light along the y-axis, and lens 620-2 may be a slow-axis collimating lens that collimates the amplified seed light along the x-axis. Lens 630-3 may focus the collimated light so that it is coupled into the optical fiber 660 via an end face of the input portion 661. The optical fiber may be a single-mode optical fiber or a multi-mode optical fiber. The optical fiber 660 may include an output portion 663 located at the opposite end of the optical fiber 660 from the input portion 661. The output portion 663 of the optical fiber 660 may be terminated by a lens (e.g., an output collimator) that produces a collimated free-space output beam 125 which may be directed to a scanner 120. Alternatively, the output portion 663 of the optical fiber 660 may be coupled to a fiber-optic amplifier 500. The fiber-optic amplifier 500 may receive the amplified seed light from the optical fiber 660, further amplify the amplified seed light, and then produce a free-space output beam 125 that may be directed to a scanner 120.

In particular embodiments, a light source 110 may include the following components: a seed laser diode 400; a SOA 410; an electronic driver 600 that supplies seed current $I_1$ to the seed laser diode 400 and SOA current $I_2$ to the SOA 410; and one or more output lenses 620 that collect the amplified seed light and produce a collimated free-space output beam 125. Additionally, a light source 110 may include a TEC 640 that is thermally coupled to the seed laser diode 400, SOA 410, or electronic driver 600. Rather than coupling the amplified seed light into an optical fiber (as illustrated in FIG. 14), the amplified seed light may be collimated and emitted as a free-space output beam 125. The output lenses 620 may be referred to as collimating lenses, and the collimated free-space output beam 125 may be directed to a scanner 120. An output lens 620 may include one lens (e.g., a single lens that collects and collimates the amplified seed light), two lenses (e.g., a fast-axis collimating lens and a slow-axis collimating lens), three lenses, or any other suitable number of lenses. The seed laser diode 400, SOA 410, electronic driver 600, and output lenses 620 may be disposed within an enclosure 650.

In particular embodiments, an output lens 620 may (i) collect amplified seed light emitted by a SOA 410 and focus the amplified seed light into an optical fiber 660 or (ii) collect amplified seed light emitted by a SOA 410 and collimate the amplified seed light to produce a collimated free-space output beam 125. An output lens 620 may include a single lens, two lenses, three lenses (as illustrated in FIG. 14), or any other suitable number of lenses. An output lens 620 may be designed to optimize the performance of the lens 620 (e.g., by producing a free-space output beam with particular beam properties or by maximizing the amount of amplified seed light coupled into an optical fiber 660). An output-lens design may include the number, location, type (e.g., spherical lens or aspheric lens), material, or focal length of the one or more lenses that are part of the output lens 620. The design of an output lens 620 may be based on the optical properties (e.g., divergence or astigmatism) of the amplified seed light emitted from a SOA 410. However, the divergence or astigmatism of the amplified seed light emitted from a SOA 410 may vary depending on the amplitude and duration of the pulses of current $I_2$ supplied to the SOA 410. In a conventional design, an output lens 620 may be designed for optimal performance when the SOA 410 is used in anon-standard operating mode (e.g., when the SOA 410 is provided with DC current that provides CW amplification of seed light 405). An improved design for an output lens 620 may result when the lens performance is optimized for particular optical properties of the amplified seed light that occur when the SOA 410 is under normal operation. For example, an output lens 620 may be designed based on the optical properties of the amplified seed light that is emitted when the SOA 410 is provided with pulses of current having a particular amplitude and duration corresponding to normal operation of the SOA 410.

Figure 15:
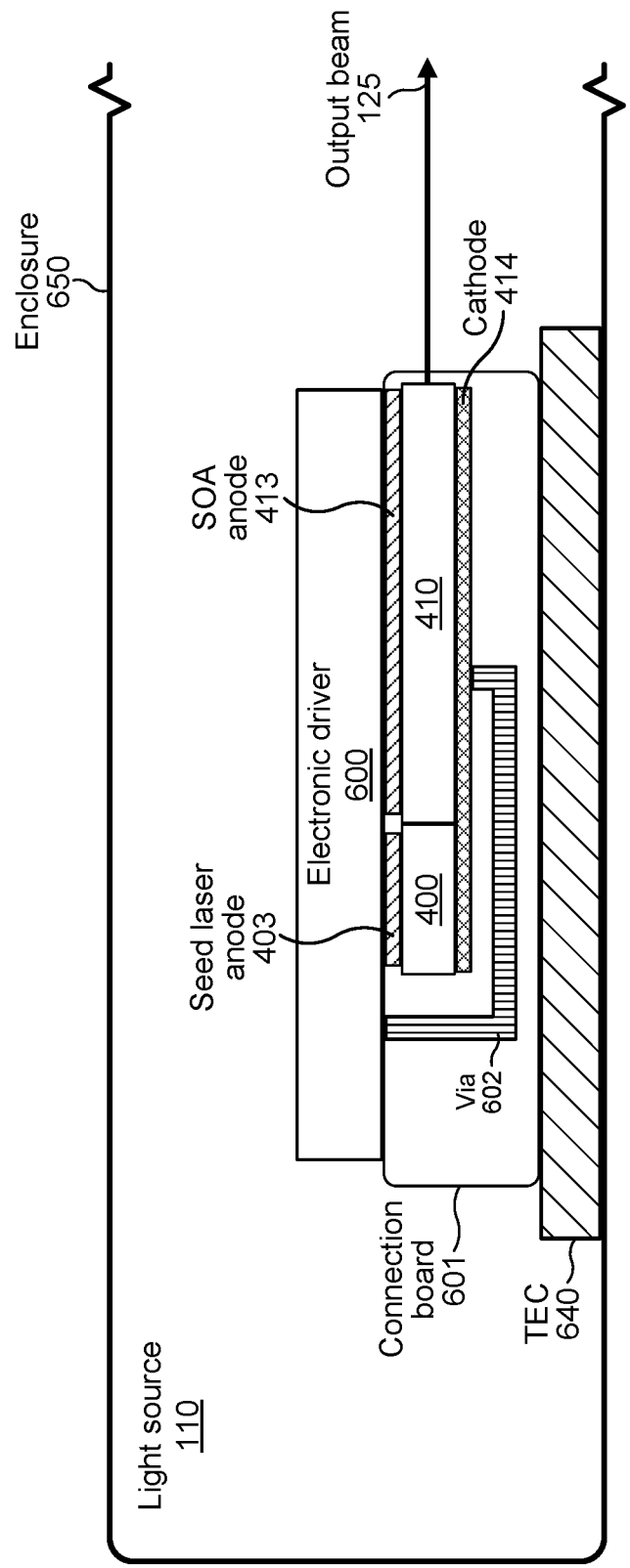
FIG. 15 illustrates a side-view of a portion of an example light source located within an enclosure.

FIG. 15 illustrates a side-view of a portion of an example light source 110 located within an enclosure 650. The light source 110 in FIG. 15 includes the following components contained within the enclosure 650: a seed laser diode 400, a SOA 410, an electronic driver 600, a connection board 601, and a TEC 640. The output beam 125 may include amplified seed light that is emitted by the SOA 410 and directed to one or more output lenses 620 (not illustrated in FIG. 15). Packaging the electronic driver 600 in the same enclosure 650 and in close proximity to the seed laser diode 400 and the SOA 410 may provide low-inductance electrical connections between the electronic driver 600 and each of the seed laser diode 400 and the SOA 410. The low-inductance electrical connection to the SOA 410 may allow the electronic driver 600 to provide pulses of SOA current $I_2$ to the SOA 410 having a relatively large amplitude and a relatively short duration. For example, the electronic driver 600 may supply pulses of SOA current $I_2$ having a pulse amplitude of approximately 25 A and a pulse duration of approximately 4 ns. As another example, the electronic driver 600 may supply pulses of SOA current $I_2$ having a pulse amplitude of approximately 500 A and a pulse duration of approximately 8 ns.

In particular embodiments, an electronic driver 600 may be directly coupled to a seed laser diode 400 or a SOA 410. For example, an electronic driver 600 may be directly connected to an anode or a cathode of a SOA 410. A direct connection may refer to an electrical connection that (i) provides a relatively low electrical inductance or capacitance or (ii) has a relatively short length. A direct electrical connection may be provided by one or more solder bumps, one or more vias 602, or a combination of one or more solder bumps and one or more vias 602. For example, in FIG. 15, the SOA anode 413 may be directly connected to the electronic driver 600 by one or more solder bumps. Additionally, the seed laser anode 403 may be directly connected to the electronic driver 600 by one or more solder bumps. A solder bump may refer to a small ball of solder that is attached to a surface to form a "bump" of solder, and an electrical connection may be made by a process of "bump bonding." For example, a solder bump may be attached to a solder pad on the electronic driver 600, and the electronic driver 600 may be positioned so the solder bump is in contact with the SOA anode 413. The electronic driver 600 and the SOA 410 may then be "bump bonded" (or, soldered) together by heating to allow the solder bump to reflow and then form an electrical connection between the electronic driver 600 and the SOA anode 413. A bump-bonded connection may form a direct electrical connection having a relatively low inductance or capacitance.

In FIG. 15, the seed laser anode 403 and the SOA anode 413 are each directly connected to the electronic driver 600. For example, the electronic driver 600 may be electrically and mechanically connected to the SOA anode 413 by one or more bump bonds. Additionally, the electronic driver 600 may be electrically and mechanically connected to the seed laser anode 403 by one or more bump bonds. The seed laser diode 400 and the SOA 410 have a common cathode 414 that is electrically connected to the electronic driver 600 by the via 602. The via 602 may include an electrically conductive material that provides a low-inductance, electrically conductive path through the connection board 601 from the electronic driver 600 to the cathode 414. For example, the electronic driver 600 may be bump bonded to one end of the via 602, and the cathode 414 may be bump bonded to the other end of the via 602.

In particular embodiments, an electronic driver 600 may supply SOA current $I_2$ to a SOA 410 by (i) a first low-inductance electrical connection between the electronic driver 600 and the SOA anode 413 and (ii) a second low-inductance electrical connection between the electronic driver 600 and a SOA cathode (e.g., common cathode 414). Supplying the SOA current $I_2$ by the first and second electrical connections may include supplying a pulse of current to the SOA anode 413, where the common cathode 414 acts as an electrical return for the pulse of current. The first and second low-inductance electrical connections may each include one or more bump bonds, one or more vias 602, or a combination of one or more bump bonds and one or more vias 602. In FIG. 15, the low-inductance electrical connection between the electronic driver 600 and the SOA anode 413 may be provided by one or more bump bonds. Additionally, the low-inductance electrical connection between the electronic driver 600 and the cathode 414 may be provided by via 602, one or more solder bumps that connect one end of the via 602 to the electronic driver 600, and one or more solder bumps that connect the other end of the via 602 to the cathode 414. The low-inductance electrical connection between the electronic driver 600 and the SOA anode 413 may have an inductance of less than or equal to 10 nanohenries (nH), 5 nH, 2 nH, 1 nH, 500 picohenries (pH), or 250 pH. Similarly, the low-inductance electrical connection between the electronic driver 600 and the cathode 414 may have an inductance of less than or equal to 10 nH, 5 nH, 2 nH, 1 nH, 500 pH, or 250 pH.

In particular embodiments, the low inductance of an electrical connection between an electronic driver 600 and an anode or cathode of a SOA 410 may be provided at least in part by the relatively short length of the electrical connection. For example, an electronic driver 600 may be located in close proximity to a SOA 410, which allows a bump-bond connection with a length of less than 1 mm, 0.5 mm, 0.1 mm, 50 μm, 20 μm, or 10 μm. In FIG. 15, the electronic driver 600 may be directly attached to the seed laser diode 400 and the SOA 410 with bump bonds, which provide a relatively short length for the low-inductance connections to the seed laser anode 403 and the SOA anode 413. Additionally, the via 602 in FIG. 15 that connects the electronic driver 600 to the cathode 414 may provide a low-inductance electrical connection having a length of less than 20 mm, 10 mm, 5 mm, 2 mm, or 1 mm.

In particular embodiments, an electronic driver 600 may include a capacitor and a switch for supplying pulses of current $I_2$ to a SOA 410. The electronic driver 600 may charge up the capacitor with the switch open, and then the electronic driver 600 may close the switch to discharge a pulse of current through the SOA 410. Due at least in part to the low inductance of the connection between the electronic driver 600 and the SOA 410, the pulse of current may have a relatively large amplitude and a relatively short duration. For example, the pulse of SOA current $I_2$ supplied to the SOA 410 may have a peak current of approximately 1 A, 2 A, 5 A, 10 A, 20 A, 50 A, 100 A, 200 A, 500 A, or 1,000 A. Additionally, the pulse of SOA current $I_2$ may have a duration of approximately 0.5 ns, 1 ns, 2 ns, 5 ns, 10 ns, 20 ns, 50 ns, or 100 ns.

In FIG. 15, the seed laser anode 403 and the SOA anode 413 are located on the top surface of the seed-laser-SOA chip, and the seed laser diode 400 and the SOA 410 have a common cathode 414 located on the underside of the chip. A common cathode 414 may refer to an electrically conductive contact that is electrically connected to a cathode of the seed laser diode 400 and a cathode of the SOA 410. The common cathode 414 indicates that the cathode of the seed laser diode 400 and the cathode of the SOA 410 are electrically connected together. In particular embodiments, a seed laser diode 400 and a SOA 410 may be configured as a three-terminal device or a four-terminal device. The seed laser diode 400 and SOA 410 in FIG. 15 represent a three-terminal device with three electrical connections between the electronic driver 600 and the following three terminals: (i) seed laser anode 403, (ii) SOA anode 413, and (iii) common cathode 414. Alternatively, a three-terminal device may be configured with a seed laser cathode, a SOA cathode, and a common anode. In the three-terminal device in FIG. 15, the seed laser anode 403 and the SOA anode 413 may be electrically isolated from one another, and the electronic driver 600 may drive the seed laser diode 400 and the SOA 410 by supplying separate signals to the seed laser anode 403 and the SOA anode 413. A seed laser diode 400 and a SOA 410 may be configured as a four-terminal device with two separate anodes (e.g., seed laser anode 403 and SOA anode 413) and two separate cathodes (e.g., a seed laser cathode and a SOA cathode). In a four-terminal device, the seed laser anode 403 and the SOA anode 413 may be electrically isolated from one another. Additionally, instead of having a common cathode, a four-terminal device may have a seed laser cathode and a SOA cathode that are electrically isolated from one another. The electronic driver 600 may drive the anodes and the cathodes of each of the two devices separately.

In particular embodiments, a connection board 601 may include one or more vias 602 and may provide mechanical support for a seed laser diode 400, SOA 410, or electronic driver 600. For example, the seed laser diode 400, the SOA 410, or the electronic driver 600 in FIG. 15 may be attached to the connection board 601 (e.g., by epoxy or solder), and the underside of the connection board 601 may be attached to the top surface of the TEC 640 (e.g., by thermally conductive epoxy). A connection board 601 may be made from a thermally conductive and electrically insulating material, such as for example a ceramic material (e.g., alumina) or a glass epoxy material (e.g., a fiber-reinforced plastic, such as FR-4). For example, a connection board 601 may be made from a thermally conductive, electrically insulating ceramic material that provides a thermal path for heat to flow to the TEC 640 from the seed laser diode 400, the SOA 410, or the electronic driver 600.

In particular embodiments, an electronic driver 600 may supply SOA current $I_2$ to a SOA 410, where the SOA current $I_2$ includes pulses of current. Each pulse of SOA current $I_2$ may amplify a portion of seed light 405 (e.g., an optical pulse of seed light 405 or a temporal portion of CW seed light 405) and may result in an optical pulse being emitted by the SOA 410. The SOA 410 may be configured to optically absorb light that is present in the SOA waveguide 415 during a time period between two successive pulses of current. For example, seed light 405 that is present in the SOA waveguide 415 between two pulses of current may be substantially absorbed by the semiconductor material of the SOA 410. The process of optical absorption of the seed light 405 may include photons of the seed light 405 being absorbed by electrons located in the semiconductor structure of the SOA waveguide 415. Having light absorbed in the SOA 410 between successive pulses of current may prevent unwanted light (e.g., ASE light from the seed laser diode 400) from leaking out of the SOA 460 and propagating through the rest of the lidar system 100. When there is no electrical current supplied to a SOA 410 (e.g., during the time period between successive pulses of current), there may be no optical gain provided by the SOA 410, and the SOA waveguide 415 may have an optical absorption of greater than or equal to approximately 10 dB, 20 dB, 30 dB, 40 dB, or any other suitable amount of optical absorption. For example, when no electrical current is supplied to a SOA 410, the SOA 410 may have an optical absorption of greater than or equal to 20 dB at the seed-light wavelength. If 1 mW of seed light 405 is coupled into the SOA waveguide 415 between successive pulses of current, then an optical absorption of >20 dB may result in less than or equal to 10 ρW of seed light 405 being emitted from the output end 412 of the SOA 410 as unwanted leakage light.

In particular embodiments, an electronic driver 600 may electrically couple the SOA anode 413 to the SOA cathode 414 during a period of time between two successive pulses of current. For example, for most or all of the time period T between two successive pulses of current, the electronic driver 600 may electrically couple the anode 413 and cathode 414 of a SOA 410. Electrically coupling the SOA anode 413 and cathode 414 may include electrically shorting the anode directly to the cathode or electrically coupling the anode and cathode through a particular electrical resistance (e.g., a resistance of approximately 1 Ω, 10Ω, or 100Ω). Alternatively, electrically coupling the SOA anode 413 and cathode 414 may include applying a reverse-bias voltage (e.g., approximately −1 V, −5 V, or −10 V) to the anode with respect to the cathode, where the reverse-bias voltage has a polarity that is opposite the forward-bias polarity associated with the pulses of SOA current $I_2$ supplied to the SOA 410.

In particular embodiments, electrically coupling the SOA anode 413 to the SOA cathode 414 may result in an increase in the optical absorption of the SOA 410. For example, the optical absorption of a SOA 410 when the SOA anode 413 and cathode 414 are electrically coupled may be increased (compared to the anode and cathode not being electrically coupled) by approximately 3 dB, 5 dB, 10 dB, 15 dB, or 20 dB. The optical absorption of the SOA 410 when the SOA anode 413 and cathode 414 are electrically coupled may be greater than or equal to approximately 20 dB, 30 dB, 40 dB, or 50 dB. For example, the optical absorption of a SOA 410 when the SOA current $I_2$ is zero and the anode and cathode are not electrically coupled may be greater than or equal to 20 dB. When the anode and cathode are electrically shorted together, the optical absorption may increase by 10 dB to greater than or equal to 30 dB. If the optical absorption of the SOA 410 is greater than or equal to 30 dB, then less than or equal to 0.1% of the seed light 405 that is coupled into the input end 411 of the SOA waveguide 415 may be emitted from the output end 412 as unwanted leakage light. For example, if 1 mW of seed light 405 is coupled into the SOA waveguide 415 between successive pulses of current, then an optical absorption of >30 dB may result in less than or equal to 1 μW of seed light 405 being emitted from the output end 412 of the SOA 410 as unwanted leakage light.

In particular embodiments, a SOA 410 that optically absorbs light (e.g., seed light 405) during a time period between two successive pulses of current may result in optical pulses emitted by the SOA 410 having a temporal extinction ratio (TER) greater than or equal to 40 dB. The TER associated with optical pulses may be determined from the expression TER=10 log($P_{MAX}/P_{MIN}$), where $P_{MAX}$ represents a maximum power at the peak of an optical pulse, and $P_{MIN}$ represents a minimum power during the time period between the emitted optical pulses. Electrically coupling the SOA anode 413 to the SOA cathode 414 between pulses of current may result in a reduced value for $P_{MIN}$ (due to the increased absorption associated with coupling the anode to the cathode), which corresponds to an increase in the TER. The TER of optical pulses emitted as an output beam 125 by a SOA 410 may be greater than or equal to approximately 40 dB, 50 dB, or 60 dB. For example, an emitted optical pulse may have a peak power of 20 W, and the optical power during the time between emitted optical pulses may be 0.2 mW, which corresponds to a TER of 50 dB. A lidar system 100 that emits optical pulses having a relatively high TER may exhibit improved performance, since there may be less noise caused by unwanted leakage light present during time periods between successive optical pulses. For example, ASE light emitted by the seed laser diode 400 between successive optical pulses may be substantially absorbed by the SOA 410.

FIGS. 16 and 17 each illustrate example electrical currents ($I_1$ and $I_2$) supplied to a seed laser diode 400 and a SOA 410 and the corresponding light ($L_1$ and $L_2$) produced by the seed laser diode 400 and the SOA 410. Each of the parameters ($I_1$, $I_2$, $L_1$, and $L_2$) in FIGS. 16 and 17 is plotted versus time. The graph of seed-laser light $L_1$ may correspond to the power of the seed light 405 produced by the seed laser diode 400, plotted versus time. Similarly, the graph of SOA light $L_2$ may correspond to the power of the amplified seed light emitted by the SOA 410, plotted versus time.

In FIG. 16, the seed current $I_1$ includes pulses of current and a substantially constant DC bias current $I_{DC}$. The pulses of electrical current supplied to the seed laser diode 400 may have any suitable amplitude, such as for example, an amplitude of approximately 10 mA, 100 mA, 200 mA, 500 mA, 1 A, or 2 A. The pulses of electrical current supplied to the seed laser diode 400 may have any suitable duration, such as for example, a duration of approximately 0.5 ns, 1 ns, 2 ns, 5 ns, 10 ns, 20 ns, 50 ns, or 100 ns. The optical pulses produced by the seed laser diode 400 may have any suitable duration, such as for example, a duration of approximately 0.5 ns, 1 ns, 2 ns, 5 ns, 10 ns, 20 ns, 50 ns, or 100 ns. The seed light $L_1$ in FIG. 16 includes optical pulses, where each seed optical pulse is produced by a corresponding pulse of current supplied to the seed laser 400. The seed light $L_1$ may be sent to a SOA 410 for amplification. The DC bias current $I_{DC}$ may be zero (so that the seed current $I_1$ only includes pulses of current), or the DC bias current $I_{DC}$ may be any suitable nonzero DC current, such as for example, 1 mA, 10 mA, 100 mA, 200 mA, or 500 mA. The DC bias current $I_{DC}$ may have a value that is below a threshold current for lasing or below a threshold current for emission of a particular amount of ASE light by the seed laser 400. For example, the DC current $I_{DC}$ may result in the emission by the seed laser 400 of ASE light with an average optical power less than or equal to 100 μW, 10 μW, 1 μW, 0.1 μW, or zero watts.

In FIG. 17, the seed current $I_1$ supplied to the seed laser 400 includes a substantially constant DC bias current $I_{DC}$ and no pulses of current. The DC current $I_{DC}$ may be any suitable DC current, such as for example, 10 mA, 100 mA, 200 mA, 500 mA, or 1 A. The seed light $L_1$ in FIG. 17 may include CW light or light having a substantially constant optical power. The seed light $L_1$ may be sent to a SOA 410 which amplifies temporal portions of the seed light to produce optical pulses.

In each of FIGS. 16 and 17, the SOA current $I_2$ supplied to the SOA 410 includes pulses of current and a substantially constant DC current $I_{MIN}$. The pulses of electrical current supplied to the SOA 410 may have any suitable amplitude, such as for example, an amplitude of approximately 1 A, 2 A, 5 A, 10 A, 20 A, 50 A, 100 A, 200 A, 500 A, or 1,000 A. The pulses of electrical current supplied to the SOA 410 may have any suitable duration, such as for example, a duration of approximately 0.5 ns, 1 ns, 2 ns, 5 ns, 10 ns, 20 ns, 50 ns, or 100 ns. The optical pulses emitted by the SOA 410 as SOA light $L_2$ may have any suitable duration, such as for example, a duration of approximately 0.5 ns, 1 ns, 2 ns, 5 ns, 10 ns, 20 ns, 50 ns, or 100 ns. The DC bias current $I_{MIN}$ may be zero (so that the SOA current $I_2$ only includes pulses of current), or the DC bias current $I_{MIN}$ may be any suitable nonzero DC current, such as for example, 1 mA, 10 mA, 100 mA, 200 mA, or 500 mA.

In FIG. 16, each pulse of current supplied to the seed laser diode 400 causes the seed laser diode to produce a corresponding seed optical pulse. Each pulse of SOA current $I_2$ supplied to the SOA 410 may amplify a corresponding seed optical pulse to produce an emitted optical pulse. In particular embodiments, an electronic driver 600 may supply the seed-laser current pulses $I_1$ and the SOA current pulses $I_2$ synchronously so that the frequency of the seed-laser current pulses is approximately equal to the frequency of the SOA current pulses. In FIG. 16, the seed-laser pulses $I_1$ have the same frequency as the SOA pulses $I_2$, and this frequency may equal the pulse repetition frequency of the emitted pulses of light. For example, the seed-laser pulses $I_1$, the SOA pulses $I_2$, and the emitted pulses of light may have approximately the same frequency, such as for example, a frequency of approximately 100 kHz, 200 kHz, 500 kHz, 750 kHz, 1 MHz, 2 MHz, 5 MHz, 10 MHz, or any other suitable frequency. As another example, the electronic driver 600 may supply seed-laser current pulses $I_1$ and SOA current pulses $I_2$ at a frequency of approximately 650 kHz, and the optical pulses emitted by the SOA 410 may have a pulse repetition frequency of approximately 650 kHz (which corresponds to a pulse period T of approximately 1.54 μs).

In particular embodiments, the SOA current $I_2$ supplied to the SOA 410 may include (i) a nonzero DC bias current $I_{MIN}$ and (ii) pulses of current. The pulses of SOA current $I_2$ may provide optical amplification in the SOA 410 for the seed light 405, and each pulse of SOA current $I_2$ may result in the emission of an optical pulse by the SOA 410. The DC bias current $I_{MIN}$ may be a substantially constant, nonzero DC current. The DC bias current $I_{MIN}$ may have a value that is less than or equal to a threshold current at which the SOA 410 produces a particular amount of ASE light. For example, the DC current $I_{MIN}$ may be less than or equal to a threshold current at which the SOA 410 produces an output beam 125 with ASE light having an average optical power of approximately 1 mW, 100 μW, 10 μW, 1 μW, 0.1 μW, or zero watts. As another example, the DC current $I_{MIN}$ may be approximately 10 mA, and the SOA 410 may emit little or no detectable ASE light at this current (e.g., the SOA 410 may emit approximately zero watts of ASE light when supplied with 10 mA of current). As another example, the DC current $I_{MIN}$ may be approximately 100 mA, and the SOA 410 may emit approximately 10 μW of ASE light at this current. In particular embodiments, applying a nonzero DC bias current $I_{MIN}$ to a SOA 410 may result in the SOA 410 emitting optical pulses having a higher pulse energy (as compared to a SOA 410 with no bias current applied). A nonzero DC bias current $I_{MIN}$ may improve the efficiency of the SOA 410, allowing the emission of higher-energy optical pulses. For example, the nonzero DC bias current $I_{MIN}$ may allow a pulse of current to more rapidly overcome the optical loss of the SOA 410 (as compared to a SOA 410 with no bias current), which may result in an emitted optical pulse with higher pulse energy.

In FIG. 17, the seed-laser current $I_1$ supplied to the seed laser 400 includes a DC bias current $I_{DC}$ and no pulses of current, and the seed-laser light $L_1$ produced by the seed laser 400 includes CW light or light having a substantially constant optical power. Additionally, in FIG. 17, the SOA current $I_2$ supplied to the SOA 410 includes pulses of current, and each pulse of SOA current $I_2$ amplifies a portion of the seed-laser light $L_1$ to produce an optical pulse emitted by the SOA 410. For example, each pulse of SOA current $I_2$ may amplify a temporal portion of the seed-laser light $L_1$, where a temporal portion of the seed-laser light $L_1$ refers to a portion of the seed light located within a particular interval of time over which the pulse of SOA current is applied to the SOA 410. As another example, if the SOA current $I_2$ includes 20-A current pulses with a 6-ns duration, then for each current pulse, a corresponding 6-ns temporal portion of the seed light $L_1$ may be amplified, which may result in the emission of a pulse of light with a duration of approximately 6 ns.

Figure 18:
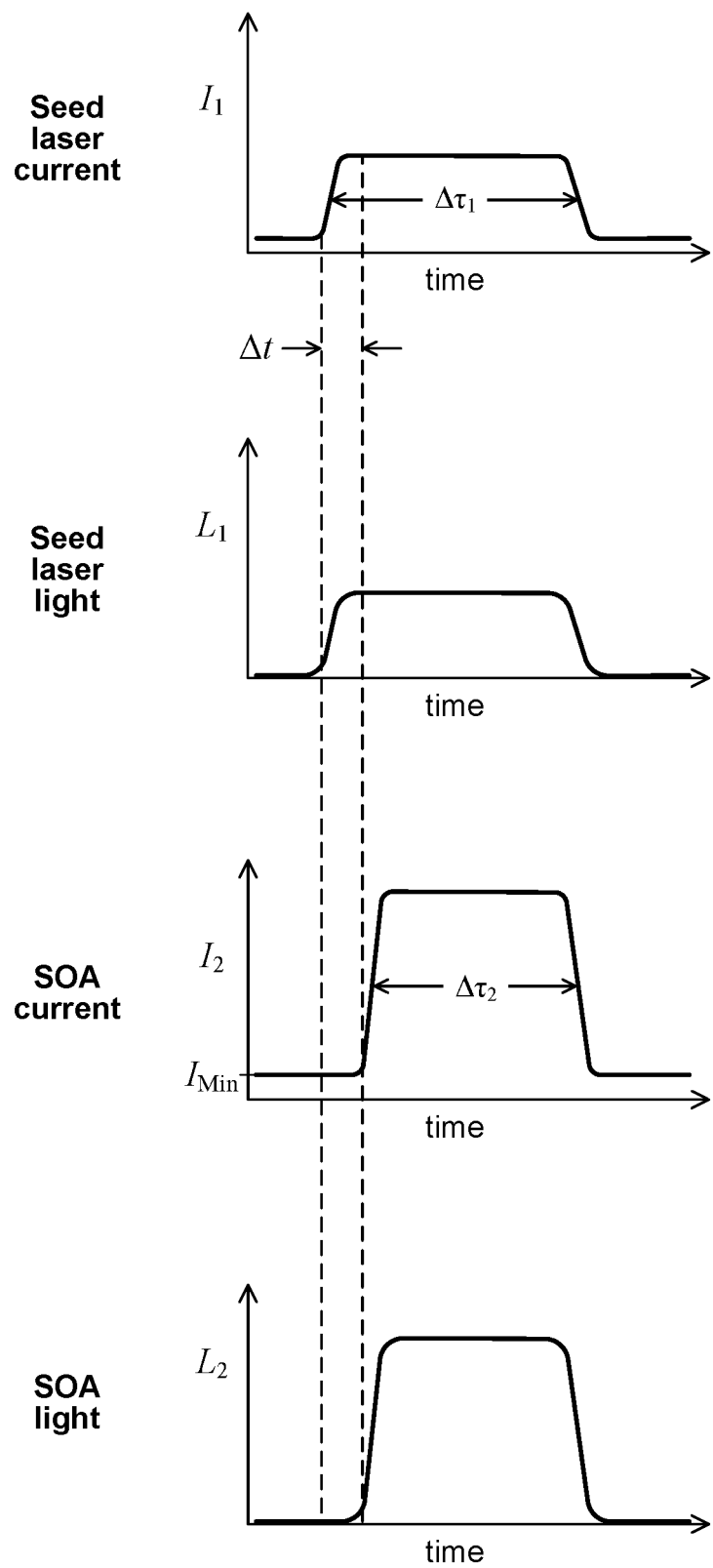
FIG. 18 illustrates an example temporal offset ($\Delta t$) between electrical current pulses supplied to a seed laser diode and a SOA.

FIG. 18 illustrates an example temporal offset (Δt) between electrical current pulses supplied to a seed laser diode 400 and a SOA 410. In particular embodiments, a rising edge of a seed-laser current pulse $I_1$ may be offset from a rising edge of a corresponding SOA current pulse $I_2$ by a particular time interval Δt. The temporal offset of Δt between the rising edges of the current pulses may correspond to a similar temporal offset between the rising edges of the resulting seed-laser optical pulse and the SOA optical pulse. A temporal offset Δt may have any suitable value, such as for example, a value of 0 ns, 0.1 ns, 0.5 ns, 1 ns, 2 ns, or 5 ns. For example, the rising edges of the seed and SOA pulses may occur at approximately the same time so that the temporal offset Δt is approximately zero. As another example, the rising edge of the SOA current pulse $I_2$ may be temporally advanced or delayed by $\Delta t$ with respect to the rising edge of the seed-laser current pulse $I_1$. In FIG. 18, the rising edge of the SOA current pulse $I_2$ is delayed by $\Delta t$ with respect to the rising edge of the seed-laser current pulse $I_1$ (e.g., the rising edge of the SOA current pulse $I_2$ occurs after the rising edge of the seed-laser current pulse $I_1$). Alternatively, the rising edge of the SOA current pulse $I_2$ may be advanced by $\Delta t$ with respect to the rising edge of the seed-laser current pulse $I_1$ (e.g., the rising edge of the SOA current pulse $I_2$ may occur before the rising edge of the seed-laser current pulse $I_1$).

In particular embodiments, a seed-laser current pulse $I_1$ may have a pulse duration ($\Delta \tau_1$) that is less than, greater than, or approximately equal to the pulse duration ($\Delta \tau_2$) of a corresponding SOA current pulse $I_2$. For example, the two pulse durations $\Delta \tau_1$ and $\Delta \tau_2$ may each be approximately equal to 5 ns. In the example of FIG. 18, the seed-laser current pulse $I_1$ may have a pulse duration $\Delta \tau_1$ of 6 ns, and the corresponding SOA current pulse $I_2$ may have a shorter pulse duration $\Delta \tau_2$ of 5.5 ns. As another example, a seed-laser current pulse $I_1$ may have a pulse duration $\Delta \tau_1$ of 4 ns, and a corresponding SOA current pulse $I_2$ may have a longer pulse duration $\Delta \tau_2$ of 5 ns.

Figure 19:
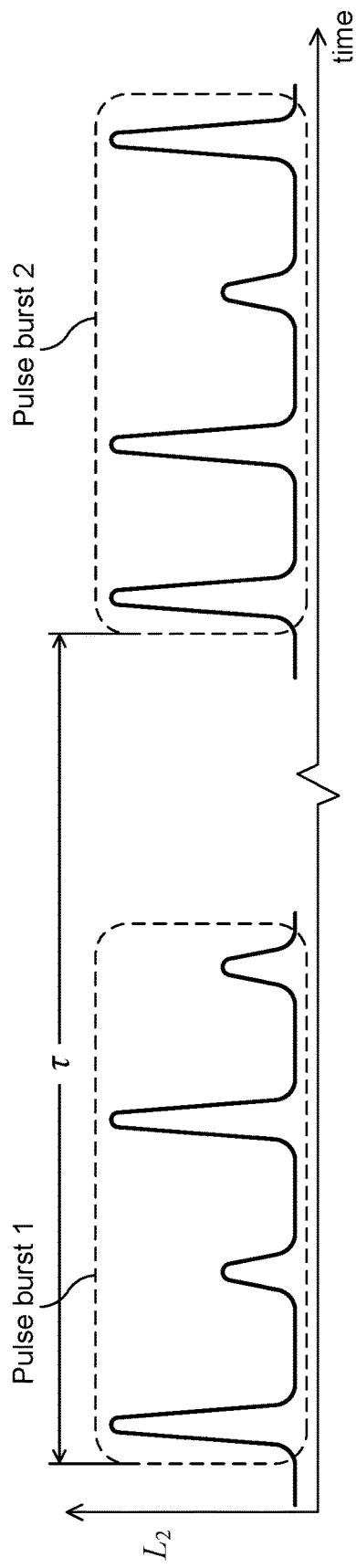
FIGS. 19 and 20 each illustrate two example pulse bursts that have different optical characteristics.
Figure 20:
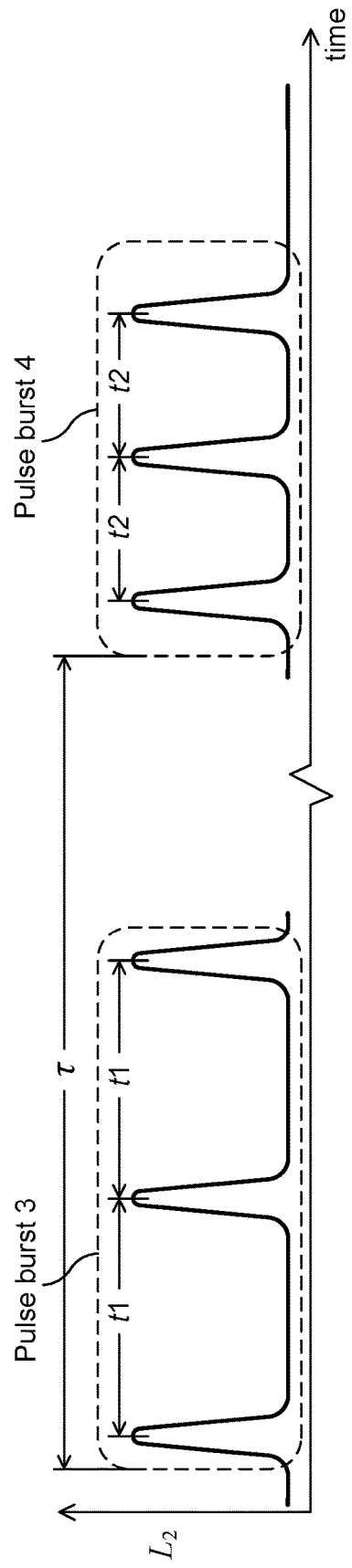

FIGS. 19 and 20 each illustrate two example pulse bursts that have different optical characteristics. In particular embodiments, a light source 110 of a lidar system 100 may emit an output beam 125 that includes an optical-pulse burst. An optical-pulse burst may be referred to as a pulse burst, a pulse sequence, or an encoded pulse sequence. Each pulse burst may include two or more optical pulses having particular optical characteristics. The optical characteristics of a pulse burst may include one or more of the following: the quantity of optical pulses in the pulse burst; a time interval (e.g., t1 or t2) between a pair of successive optical pulses in the pulse burst; one or more energies of the optical pulses in the pulse burst; and one or more wavelengths of the optical pulses in the pulse burst.

In FIG. 19, pulse burst 1 and 2 each includes four optical pulses, and the energy pattern of the pulses is different between the two pulse bursts. For example, each pulse may have either a higher pulse energy (e.g., 1.0 µW) or a lower pulse energy (e.g., 0.4 µW). In pulse burst 1, the first and third pulses have the higher pulse energy, and the second and fourth pulses have the lower pulse energy (which corresponds to a pulse-energy pattern of high-low-high-low). In pulse burst 2, the first, second, and fourth pulses have the higher pulse energy, and the third pulse has the lower pulse energy (which corresponds to a pulse-energy pattern of high-high-low-high).

In particular embodiments, a pulse energy of an optical pulse emitted by a SOA 410 may correspond at least in part to an amplitude or a duration of an associated pulse of electrical current supplied to the SOA 410. The amplitude or the duration of a pulse of current supplied by an electronic driver 600 to a SOA 410 may be selected so that a corresponding emitted optical pulse has a particular pulse energy. Pulses of current with larger amplitudes or longer durations may result in higher-energy optical pulses. For example, in FIG. 19, the lower-energy optical pulses may be produced by supplying a SOA 410 with a 5-ns pulse of current having an amplitude of 100 A, and the higher-energy optical pulses may be produced by supplying the SOA 410 with a 5-ns pulse of current having a 200-A amplitude. As another example, the lower-energy optical pulses in FIG. 19 may be produced by supplying a SOA 410 with a 4-ns pulse of current having a 200-A amplitude, and the higher-energy optical pulses may be produced with a 10-ns pulse of current having a 200-A amplitude. The pulse energy of an optical pulse may be adjusted by changing both the amplitude and duration of an electrical current pulse supplied to a SOA 410. For example, in FIG. 19, the lower-energy optical pulses may be produced by supplying a SOA 410 with a 4-ns pulse of current having a 150-A amplitude, and the higher-energy optical pulses may be produced with a 8-ns pulse of current having a 200-A amplitude.

In FIG. 20, pulse burst 3 and 4 each includes three optical pulses, and the inter-pulse time intervals t1 and t2 between successive optical pulses are different between the two pulse bursts. The inter-pulse time intervals t1 and t2 may each have any suitable value, such as for example, a value of approximately 0.5 ns, 1 ns, 2 ns, 5 ns, 10 ns, 20 ns, or 50 ns. For example, time interval t1 may be approximately 16 ns, and time interval t2 may be approximately 8 ns. An inter-pulse time interval between optical pulses in a pulse burst may be selected by supplying pulses of current to a seed laser 400 or SOA 410 with a corresponding time interval between the current pulses. For example, pulse burst 3 may be produced by supplying a SOA 410 with three pulses of current separated by 16 ns time intervals, and pulse burst 4 may be produced by supplying the SOA 410 with three pulses of current separated by 8 ns time intervals.

In particular embodiments, a pulse burst may be produced by supplying pulses of current to both a seed laser diode 400 and a SOA 410. Alternatively, a pulse burst may be produced by supplying a DC current to a seed laser diode 400 and supplying pulses of current only to a SOA 410. In particular embodiments, a quantity of optical pulses in a pulse burst may be selected by supplying a corresponding quantity of pulses of current to a seed laser 400 or SOA 410. For example, pulse bursts 1 and 2 may each be produced by supplying four pulses of current to a SOA 410. Similarly, pulse bursts 3 and 4 may each be produced by supplying three pulses of current to a SOA 410. A pulse burst may include any suitable number of optical pulses, such as for example, 2, 3, 4, 5, 10, or 20 optical pulses. In particular embodiments, the optical pulses in a pulse burst may include pulses having two or more different wavelengths. For example, a light source 110 similar to that illustrated in FIG. 9 may be used to select one of two wavelengths for each of the optical pulses in a pulse burst.

In FIGS. 19 and 20, the pulse period r, which corresponds to the time between successive pulse bursts, may be any suitable time interval, such as for example, a time interval of approximately 100 ns, 200 ns, 500 ns, 1 µs, 2 µs, 5 µs, or 10 µs. Each pulse burst emitted by a light source 110 may be used to make a single measurement of a distance to a remote target 130. For example, the distance to a remote target 130 may be determined based on a round-trip time of flight for an emitted pulse burst to travel from the lidar system 100 to the target 130 and back to the lidar system 100. Additionally, the optical characteristics of a pulse burst may act as a signature or identifier so that a received optical signal may be (i) determined to be a valid received optical signal associated with one of the emitted pulse bursts or (ii) determined to be associated with a particular emitted pulse burst.

In particular embodiments, a receiver 140 or a processor 150 of a lidar system 100 may determine whether a received optical signal is associated with an emitted optical signal. For example, a light source 110 may emit pulse bursts, where each emitted pulse burst has one or more particular optical characteristics. Each pulse burst may have the same optical characteristics, or the pulse bursts may alternate between two or more different optical characteristics. A receiver 140 may detect a received optical signal, and based on whether the optical characteristics of the received optical signal match one of the corresponding optical characteristics of the emitted pulse bursts, the receiver 140 or a processor 150 may determine whether the received optical signal is a valid received optical signal that is associated with an emitted pulse burst. A valid received optical signal may refer to an optical signal that includes light from one of the pulse bursts that was emitted by the light source 110 and scattered by a remote target 130. A received optical signal may be determined to be a valid received optical signal if its optical characteristics match one of the optical characteristics of the emitted pulse bursts. For example, if a received optical signal matches the particular pulse-energy pattern of an emitted pulse burst, then the received optical signal may be determined to be a valid received optical signal that is associated with the emitted pulse burst. If a received optical signal does not match the optical characteristics of the emitted pulse bursts, then the received optical signal may be determined to be an invalid or interfering optical signal. An invalid or interfering optical signal may include light sent from a light source external to the lidar system 100 (e.g., from a different lidar system), and an invalid or interfering optical signal may be discarded or ignored by the lidar system 100.

In particular embodiments, a light source 100 may emit a first pulse burst and a second pulse burst, where the first and second pulse bursts have one or more different optical characteristics. For example, the two pulse bursts may have different numbers of pulses, different inter-pulse time intervals, different pulse-energy patterns, different wavelengths, or any suitable combination thereof. In the example of FIG. 19, pulse burst 1 and pulse burst 2 have different pulse-energy patterns. In the example of FIG. 20, pulse burst 3 and pulse burst 4 have different inter-pulse time intervals. The different optical characteristics of the first and second pulse bursts may be used to (i) determine whether a received optical signal is a valid received optical signal that is associated with one of the emitted pulse bursts or (ii) determine whether a received optical signal is associated with a particular one of the emitted pulse bursts. If a received optical signal has optical characteristics that match one of the optical characteristics of the emitted pulse bursts, then the received optical signal may be determined to be a valid received optical signal. Additionally or alternatively, having pulse bursts with two or more different optical characteristics may allow a lidar system 100 to associate a received optical signal with a particular emitted pulse burst. For example, if a received optical signal has optical characteristics that match the first pulse burst (and not the second pulse burst), then the received optical signal may be determined to be associated with the first pulse burst (e.g., the received optical signal includes scattered light from the first pulse burst) and not associated with the second pulse burst. Similarly, if a received optical signal has optical characteristics that match the second pulse burst, then the received optical signal may be determined to be associated with the second pulse burst and not associated with the first pulse burst.

Figure 21:
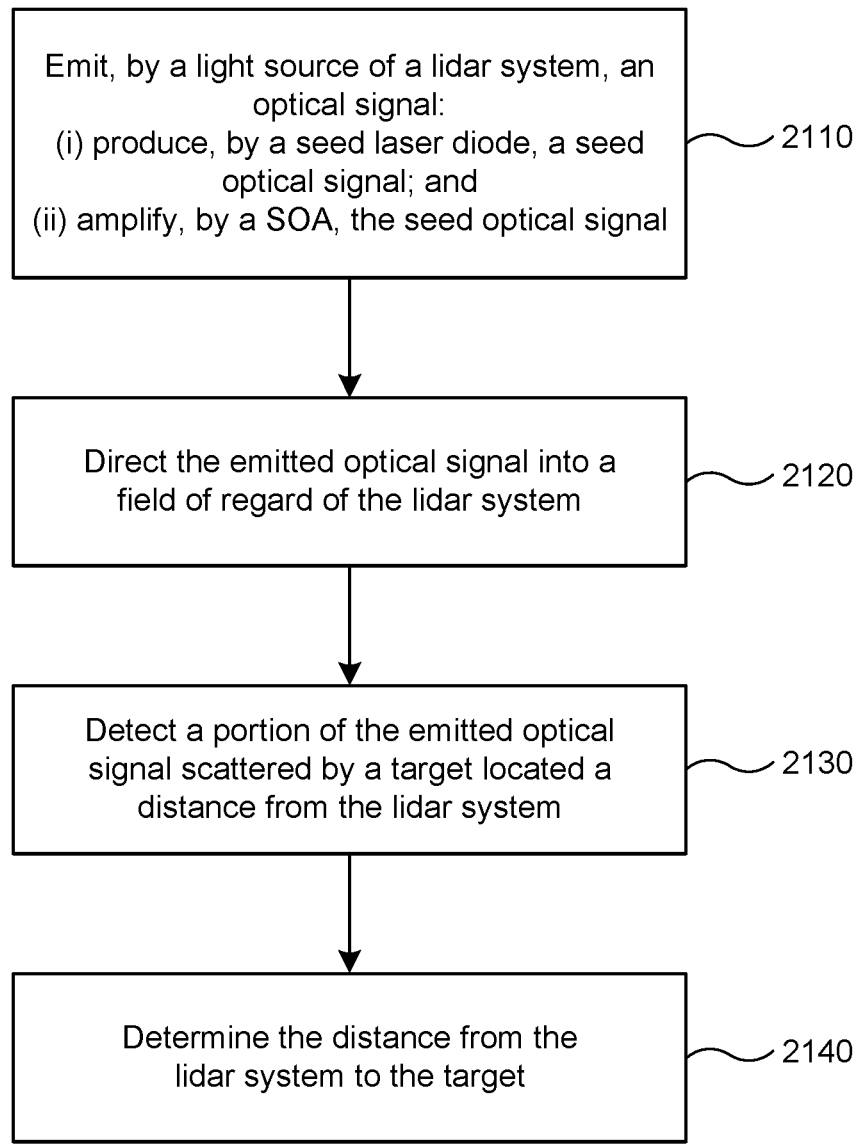
FIG. 21 illustrates an example method for determining a distance from a lidar system to a target.

FIG. 21 illustrates an example method 2100 for determining a distance from a lidar system 100 to a target 130. The method 2100 may be implemented by a lidar system 100 with a light source 110 that includes a seed laser diode 400 and a semiconductor optical amplifier (SOA) 410. The lidar system 100 may be a pulsed lidar system where the emitted optical signal includes one or more pulses of light, or the lidar system 100 may be a frequency-modulated continuous-wave (FMCW) lidar system where the emitted optical signal includes frequency-modulated light. The method 2100 may begin at step 2110, where a light source 110 of a lidar system 100 emits an optical signal (e.g., output beam 125). Emitting the optical signal may include: (i) a seed laser diode 400 producing a seed optical signal and (ii) a SOA 410 amplifying the seed optical signal. The emitted optical signal may include the amplified seed optical signal. For example, the SOA 410 may emit the amplified seed optical signal to directly produce the emitted optical signal as an output beam 125. Alternatively, the amplified seed optical signal may be further amplified by a fiber-optic amplifier 500, and the fiber-optic amplifier may emit the further-amplified seed optical signal to produce the emitted optical signal as an output beam 125. At step 2120, the emitted optical signal may be directed into a field of regard of the lidar system 100. For example, a scanner 120 that includes one or more scanning mirrors may scan the emitted optical signal across the field of regard. At step 2130, a portion of the emitted optical signal scattered by a target 130 located a distance from the lidar system may be detected. For example, a receiver 140 that includes one or more detectors may detect a portion of an emitted optical pulse that is scattered by a target 130. At step 2140, the distance from the lidar system 100 to the target 130 may be determined, at which point the method 2100 may end. For example, a processor or controller 150 may determine the distance D based at least in part on a round-trip time for at least a portion of the emitted optical signal to travel from the lidar system 100 to the target 130 and back to the lidar system 100. The distance D may be determined from the expression $D = c \cdot T/2$, where c is the speed of light and T is the round-trip time.

The following paragraphs describe various example embodiments of a lidar system 100 with a light source 110 that includes a seed laser diode 400 and a SOA 410.

A lidar system comprising: a light source configured to emit an optical signal, the light source comprising: a seed laser diode configured to produce a seed optical signal; and a semiconductor optical amplifier (SOA) configured to amplify the seed optical signal to produce an amplified seed optical signal, wherein the emitted optical signal comprises the amplified seed optical signal; a scanner configured to direct the emitted optical signal into a field of regard of the lidar system; a receiver configured to detect a portion of the emitted optical signal scattered by a target located a distance from the lidar system; and a processor configured to determine the distance from the lidar system to the target based at least in part on a round-trip time for at least a portion of the emitted optical signal to travel from the lidar system to the target and back to the lidar system.

The lidar system, wherein the emitted optical signal has a wavelength between 1500 nm and 1510 nm.

The lidar system, wherein the emitted optical signal has a wavelength between 1000 nm and 1100 nm.

The lidar system, wherein the light source further comprises one or more coupling lenses, wherein the seed laser diode and the SOA are separate devices and the seed optical signal is a free-space optical beam that is coupled into a waveguide of the SOA by the one or more coupling lenses.

The lidar system, wherein the light source further comprises an optical filter configured to transmit the amplified seed optical signal and block amplified spontaneous emission (ASE) light produced by the SOA.

The lidar system, wherein the SOA comprises an input end, an output end, and a waveguide extending from the input end to the output end, wherein the SOA waveguide is angled with respect to the input and output ends.

The lidar system, wherein the SOA is configured to amplify the seed optical signal with an optical gain of greater than 20 dB.

The lidar system, wherein the amplified seed optical signal is a free-space optical beam having a single-mode transverse beam profile.

The lidar system, wherein the light source further comprises a grating located at or near an output end of the SOA, wherein the grating is configured to: transmit a fundamental optical mode of the amplified seed optical signal; and angularly deflect one or more higher-order transverse optical modes of the amplified seed optical signal.

The lidar system, further comprising an electronic driver configured to supply electrical current to the seed laser diode and electrical current to the SOA, wherein the electronic driver is coupled to the SOA by an electrical connection that comprises one or more solder bumps or one or more vias.

The lidar system, wherein the electrical connection has an inductance of less than 10 nanohenries (nH).

The lidar system, further comprising an electronic driver configured to supply electrical current to the seed laser diode and electrical current to the SOA, wherein: the electrical current supplied to the SOA comprises pulses of current, each pulse of current corresponding to an optical pulse emitted by the SOA; and the SOA is further configured to optically absorb seed-laser light during a period of time between two successive pulses of current.

The lidar system, wherein the SOA being configured to optically absorb seed-laser light during the period of time between two successive pulses of current corresponds to the optical pulses emitted by the SOA having a temporal extinction ratio (TER) greater than 40 dB.

The lidar system, wherein the light source further comprises a fiber-optic amplifier, the fiber-optic amplifier comprising: one or more pump laser diodes configured to produce pump-laser light; and an optical gain fiber configured to absorb, by a gain material of the optical gain fiber, at least a portion of the pump-laser light and further amplify, by the gain material, the amplified seed optical signal as the amplified seed optical signal propagates along the optical gain fiber.

The lidar system, wherein the gain fiber is a multi-clad gain fiber comprising a core, an inner cladding, and one or more additional cladding layers, wherein the core is configured to guide the amplified seed optical signal and the inner cladding is configured to guide the pump-laser light.

The lidar system, wherein: the seed laser diode is a first seed laser diode, and the seed optical signal is a first seed optical signal; the SOA is a first SOA, and the amplified seed optical signal is a first amplified seed optical signal; the first amplified seed optical signal comprises light having a first polarization; and the light source further comprises: a second seed laser diode configured to produce a second seed optical signal; a second SOA configured to amplify the second seed optical signal to produce a second amplified seed optical signal having a second polarization orthogonal to the first polarization; and a polarization combiner configured to combine the first and second amplified seed optical signals to produce a combined optical signal comprising light having the first polarization and the second polarization, wherein the emitted optical signal comprises the combined optical signal.

The lidar system, wherein the lidar system is part of a vehicle comprising an advanced driver assistance system (ADAS) configured to assist a driver of the vehicle in operating the vehicle, wherein the lidar system is configured to provide information about a surrounding environment of the vehicle to the ADAS.

The lidar system, wherein the lidar system is part of an autonomous vehicle comprising an autonomous-vehicle driving system configured to guide the autonomous vehicle through a surrounding environment toward a destination, wherein the lidar system is configured to provide information about the surrounding environment to the autonomous-vehicle driving system.

A lidar system comprising: a light source configured to emit an optical signal, the light source comprising: a seed laser diode configured to produce a seed optical signal; and a semiconductor optical amplifier (SOA) configured to amplify the seed optical signal to produce the emitted optical signal; a scanner configured to direct the emitted optical signal into a field of regard of the lidar system; a receiver configured to detect a portion of the emitted optical signal scattered by a target located a distance from the lidar system; and a processor configured to determine the distance from the lidar system to the target based at least in part on a round-trip time for the emitted optical signal to travel from the lidar system to the target and back to the lidar system.

A lidar system comprising: a light source configured to emit an optical signal, the light source comprising: a seed laser diode configured to produce a seed optical signal; a semiconductor optical amplifier (SOA) configured to amplify the seed optical signal to produce an amplified seed optical signal; and a fiber-optic amplifier configured to further amplify the amplified seed optical signal to produce the emitted optical signal; a scanner configured to direct the emitted optical signal into a field of regard of the lidar system; a receiver configured to detect a portion of the emitted optical signal scattered by a target located a distance from the lidar system; and a processor configured to determine the distance from the lidar system to the target based at least in part on a round-trip time for the emitted optical signal to travel from the lidar system to the target and back to the lidar system.

Figure 22:
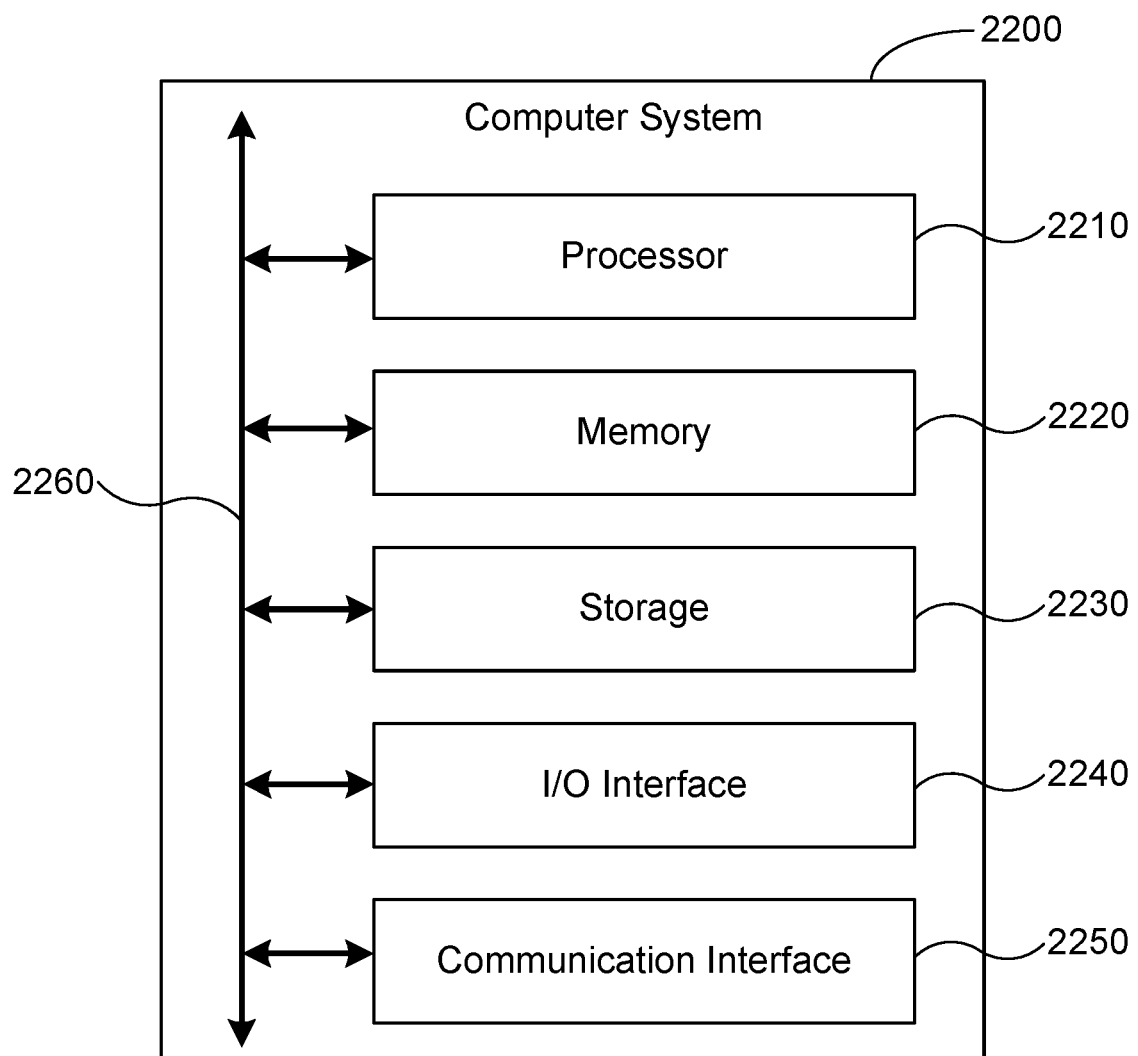
FIG. 22 illustrates an example computer system.

FIG. 22 illustrates an example computer system 2200. In particular embodiments, one or more computer systems 2200 may perform one or more steps of one or more methods described or illustrated herein. In particular embodiments, one or more computer systems 2200 may provide functionality described or illustrated herein. In particular embodiments, software running on one or more computer systems 2200 may perform one or more steps of one or more methods described or illustrated herein or may provide functionality described or illustrated herein. Particular embodiments may include one or more portions of one or more computer systems 2200. In particular embodiments, a computer system may be referred to as a processor, a controller, a computing device, a computing system, a computer, a general-purpose computer, or a data-processing apparatus. Herein, reference to a computer system may encompass one or more computer systems, where appropriate.

Computer system 2200 may take any suitable physical form. As an example, computer system 2200 may be an embedded computer system, a system-on-chip (SOC), a single-board computer system (SBC), a desktop computer system, a laptop or notebook computer system, a mainframe, a mesh of computer systems, a server, a tablet computer system, or any suitable combination of two or more of these. As another example, all or part of computer system 2200 may be combined with, coupled to, or integrated into a variety of devices, including, but not limited to, a camera, camcorder, personal digital assistant (PDA), mobile telephone, smartphone, electronic reading device (e.g., an e-reader), game console, smart watch, clock, calculator, television monitor, flat-panel display, computer monitor, vehicle display (e.g., odometer display or dashboard display), vehicle navigation system, lidar system, ADAS, autonomous vehicle, autonomous-vehicle driving system, cockpit control, camera view display (e.g., display of a rear-view camera in a vehicle), eyewear, or head-mounted display. Where appropriate, computer system 2200 may include one or more computer systems 2200; be unitary or distributed; span multiple locations; span multiple machines; span multiple data centers; or reside in a cloud, which may include one or more cloud components in one or more networks. Where appropriate, one or more computer systems 2200 may perform without substantial spatial or temporal limitation one or more steps of one or more methods described or illustrated herein. As an example, one or more computer systems 2200 may perform in real time or in batch mode one or more steps of one or more methods described or illustrated herein. One or more computer systems 2200 may perform at different times or at different locations one or more steps of one or more methods described or illustrated herein, where appropriate.

As illustrated in the example of FIG. 22, computer system 2200 may include a processor 2210, memory 2220, storage 2230, an input/output (I/O) interface 2240, a communication interface 2250, or a bus 2260. Computer system 2200 may include any suitable number of any suitable components in any suitable arrangement.

In particular embodiments, processor 2210 may include hardware for executing instructions, such as those making up a computer program. As an example, to execute instructions, processor 2210 may retrieve (or fetch) the instructions from an internal register, an internal cache, memory 2220, or storage 2230; decode and execute them; and then write one or more results to an internal register, an internal cache, memory 2220, or storage 2230. In particular embodiments, processor 2210 may include one or more internal caches for data, instructions, or addresses. Processor 2210 may include any suitable number of any suitable internal caches, where appropriate. As an example, processor 2210 may include one or more instruction caches, one or more data caches, or one or more translation lookaside buffers (TLBs). Instructions in the instruction caches may be copies of instructions in memory 2220 or storage 2230, and the instruction caches may speed up retrieval of those instructions by processor 2210. Data in the data caches may be copies of data in memory 2220 or storage 2230 for instructions executing at processor 2210 to operate on; the results of previous instructions executed at processor 2210 for access by subsequent instructions executing at processor 2210 or for writing to memory 2220 or storage 2230; or other suitable data. The data caches may speed up read or write operations by processor 2210. The TLBs may speed up virtual-address translation for processor 2210. In particular embodiments, processor 2210 may include one or more internal registers for data, instructions, or addresses. Processor 2210 may include any suitable number of any suitable internal registers, where appropriate. Where appropriate, processor 2210 may include one or more arithmetic logic units (ALUs); may be a multi-core processor; or may include one or more processors 2210.

In particular embodiments, memory 2220 may include main memory for storing instructions for processor 2210 to execute or data for processor 2210 to operate on. As an example, computer system 2200 may load instructions from storage 2230 or another source (such as, for example, another computer system 2200) to memory 2220. Processor 2210 may then load the instructions from memory 2220 to an internal register or internal cache. To execute the instructions, processor 2210 may retrieve the instructions from the internal register or internal cache and decode them. During or after execution of the instructions, processor 2210 may write one or more results (which may be intermediate or final results) to the internal register or internal cache. Processor 2210 may then write one or more of those results to memory 2220. One or more memory buses (which may each include an address bus and a data bus) may couple processor 2210 to memory 2220. Bus 2260 may include one or more memory buses. In particular embodiments, one or more memory management units (MMUs) may reside between processor 2210 and memory 2220 and facilitate accesses to memory 2220 requested by processor 2210. In particular embodiments, memory 2220 may include random access memory (RAM). This RAM may be volatile memory, where appropriate. Where appropriate, this RAM may be dynamic RAM (DRAM) or static RAM (SRAM). Memory 2220 may include one or more memories 2220, where appropriate.

In particular embodiments, storage 2230 may include mass storage for data or instructions. As an example, storage 2230 may include a hard disk drive (HDD), a floppy disk drive, flash memory, an optical disc, a magneto-optical disc, magnetic tape, or a Universal Serial Bus (USB) drive or a combination of two or more of these. Storage 2230 may include removable or non-removable (or fixed) media, where appropriate. Storage 2230 may be internal or external to computer system 2200, where appropriate. In particular embodiments, storage 2230 may be non-volatile, solid-state memory. In particular embodiments, storage 2230 may include read-only memory (ROM). Where appropriate, this ROM may be mask ROM (MROM), programmable ROM (PROM), erasable PROM (EPROM), electrically erasable PROM (EEPROM), flash memory, or a combination of two or more of these. Storage 2230 may include one or more storage control units facilitating communication between processor 2210 and storage 2230, where appropriate. Where appropriate, storage 2230 may include one or more storages 2230.

In particular embodiments, I/O interface 2240 may include hardware, software, or both, providing one or more interfaces for communication between computer system 2200 and one or more I/O devices. Computer system 2200 may include one or more of these I/O devices, where appropriate. One or more of these I/O devices may enable communication between a person and computer system 2200. As an example, an I/O device may include a keyboard, keypad, microphone, monitor, mouse, printer, scanner, speaker, camera, stylus, tablet, touch screen, trackball, another suitable I/O device, or any suitable combination of two or more of these. An I/O device may include one or more sensors. Where appropriate, I/O interface 2240 may include one or more device or software drivers enabling processor 2210 to drive one or more of these I/O devices. I/O interface 2240 may include one or more I/O interfaces 2240, where appropriate.

In particular embodiments, communication interface 2250 may include hardware, software, or both providing one or more interfaces for communication (such as, for example, packet-based communication) between computer system 2200 and one or more other computer systems 2200 or one or more networks. As an example, communication interface 2250 may include a network interface controller (NIC) or network adapter for communicating with an Ethernet or other wire-based network or a wireless NIC (WNIC); a wireless adapter for communicating with a wireless network, such as a WI-FI network; or an optical transmitter (e.g., a laser or a light-emitting diode) or an optical receiver (e.g., a photodetector) for communicating using fiber-optic communication or free-space optical communication. Computer system 2200 may communicate with an ad hoc network, a personal area network (PAN), an in-vehicle network (IVN), a local area network (LAN), a wide area network (WAN), a metropolitan area network (MAN), or one or more portions of the Internet or a combination of two or more of these. One or more portions of one or more of these networks may be wired or wireless. As an example, computer system 2200 may communicate with a wireless PAN (WPAN) (such as, for example, a BLUETOOTH WPAN), a WI-FI network, a Worldwide Interoperability for Microwave Access (WiMAX) network, a cellular telephone network (such as, for example, a Global System for Mobile Communications (GSM) network), or other suitable wireless network or a combination of two or more of these. As another example, computer system 2200 may communicate using fiber-optic communication based on 100 Gigabit Ethernet (100 GbE), 10 Gigabit Ethernet (10 GbE), or Synchronous Optical Networking (SONET). Computer system 2200 may include any suitable communication interface 2250 for any of these networks, where appropriate. Communication interface 2250 may include one or more communication interfaces 2250, where appropriate.

In particular embodiments, bus 2260 may include hardware, software, or both coupling components of computer system 2200 to each other. As an example, bus 2260 may include an Accelerated Graphics Port (AGP) or other graphics bus, a controller area network (CAN) bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local bus (VLB), or another suitable bus or a combination of two or more of these. Bus 2260 may include one or more buses 2260, where appropriate.

In particular embodiments, various modules, circuits, systems, methods, or algorithm steps described in connection with the implementations disclosed herein may be implemented as electronic hardware, computer software, or any suitable combination of hardware and software. In particular embodiments, computer software (which may be referred to as software, computer-executable code, computer code, a computer program, computer instructions, or instructions) may be used to perform various functions described or illustrated herein, and computer software may be configured to be executed by or to control the operation of computer system 2200. As an example, computer software may include instructions configured to be executed by processor 2210. In particular embodiments, owing to the interchangeability of hardware and software, the various illustrative logical blocks, modules, circuits, or algorithm steps have been described generally in terms of functionality. Whether such functionality is implemented in hardware, software, or a combination of hardware and software may depend upon the particular application or design constraints imposed on the overall system.

In particular embodiments, a computing device may be used to implement various modules, circuits, systems, methods, or algorithm steps disclosed herein. As an example, all or part of a module, circuit, system, method, or algorithm disclosed herein may be implemented or performed by a general-purpose single- or multi-chip processor, a digital signal processor (DSP), an ASIC, a FPGA, any other suitable programmable-logic device, discrete gate or transistor logic, discrete hardware components, or any suitable combination thereof. A general-purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In particular embodiments, one or more implementations of the subject matter described herein may be implemented as one or more computer programs (e.g., one or more modules of computer-program instructions encoded or stored on a computer-readable non-transitory storage medium). As an example, the steps of a method or algorithm disclosed herein may be implemented in a processor-executable software module which may reside on a computer-readable non-transitory storage medium. In particular embodiments, a computer-readable non-transitory storage medium may include any suitable storage medium that may be used to store or transfer computer software and that may be accessed by a computer system. Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs (e.g., compact discs (CDs), CD-ROM, digital versatile discs (DVDs), blu-ray discs, or laser discs), optical disc drives (ODDs), magneto-optical discs, magneto-optical drives, floppy diskettes, floppy disk drives (FDDs), magnetic tapes, flash memories, solid-state drives (SSDs), RAM, RAM-drives, ROM, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

In particular embodiments, certain features described herein in the context of separate implementations may also be combined and implemented in a single implementation. Conversely, various features that are described in the context of a single implementation may also be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a sub-combination or variation of a sub-combination.

While operations may be depicted in the drawings as occurring in a particular order, this should not be understood as requiring that such operations be performed in the particular order shown or in sequential order, or that all operations be performed. Further, the drawings may schematically depict one more example processes or methods in the form of a flow diagram or a sequence diagram. However, other operations that are not depicted may be incorporated in the example processes or methods that are schematically illustrated. For example, one or more additional operations may be performed before, after, simultaneously with, or between any of the illustrated operations. Moreover, one or more operations depicted in a diagram may be repeated, where appropriate. Additionally, operations depicted in a diagram may be performed in any suitable order. Furthermore, although particular components, devices, or systems are described herein as carrying out particular operations, any suitable combination of any suitable components, devices, or systems may be used to carry out any suitable operation or combination of operations. In certain circumstances, multitasking or parallel processing operations may be performed. Moreover, the separation of various system components in the implementations described herein should not be understood as requiring such separation in all implementations, and it should be understood that the described program components and systems may be integrated together in a single software product or packaged into multiple software products.

Various embodiments have been described in connection with the accompanying drawings. However, it should be understood that the figures may not necessarily be drawn to scale. As an example, distances or angles depicted in the figures are illustrative and may not necessarily bear an exact relationship to actual dimensions or layout of the devices illustrated.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes or illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend.

The term "or" as used herein is to be interpreted as an inclusive or meaning any one or any combination, unless expressly indicated otherwise or indicated otherwise by context. Therefore, herein, the expression "A or B" means "A, B, or both A and B." As another example, herein, "A, B or C" means at least one of the following: A; B; C; A and B; A and C; B and C; A, B and C. An exception to this definition will occur if a combination of elements, devices, steps, or operations is in some way inherently mutually exclusive.

As used herein, words of approximation such as, without limitation, "approximately, "substantially," or "about" refer to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as having the required characteristics or capabilities of the unmodified feature. In general, but subject to the preceding discussion, a numerical value herein that is modified by a word of approximation such as "approximately" may vary from the stated value by 0.5%, ±1%, 2%, ±3%, +4%, +5%, +10%, ±12%, or 15%.

As used herein, the terms "first," "second," "third," etc. may be used as labels for nouns that they precede, and these terms may not necessarily imply a particular ordering (e.g., a particular spatial, temporal, or logical ordering). As an example, a system may be described as determining a "first result" and a "second result," and the terms "first" and "second" may not necessarily imply that the first result is determined before the second result.

As used herein, the terms "based on" and "based at least in part on" may be used to describe or present one or more factors that affect a determination, and these terms may not exclude additional factors that may affect a determination. A determination may be based solely on those factors which are presented or may be based at least in part on those factors. The phrase "determine A based on B" indicates that B is a factor that affects the determination of A. In some instances, other factors may also contribute to the determination of A. In other instances, A may be determined based solely on B.

What is claimed is:

1. A lidar system comprising:
    a light source configured to emit an optical signal, the light source comprising:
        a seed laser diode configured to produce a seed optical signal; and
        a semiconductor optical amplifier (SOA) configured to amplify the seed optical signal to produce an amplified seed optical signal, wherein the emitted optical signal comprises the amplified seed optical signal, and wherein:
            the SOA comprises an input end, an output end, and a tapered waveguide disposed between the input end and the output end, wherein a width of the tapered waveguide increases from the input end towards the output end;
            the input end is configured to receive the seed optical signal;
            the tapered waveguide is configured to amplify the seed optical signal as the seed optical signal propagates along the tapered waveguide from the input end to the output end; and
            the output end is configured to emit the amplified seed optical signal;
    a scanner configured to direct the emitted optical signal into a field of regard of the lidar system;
    a receiver configured to detect a portion of the emitted optical signal scattered by a target located a distance from the lidar system; and
    a processor configured to determine the distance from the lidar system to the target based at least in part on a round-trip time for at least a portion of the emitted optical signal to travel from the lidar system to the target and back to the lidar system.

2. The lidar system of claim 1, further comprising an electronic driver configured to supply electrical current to the seed laser diode and electrical current to the SOA.

3. The lidar system of claim 2, wherein the electrical current supplied to the SOA comprises:
    a direct-current (DC) bias current, wherein the DC bias current is less than or equal to a threshold amount of current at which the SOA produces a particular amount of amplified spontaneous emission light; and
    pulses of current configured to provide optical amplification in the SOA for the seed optical signal, wherein the emitted optical signal comprises optical pulses and each pulse of current corresponds to one of the optical pulses emitted by the light source.

4. The lidar system of claim 2, wherein:
    the electrical current supplied to the seed laser diode comprises pulses of current, wherein the seed optical signal comprises seed optical pulses, wherein each seed optical pulse is produced by a corresponding seed-laser current pulse;

the electrical current supplied to the SOA comprises pulses of current, wherein each SOA current pulse is configured to amplify a corresponding seed optical pulse to produce an emitted optical pulse; and the electronic driver is configured to supply the seed-laser current pulses and the SOA current pulses synchronously, wherein a frequency of the seed-laser current pulses is approximately equal to a frequency of the SOA current pulses.

5. The lidar system of claim 4, wherein a rising edge of each seed-laser current pulse is offset from a rising edge of a corresponding SOA current pulse by a particular time interval.

6. The lidar system of claim 2, wherein:
the electrical current supplied to the seed laser diode comprises a direct-current (DC) bias current, wherein the seed optical signal comprises light having a substantially constant optical power; and
the electrical current supplied to the SOA comprises pulses of current, wherein each SOA current pulse is configured to amplify a portion of the seed optical signal to produce an emitted optical pulse.

7. The lidar system of claim 2, wherein:
the electrical current supplied to the SOA comprises pulses of current supplied to an anode or cathode of the SOA; and
the electronic driver is further configured to electrically couple the anode to the cathode during a period of time between two successive pulses of current so that an optical absorption of the SOA is increased during the period of time.

8. The lidar system of claim 2, wherein the electronic driver is configured to supply the electrical current to the SOA via (i) a first low-inductance electrical connection between the electronic driver and an anode of the SOA and (ii) a second low-inductance electrical connection between the electronic driver and a cathode of the SOA.

9. The lidar system of claim 2, wherein an anode or a cathode of the SOA is directly connected to the electronic driver.

10. The lidar system of claim 2, wherein:
directing the emitted optical signal into the field of regard of the lidar system comprises scanning the emitted optical signal across the field of regard as a series of scan lines; and
the electronic driver is further configured to disable the SOA during a portion of time between an end of one scan line and a beginning of a subsequent scan line, wherein disabling the SOA comprises reducing the electrical current supplied to the SOA.

11. The lidar system of claim 1, wherein:
the light source further comprises:
an electronic driver configured to supply electrical current to the seed laser diode and the SOA; and
one or more lenses configured to couple the amplified seed optical signal into an optical fiber via an input portion of the optical fiber; and
the seed laser diode, the SOA, the electronic driver, the one or more lenses, and the input portion of the optical fiber are disposed within an enclosure.

12. The lidar system of claim 11, wherein the optical fiber comprises an output portion terminated at a lens configured to produce the emitted optical signal as a collimated free-space optical beam that is directed to the scanner.

13. The lidar system of claim 11, wherein the optical fiber is coupled to a fiber-optic amplifier configured to receive the amplified seed optical signal from the optical fiber and further amplify the amplified seed optical signal to produce the emitted optical signal.

14. The lidar system of claim 1, wherein:
the light source further comprises:
an electronic driver configured to supply electrical current to the seed laser diode and the SOA; and
one or more collimating lenses configured to collect the amplified seed optical signal and produce the emitted optical signal as a collimated free-space optical beam that is directed to the scanner; and
the seed laser diode, the SOA, the electronic driver, and the collimating lenses are disposed within an enclosure.

15. The lidar system of claim 1, further comprising a thermoelectric cooler (TEC) thermally coupled to the seed laser diode and the SOA, wherein the TEC is configured to (i) stabilize a temperature associated with the seed laser diode or the SOA or (ii) remove heat produced by the seed laser diode or the SOA.

16. The lidar system of claim 1, wherein the seed laser diode and the SOA are integrated together and disposed on or in a single chip or substrate.

17. The lidar system of claim 16, wherein the seed laser diode and the SOA are directly coupled together, wherein a front face of the seed laser diode is directly coupled to the input end of the SOA.

18. The lidar system of claim 16, wherein the light source further comprises a connecting waveguide disposed between the seed laser diode and the SOA, the connecting waveguide configured to convey the seed optical signal from a front face of the seed laser diode to the input end of the SOA.

19. The lidar system of claim 16, wherein the substrate has a coefficient of thermal expansion that is approximately equal to a coefficient of thermal expansion of the seed laser diode and the SOA.

20. The lidar system of claim 1, wherein the light source further comprises an end cap directly coupled to the output end of the SOA, wherein the end cap is configured to:
receive the amplified seed optical signal from the output end of the SOA; and
convey the amplified seed optical signal through the end cap so that the amplified seed optical signal is emitted from the end cap with an optical intensity that is less than an optical intensity of the amplified seed optical signal received from the SOA.

21. The lidar system of claim 1, wherein the light source further comprises a fiber-optic amplifier configured to:
receive the amplified seed optical signal produced by the SOA;
further amplify the amplified seed optical signal to produce the emitted optical signal; and
direct the emitted optical signal to the scanner as a collimated free-space optical beam.

22. The lidar system of claim 21, wherein:
directing the emitted optical signal into the field of regard of the lidar system comprises scanning the emitted optical signal across the field of regard as a series of scan lines; and
the processor is further configured to disable the fiber-optic amplifier during a portion of time between an end of one scan line and a beginning of a subsequent scan line, wherein disabling the fiber-optic amplifier comprises reducing an amount of electrical current supplied to one or more pump laser diodes of the fiber-optic amplifier.

23. The lidar system of claim 1, wherein the emitted optical signal comprises an optical-pulse burst comprising a plurality of optical pulses having particular optical characteristics, the optical characteristics comprising one or more of: a quantity of optical pulses; a time interval between a pair of successive optical pulses; one or more energies of the optical pulses; and one or more wavelengths of the optical pulses.

24. The lidar system of claim 22, wherein:
the time interval between the pair of successive optical pulses corresponds to a time interval between associated electrical current pulses supplied to the seed laser diode or the SOA; and
the pulse energy of the optical pulse corresponds at least in part to an amplitude or a duration of an associated electrical current pulse supplied to the SOA.

25. The lidar system of claim 23, wherein the emitted optical signal is a first optical-pulse burst and the light source is further configured to emit a second optical-pulse burst after the first optical-pulse burst, wherein the second optical-pulse burst comprises a plurality of optical pulses having one or more optical characteristics that are different from the corresponding optical characteristics of the first optical-pulse burst.

26. The lidar system of claim 23, wherein the receiver or processor is further configured to determine whether a received optical signal is associated with the emitted optical signal based on whether one or more optical characteristics of the received optical signal match the corresponding optical characteristics of the emitted optical signal.

27. The lidar system of claim 1, wherein the lidar system is a pulsed lidar system wherein the emitted optical signal is one of a plurality of emitted optical pulses, the emitted optical pulses having:
a wavelength between 900 nanometers and 1700 nanometers;
a pulse energy between 0.01 µJ and 100 µJ;
a pulse repetition frequency between 80 kHz and 10 MHz; and
a pulse duration between 1 ns and 100 ns.

28. The lidar system of claim 1, wherein:
the seed laser diode comprises gallium (Ga), indium (In), arsenide (As), and phosphide (P) with a composition $Ga_xIn_{1-x}As_yP_{1-y}$, wherein x is a value from 0.4 to 0.5 and y is a value from 0.7 to 0.84; and
the seed optical signal and the emitted optical signal have a wavelength between 1400 nanometers and 1510 nanometers.

29. The lidar system of claim 1, wherein the lidar system is a frequency-modulated continuous-wave (FMCW) lidar system wherein the emitted optical signal comprises frequency-modulated light.

30. The lidar system of claim 1, wherein the light source is configured to emit a plurality of optical signals, each optical signal comprising light at a first wavelength or light at a second wavelength, wherein:
the seed laser diode is a first seed laser diode configured to produce seed light at the first wavelength;
the light source further comprises a second seed laser diode configured to produce seed light at the second wavelength; and
the SOA is configured to amplify the seed light at the first and second wavelengths.

31. A method comprising:
emitting, by a light source of a lidar system, an optical signal, comprising:
producing, by a seed laser diode of a light source of a lidar system, a seed optical signal; and
amplifying, by a semiconductor optical amplifier (SOA) of the light source, the seed optical signal to produce an amplified seed optical signal, wherein the emitted optical signal comprises the amplified seed optical signal, and wherein:
the SOA comprises an input end, an output end, and a tapered waveguide disposed between the input end and the output end, wherein a width of the tapered waveguide increases from the input end towards the output end;
the input end is configured to receive the seed optical signal;
the tapered waveguide is configured to amplify the seed optical signal as the seed optical signal propagates along the tapered waveguide from the input end to the output end; and
the output end is configured to emit the amplified seed optical signal;
directing, by a scanner of the lidar system, the emitted optical signal into a field of regard of the lidar system;
detecting, by a receiver of the lidar system, a portion of the emitted optical signal scattered by a target located a distance from the lidar system; and
determining, by a processor of the lidar system, the distance from the lidar system to the target based at least in part on a round-trip time for at least a portion of the emitted optical signal to travel from the lidar system to the target and back to the lidar system.

* * * * *